(12) United States Patent
Hsu et al.

(10) Patent No.: US 12,154,888 B2
(45) Date of Patent: Nov. 26, 2024

(54) SEMICONDUCTOR PACKAGE AND METHOD OF MANUFACTURING THE SAME

(71) Applicant: Taiwan Semiconductor Manufacturing Company, Ltd., Hsinchu (TW)

(72) Inventors: Chia-Kuei Hsu, Hsinchu (TW); Feng-Cheng Hsu, New Taipei (TW); Ming-Chih Yew, Hsinchu (TW); Po-Yao Lin, Hsinchu County (TW); Shuo-Mao Chen, New Taipei (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/874,319

(22) Filed: Jul. 27, 2022

(65) Prior Publication Data

US 2022/0367419 A1    Nov. 17, 2022

Related U.S. Application Data

(63) Continuation of application No. 17/206,098, filed on Mar. 18, 2021.

(51) Int. Cl.
| | | |
|---|---|---|
| H01L 23/31 | (2006.01) | |
| H01L 21/50 | (2006.01) | |
| H01L 21/768 | (2006.01) | |
| H01L 23/00 | (2006.01) | |
| H01L 23/538 | (2006.01) | |
| H01L 25/065 | (2023.01) | |

(52) U.S. Cl.
CPC .......... *H01L 25/0657* (2013.01); *H01L 21/50* (2013.01); *H01L 21/768* (2013.01); *H01L 23/31* (2013.01); *H01L 23/5386* (2013.01); *H01L 24/14* (2013.01); *H01L 2224/0401* (2013.01)

(58) Field of Classification Search
CPC . H01L 25/0657; H01L 23/31; H01L 23/5386; H01L 24/14
See application file for complete search history.

(56) References Cited

U.S. PATENT DOCUMENTS 8,729,401 B2 * 5/2014 Yamasaki ......... H01L 23/49827
174/262
8,993,380 B2   3/2015 Hou et al.
(Continued)

*Primary Examiner* — Trang Q Tran
(74) *Attorney, Agent, or Firm* — JCIPRNET

(57) ABSTRACT

A semiconductor package includes a semiconductor die, a redistribution circuit structure, a supporting structure and a protective layer. The redistribution circuit structure is located on and electrically coupled to the semiconductor die. The supporting structure is located on an outer surface of the redistribution circuit structure, wherein the supporting structure is overlapped with at least a part of the semiconductor die or has a sidewall substantially aligned with a sidewall of the semiconductor die in a vertical projection on the redistribution circuit structure along a stacking direction of the redistribution circuit structure and the supporting structure. The protective layer is located on the supporting structure, wherein the supporting structure is sandwiched between the protective layer and the redistribution circuit structure.

20 Claims, 34 Drawing Sheets

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 10,177,115 B2 * | 1/2019 | Yu .................... H01L 21/76877 |
| 2009/0155959 A1 * | 6/2009 | Lin ........................ H01L 23/50 |
| | | 257/E21.499 |
| 2012/0043123 A1 * | 2/2012 | Takada .............. H01L 23/49822 |
| | | 174/262 |
| 2016/0064357 A1 * | 3/2016 | Choe ...................... H01L 24/10 |
| | | 438/109 |
| 2019/0259726 A1 * | 8/2019 | Jeng ........................ H01L 24/27 |
| 2020/0168543 A1 * | 5/2020 | Shih .................... H01L 23/5283 |

\* cited by examiner

SEMICONDUCTOR PACKAGE AND METHOD OF MANUFACTURING THE SAME

CROSS-REFERENCE TO RELATED APPLICATION

This application is a continuation application of and claims the priority benefits of U.S. application Ser. No. 17/206,098, filed on Mar. 18, 2021. The entirety of the above-mentioned patent application is hereby incorporated by reference herein and made a part of this specification.

BACKGROUND

Semiconductor devices and integrated circuits (ICs) are typically manufactured on a single semiconductor wafer. The dies of the wafer may be processed and packaged with other semiconductor devices or dies at the wafer level, and various technologies have been developed for the wafer level packaging for ensuring the reliability of semiconductor packages.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
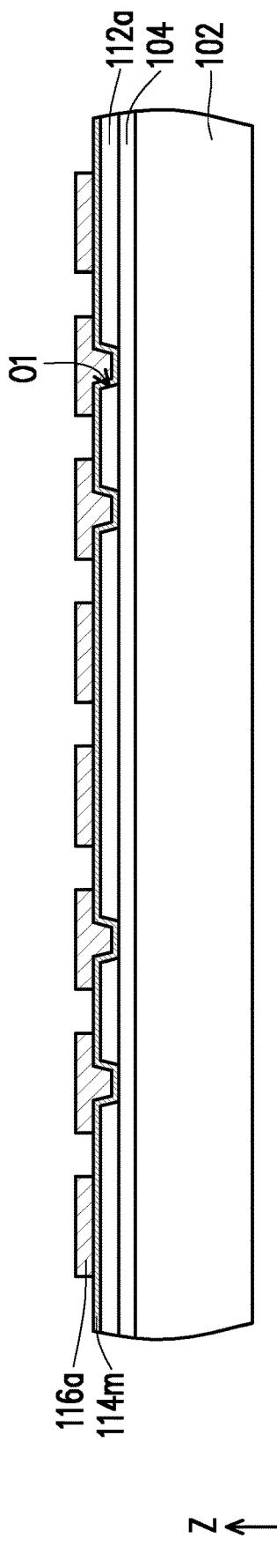
FIG. 1 through FIG. 14 are schematic cross-sectional views of various stages in a manufacturing method of a semiconductor package in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 14 are schematic cross-sectional views of various stages in a manufacturing method of a semiconductor package in accordance with some embodiments of the disclosure. FIG. 15 is a schematic top view illustrating a relative position between semiconductor components of a semiconductor package in accordance with some embodiments of the disclosure, where FIG. 1 through FIG. 14 are the cross-sectional views taken along a line AA' depicted in FIG. 15. FIG. 16A through FIG. 16I are schematic enlarged top views illustrating various predetermined patterns of a supporting structure in a semiconductor package in accordance with some embodiments of the disclosure. In some embodiments, the manufacturing method is part of a wafer-level process. In FIG. 1 to FIG. 14, multiple semiconductor dies are shown to represent plural semiconductor components (dies or chips) of the wafer, and one semiconductor package is shown to represent plural semiconductor package obtained following the (semiconductor) manufacturing method, however the disclosure is not limited thereto. In other embodiments, one or more than one semiconductor dies are shown to represent plural semiconductor components (dies or chips) of the wafer, and multiple semiconductor packages are shown to represent plural semiconductor packages obtained following the (semiconductor) manufacturing method.

Referring to FIG. 1, in some embodiments, a carrier 102 is provided. In some embodiments, the carrier 102 is a glass carrier or any suitable carrier for carrying a semiconductor wafer or a reconstituted wafer for the manufacturing method of a semiconductor package. In some embodiments, the carrier 102 is coated with a debond layer 104 (as shown in FIG. 1). The material of the debond layer 104 may be any material suitable for bonding and debonding the carrier 102 from the above layer(s) or any wafer(s) disposed thereon.

In some embodiments, the debond layer 104 includes a dielectric material layer made of a dielectric material including any suitable polymer-based dielectric material (such as benzocyclobutene (BCB), polybenzoxazole (PBO)). In an alternative embodiment, the debond layer 104 includes a dielectric material layer made of an epoxy-based thermal-release material, which loses its adhesive property when heated, such as a light-to-heat-conversion (LTHC) release coating film. In a further alternative embodiment, the debond layer 104 includes a dielectric material layer made of an ultra-violet (UV) glue, which loses its adhesive property when exposed to UV lights. The debond layer 104 may be dispensed as a liquid and cured, or may be a laminate film laminated onto the carrier 102, or may be the like. For example, as shown in FIG. 1, an illustrated top surface of the debond layer 104, which is opposite to an illustrated bottom surface contacting the carrier 102, is leveled and has a high degree of coplanarity. In certain embodiments, the debond layer 104 is a LTHC layer with good chemical resistance, and such layer enables room temperature debonding from the carrier 102 by applying laser irradiation, however the disclosure is not limited thereto.

In an alternative embodiment, a buffer layer (not shown) is coated on the debond layer 104, where the debond layer 104 is sandwiched between the buffer layer and the carrier 102, and the top surface of the buffer layer may further provide a high degree of coplanarity.

In some embodiments, the buffer layer may be a dielectric material layer. In some embodiments, the buffer layer may be a polymer layer which made of polyimide (PI), PBO, BCB, or any other suitable polymer-based dielectric material. In some embodiments, the buffer layer may be Ajinomoto Buildup Film (ABF), Solder Resist film (SR), or the like. In other words, the buffer layer is an optional dielectric layer, and may be omitted based on the demand and the design layout; the disclosure is not limited thereto.

Continued on FIG. 1, in some embodiments, a dielectric layer 112a is formed on the debond layer 104 and over the carrier 102. In some embodiments, the dielectric layer 112a is formed by, but not limited to, forming a blanket layer of dielectric material over the illustrated top surface of the debond layer 104 to completely cover the debond layer 104 and patterning the dielectric material blanket layer to form the dielectric layer 112a with a plurality of openings O1 exposing portions of the debond layer 104 underneath thereto.

The material of the dielectric layer 112a may be PI, PBO, BCB, a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric material blanket layer is formed by suitable fabrication techniques such as spin-on coating, chemical vapor deposition (CVD), (e.g. plasma-enhanced chemical vapor deposition (PECVD)), or the like.

Thereafter, in some embodiments, a seed layer material 114m is formed over the dielectric layer 112a, as shown in FIG. 1. In some embodiments, the seed layer material 114m is formed on the dielectric layer 112a and extends into the openings O1 formed in the dielectric layer 112a. In other words, the seed layer material 114m penetrates through the dielectric layer 112a, and sidewalls of the openings O1 are completely covered by the seed layer material 114m.

In some embodiments, the seed layer material 114m is formed on the debond layer 104 and over the carrier 102 in a manner of a blanket layer made of metal or metal alloy materials, the disclosure is not limited thereto. In some embodiments, the seed layer material 114m is referred to as a metal layer, which may be a single layer or a composite layer comprising a plurality of sub-layers formed of different materials. In some embodiments, the seed layer material 114m includes titanium, copper, molybdenum, tungsten, titanium nitride, titanium tungsten, combinations thereof, or the like. For example, the seed layer material 114m may include a titanium layer and a copper layer over the titanium layer. The seed layer material 114m may be formed using, for example, sputtering, physical vapor deposition (PVD), or the like. In some embodiments, the seed layer material 114m may be conformally formed on the dielectric layer 112a by sputtering, and in contact with the dielectric layer 112a and the debond layer 104 exposed by the openings O1. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

As illustrated in FIG. 1, in some embodiments, after the formation of the seed layer material 114m, a patterned conductive layer 116a is formed on the seed layer material 114m and over the dielectric layer 112a. In some embodiments, the patterned conductive layer116a may be formed by, but not limited to, forming a blanket layer of conductive material over the dielectric layer 112a to completely cover the seed layer material 114m and patterning the conductive material blanket layer to form the patterned conductive layer 116a. In one embodiment, the patterned conductive layer 116a may be made of conductive materials formed by electroplating or deposition, such as copper, copper alloy, aluminum, aluminum alloy, or combinations thereof, which may be patterned to form a plurality of conductive patterns/segments using a photolithography and etching process. The conductive patterns/segments each may include a line portion extending over the seed layer material 114m along a horizontal direction (e.g. a direction X or Y) and/or a line portion extending over the seed layer material 114m along a horizontal direction (e.g. the direction X or Y) in addition to a via portion connecting to the line portion and extending into a respective one opening O1 along a vertical direction (e.g. a direction Z). The directions X, Y and Z may be different from each other. For example, as shown in FIG. 1, the directions X, Y and Z are perpendicular to each other. In some embodiments, the patterned conductive layer 116a may be a patterned copper layer or other suitable patterned metal layer. In some embodiments, the patterned conductive layer 116a is patterned copper layers or other suitable patterned metal layers. For example, portions of the patterned conductive layer 116a further extend into the openings O1.

Figure 2:
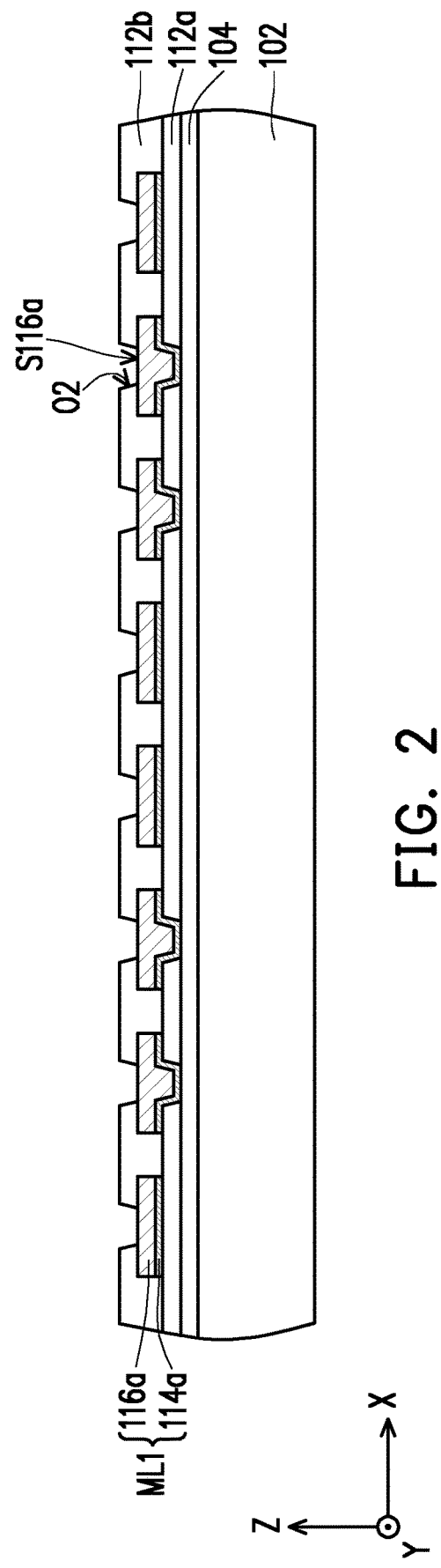

Referring to FIG. 2, in some embodiments, the see layer material 114m is patterned to form a seed layer 114a. In some embodiments, the seed layer material 114m is patterned by using the patterned conductive layer 116a as an etching mask to form the seed layer 114a. For example, the etching process may be a dry etching process, a wet etching process, or a combination thereof; the disclosure is not limited thereto. In other words, for example, in a vertical projection on the dielectric layer 112a along the direction Z, the patterned conductive layer 116a is completely overlapped with the seed layer 114a. That is to say, a sidewall of the patterned conductive layer 116a is aligned with a sidewall of the seed layer 114a. In some embodiments, as shown in FIG. 2, the patterned conductive layer 116a is electrically connected to the seed layer 114a respectively underlying thereto. In some embodiments, the patterned conductive layer 116a and the seed layer 114a together are referred to as a metallization layer ML1 (or a redistribution layer).

Continued on FIG. 2, in some embodiments, the dielectric layer 112b is formed over the patterned conductive layer 116a. In some embodiments, the dielectric layer 112b has a plurality of openings O2 each exposing a portion of the patterned conductive layer 116a. As show in FIG. 2, through the openings O2, a surface S116a of the patterned conductive layer 116a is partially exposed for electrically connecting to later-formed connectors, for example. The formation and material of the dielectric layer 112b may be the same or similar to the process and material of forming the dielectric layer 112a as described in FIG. 1, and thus are not repeated therein for brevity. In one embodiment, the material of the dielectric layer 112b is the same as the material of the dielectric layer 112a. In an alternative embodiment, the material of the dielectric layer 112b is different from the material of the dielectric layer 112a; the disclosure is not limited thereto.

Figure 3:
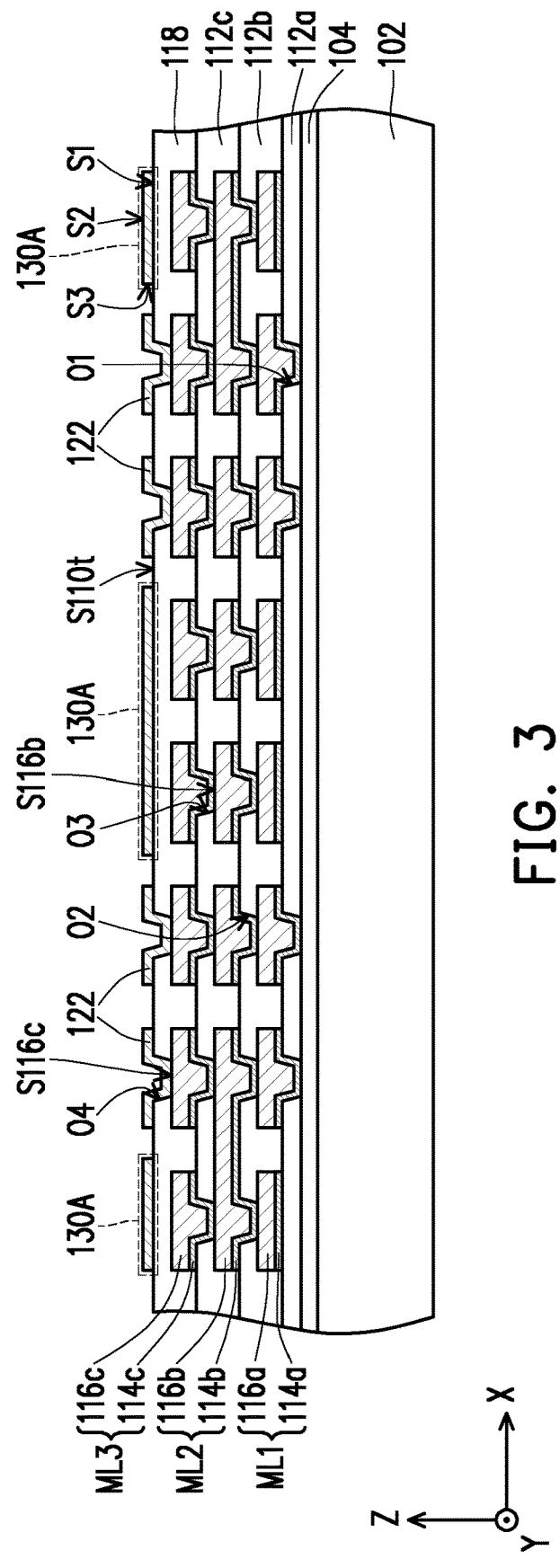

Referring to FIG. 3, in some embodiments, a seed layer 114b, the patterned conductive layer 116b, a dielectric layer 112c, a seed layer 114c, the patterned conductive layer 116c and a dielectric layer 118 are sequentially formed on the structure depicted on FIG. 2 to form a redistribution circuit structure 110 on the debond layer 104 and over the carrier 102. In some embodiments, the seed layer 114b is formed on the dielectric layer 112b and extends into openings O2 formed in the dielectric layer 112b to physically contact the patterned conductive layer 116a exposed by the openings O2. In other words, the seed layer 114b penetrates through the dielectric layer 112b, and sidewalls of the openings O2 are completely covered by the seed layer 114b. In some embodiments, the patterned conductive layer 116b is formed on (e.g. in physical contact with) the seed layer 114b, where the patterned conductive layer 116b is overlapped with the seed layer 114b in the vertical projection on the dielectric layer 112a along the direction Z. That is to say, a sidewall of the seed layer 114b is aligned with a sidewall of the patterned conductive layer 116b. For example, as shown in FIG. 3, the patterned conductive layer 116b is electrically connected to the patterned conductive layer 116a through the seed layer 114b. In some embodiments, the patterned conductive layer 116b and the seed layer 114b together are referred to as a metallization layer ML2 (or a redistribution layer).

In some embodiments, the dielectric layer 112c are formed on the patterned conductive layer 116b with a plurality of openings O3 each exposing a portion of the patterned conductive layer 116b. As show in FIG. 3, through the openings O3, a surface S116b of the patterned conductive layer 116b is partially exposed for electrically connecting to later-formed connectors.

In some embodiments, the seed layer 114c is formed on the dielectric layer 112c and extends into the openings O3 formed in the dielectric layer 112c to physically contact the patterned conductive layer 116b exposed by the openings O3. In other words, the seed layer 114c penetrates through the dielectric layer 112c, and sidewalls of the openings O3 are completely covered by the seed layer 114c. In some embodiments, the patterned conductive layer 116c is formed on (e.g. in physical contact with) the seed layer 114c, where the patterned conductive layer 116c is overlapped with the seed layer 114c in the vertical projection on the dielectric layer 112a along the direction Z. That is to say, a sidewall of the seed layer 114c is aligned with a sidewall of the patterned conductive layer 116c. For example, as shown in FIG. 3, the patterned conductive layer 116c is electrically connected to the patterned conductive layer 116b through the seed layer 114c. In some embodiments, the patterned conductive layer 116c and the seed layer 114c together are referred to as a metallization layer ML3 (or a redistribution layer).

In some embodiments, the dielectric layer 118 are formed on the patterned conductive layer 116c with a plurality of openings O4 each exposing a portion of the patterned conductive layer 116c. As shown in FIG. 3, through the openings O4, a surface S116c of the patterned conductive layer 116c is partially exposed for electrically connecting to later-formed connectors. Upon this, the redistribution circuit structure 110 is manufactured.

The formations and materials of the seed layers 114b and 114c may be independently the same or similar to the process and material of forming the seed layer 114a as described in FIG. 1 through FIG. 2, the formations and materials of the patterned conductive layers 116b and 116c may be independently the same or similar to the process and material of forming the patterned conductive layer 116a as described in FIG. 1, and the formations and materials of the dielectric layers 112b, 112c and 118 may be independently the same or similar to the process and material of forming the dielectric layer 112a as described in FIG. 1, and thus are not repeated herein. In one embodiment, the materials of the seed layers 114a, 114b and 114c are the same to each other. Alternatively, the materials of the seed layers 114a, 114b and 114c may be different to one another, in part or all. In one embodiment, the materials of the patterned conductive layers 116a, 116b and 116c are the same to each other. Alternatively, the materials of the patterned conductive layers 116a, 116b and 116c may be independently different to one another, in part or all. In one embodiment, the materials of the dielectric layers 112a, 112b, 112c and 118 are the same to each other. Alternatively, the materials of the dielectric layers 112a,112b, 112c and 118 may be different to one another, in part or all.

In some embodiments, as shown in FIG. 3, the redistribution circuit structure 110 is formed on the debond layer 104 and includes a dielectric layer 112 (e.g. the dielectric layers 112a through 112c), a seed layer 114 (e.g. the seed layers 114a through 114c), a patterned conductive layer 116 (e.g. the patterned conductive layers 116a through 116c), and the dielectric layer 118. However, in the disclosure, the numbers of layers of the dielectric layer 112, the seed layer 114 and the patterned conductive layer 116 are not limited to the drawing of FIG. 3, where the numbers of the layer of each of the dielectric layer 112, the seed layer 114 and the patterned conductive layer 116 may be one or more than one. In some embodiments, the dielectric layer 112, the seed layer 114 and the patterned conductive layer 116 are sandwiched between the debond layer 104 and the dielectric layer 118 and are sequentially stacked.

In the disclosure, a set of the layers (e.g. the dielectric layer 112a, the seed layer 114a and the patterned conductive layer 116a), a set of the layers (e.g. the dielectric layer 112b, the seed layer 114b and the patterned conductive layer 116b), and a set of the layers (e.g. the dielectric layer 112c, the seed layer 114c and the patterned conductive layer 116c) may be individually referred to as a build-up layer of the redistribution circuit structure 110, while the dielectric layer 118 may be referred to as a passivation layer of the redistribution circuit structure 110 for providing protection to the underneath build-up layers. For illustration purpose, three build-up layers are included in the redistribution circuit structure 110 of FIG. 3; however, the disclosure is not limited thereto. The number of the build-up layer included in the redistribution circuit structure 110 is not limited in the disclosure, and may be selected based on the demand and design layout. That is, the number of the build-up layers included in the redistribution circuit structure 110 may be one or more than one as long as the redistribution circuit structure 110 can provide a sufficient routing function to a semiconductor die (e.g., 230 and/or 240 will be later presented in FIG. 6).

Continued on FIG. 3, in some embodiments, after the redistribution circuit structure 110 is formed, a plurality of under-bump metallurgy (UBM) patterns 122 are formed on the dielectric layer 118 and extend into the openings O4 formed in the dielectric layer 118 to physically contact the patterned conductive layer 116c exposed by the openings 04 for electrically connecting the redistribution circuit structure 110. In the disclosure, the UBM patterns 122 facilitate electrical connections between the redistribution circuit structure 110 and later-formed conductive elements (e.g., connectors such as conductive balls or conductive bumps; semiconductor components such as semiconductor passive elements; or the like). However, the disclosure is not limited thereto; alternatively, the UBM patterns 122 may be omitted based on the design layout and demand.

The material of the UBM patterns 122 may include copper, nickel, titanium, tungsten, or alloys thereof or the like, and may be formed in a manner of a multi-layer (e.g. with different materials in any two stacked layers in one UBM pattern 122) by an electroplating process. The number of the UBM patterns 122 is not limited in the disclosure, and corresponds to the numbers of the later-formed conductive elements.

As illustrated in FIG. 3, in some embodiments, a plurality of supporting structures 130A are formed on and in physical contact with the dielectric layer 118 of the redistribution circuit structure 110. In other words, for example, the supporting structures 130A are electrically isolated from the redistribution circuit structure 110. In some embodiments, the supporting structures 130A and the UBM patterns 122 are located at a side (e.g., an outermost surface S110t) of the redistribution circuit structure 110 along the direction Z. In some embodiments, the supporting structures 130A and the UBM patterns 122 are, side-by-side, distributed over the outermost surface S110t of the redistribution circuit structure 110, e.g. on a X-Y plane. As shown in FIG. 3, for example, the supporting structures 130A and the UBM patterns 122 are electrically isolated from and spacing away from each other. In one embodiment, the supporting structures 130A are electrically isolated from each other, in part or all. In one alternative embodiments, the supporting structures 130A are electrically connected to each other, where those supporting structures 130A can be able to provide an electrical shielding to the metallization layers (e.g. ML1-ML3 for providing routing function) of the redistribution circuit structure 110.

Figure 16A:
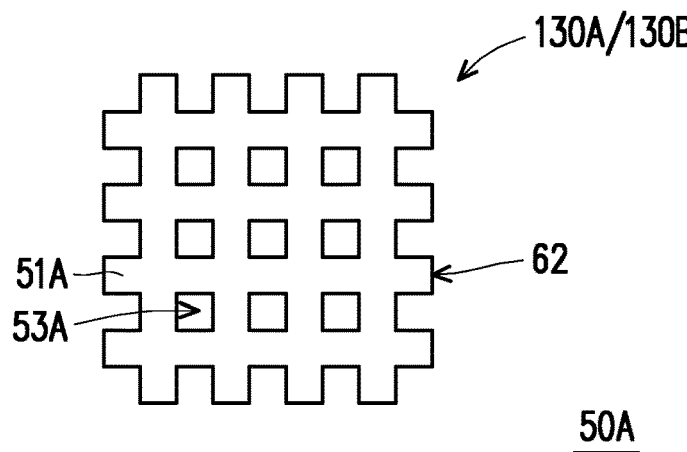
FIG. 16A through FIG. 16I are schematic enlarged top views illustrating various predetermined patterns of a supporting structure in a semiconductor package in accordance with some embodiments of the disclosure.

In some embodiments, the supporting structures 130A independently are formed with a predetermined pattern with or without opening holes or slots (e.g. trenches) for fitting the pattern density control of the design rule, also see FIG. 3 in conjunction with FIG. 16A through FIG. 16I. That is, one of the supporting structures 130A may have a pattern different from that of another one of the supporting structures 130A. Referring to FIG. 16A, for example, in a top view (e.g., on the X-Y plane), the predetermined pattern included in one supporting structure 130A includes a pattern 50A having a comb-like profile (or contour) 62, where the pattern 50A is in a form of mesh. That is, for example, the pattern 50A has a solid plate 51A with a plurality of opening holes 53A formed therein. In some embodiments, a projection of the solid plate 51A on the X-Y plane is mapping into a substantial tetragonal shape, e.g. a rectangle or square. However, the disclosure is not limited thereto; alternatively, the projection of the solid plate 51A on the X-Y plane may be substantially mapping into an elliptical shape, an oval shape, an octagonal shape or any suitable polygonal shape. On the other hand, on the top view, the shapes of the opening holes 53A are not limited to be tetragonal shapes as shown in FIG. 16A, and may be round, elliptical, oval, octagonal or any suitable polygonal shapes depending on the demand and design requirement, the disclosure is not limited thereto. The number of the opening holes 53A is not limited to the drawing of FIG. 16A, and may be one or more than one that being arranged in a matrix or randomly. In some embodiments, the sizes of the opening holes 53A are the same or are, in part or all, different.

Figure 16B:
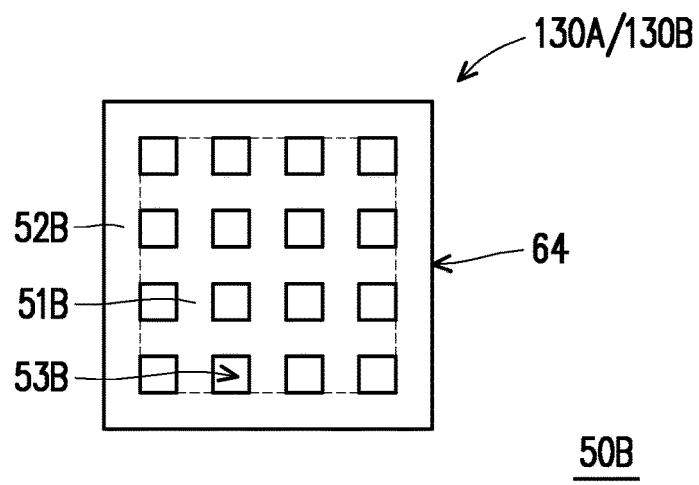

Referring to FIG. 16B, for example, in the top view (e.g., on the X-Y plane), the predetermined pattern included in one supporting structure 130A includes a pattern 50B having a non-comb-like profile (or contour) 64, where the pattern 50B is in a form of mesh. For example, the pattern 50B has a solid plate 51B enclosed by a frame 52B and with a plurality of opening holes 53B formed therein. The configurations and shapes of the solid plate 51B and the opening holes 53B are similar to or the same as the configurations and shapes of the solid plate 51A and the opening holes 53A as described in FIG. 16A, and thus are not repeated herein for brevity. In some embodiments, the frame 52B includes a closed, continuous frame shape, that corresponds to the projection of the pattern 50B mapped onto the X-Y plane.

Figure 16C:
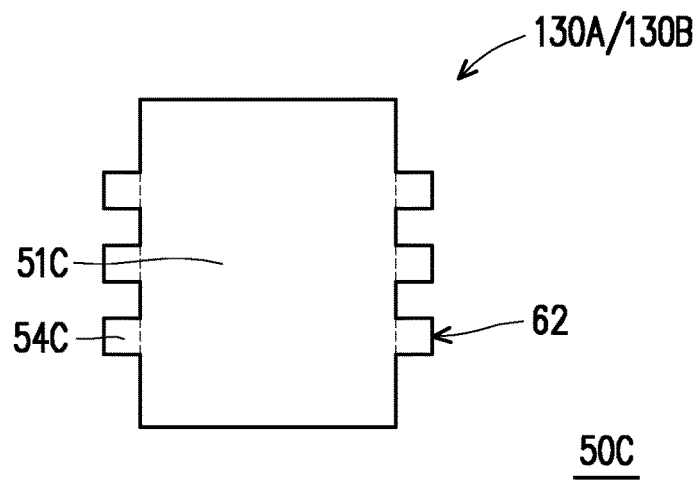

Referring to FIG. 16C, for example, in the top view (e.g., on the X-Y plane), the predetermined pattern included in one supporting structure 130A includes a pattern 50C having a comb-like profile (or contour) 62, where the pattern 50C has a solid plate 51C with a plurality of protrusions 54C connected to an edge of the solid plate 51C. In some embodiments, the protrusions 54C each extend away from the edge of the solid plate 51C. The configuration and shape of the solid plate 51C are similar to or the same as the configuration and shape of the solid plate 51A as described in FIG. 16A, and thus are not repeated herein for brevity. In some embodiments, on the top view, the shapes of the protrusions 54C are not limited to be tetragonal shapes as shown in FIG. 16C, and may be round, elliptical, oval, octagonal or any suitable polygonal shapes depending on the demand and design requirement, the disclosure is not limited thereto. The number of the protrusions 54C is not limited to the drawing of FIG. 16C, and may be one or more than one. If considering multiple protrusions 54C are adopted, the protrusions 54C are distant from each other with equal or different spaces, the disclosure is not limited thereto.

Figure 16D:
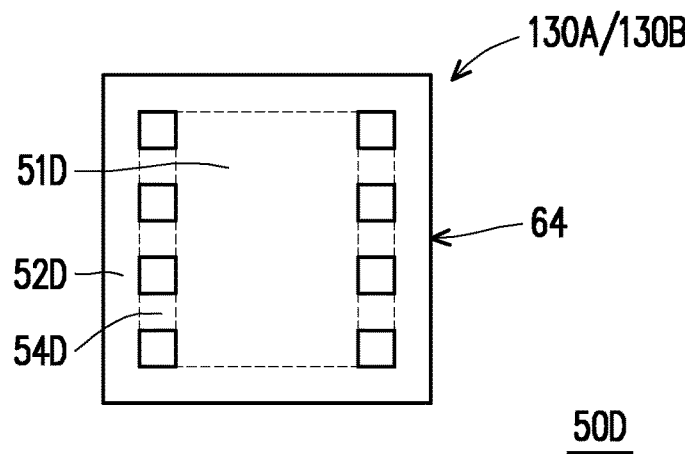

Referring to FIG. 16D, for example, in the top view (e.g., on the X-Y plane), the predetermined pattern included in one supporting structure 130A includes a pattern 50D having a non-comb-like profile (or contour) 64, where the pattern 50D has a solid plate 51D enclosed by a frame 52D and with a plurality of protrusions 54D connected to an edge of the solid plate 51D. The configurations and shapes of the solid plate 51D and the protrusions 54D are similar to or the same as the configurations and shapes of the solid plate 51C and the protrusions 54C as described in FIG. 16C, and thus are not repeated herein for brevity. In some embodiments, the frame 52D includes a closed, continuous frame shape, that corresponds to the projection of the pattern 50D mapped onto the X-Y plane. As shown in FIG. 16D, for example, the protrusions 54D are located between and connected to the solid plate 51D and the frame 52D.

Figure 16E:
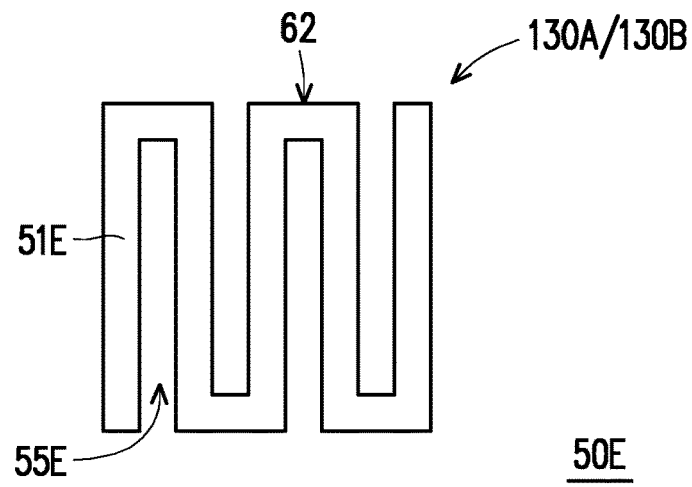

Referring to FIG. 16E, for example, in the top view (e.g., on the X-Y plane), the predetermined pattern included in one supporting structure 130A includes a pattern 50E having a comb-like profile (or contour) 62, where the pattern 50E has a solid plate 51E with a plurality of slits (or trenches) 55E formed therein. The configuration and shape of the solid plate 51E are similar to or the same as the configuration and shape of the solid plate 51A as described in FIG. 16A, and thus are not repeated herein for brevity. In some embodiments, the slits 55E are arranged in the solid plate 51E in a parallel manner along the direction X and each have one opening, where the openings of two immediately adjacent slits 55E are respectively located at two opposite sides of the solid plate 51E along an extending direction (e.g. the direction Y) of the slits 55E. However, the disclosure is not limited thereto.

Figure 16F:
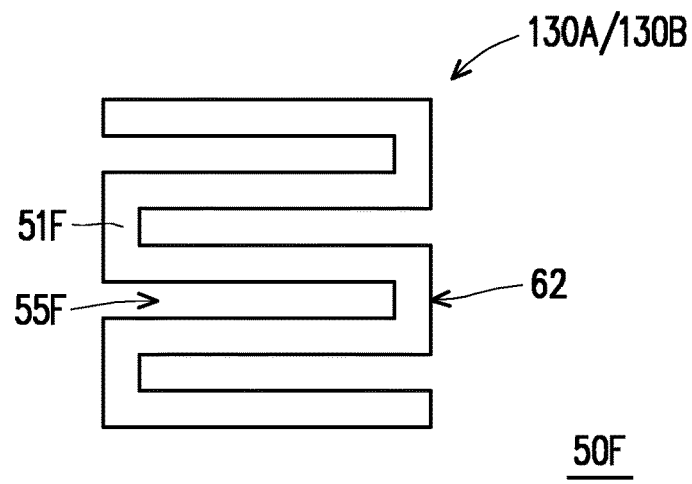

Alternatively, for an embodiment of FIG. 16F, in the top view (e.g., on the X-Y plane), the predetermined pattern included in one supporting structure 130A includes a pattern 50F having a comb-like profile (or contour) 62, where the pattern 50F has a solid plate 51F with a plurality of slits (or trenches) 55F formed therein. For example, the slits 55F are arranged in the solid plate 51F in a parallel manner along the direction Y and each have one opening, where the openings of two immediately adjacent slits 55F are respectively located at two opposite sides of the solid plate 51F along an extending direction (e.g. the direction X) of the slits 55F. In other words, the pattern 50E and the pattern 50F each may include a continuous serpentine line.

Figure 16G:
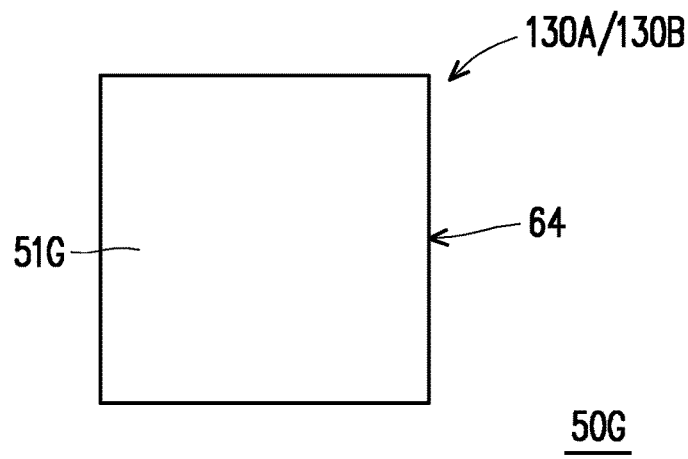
Figure 16H:
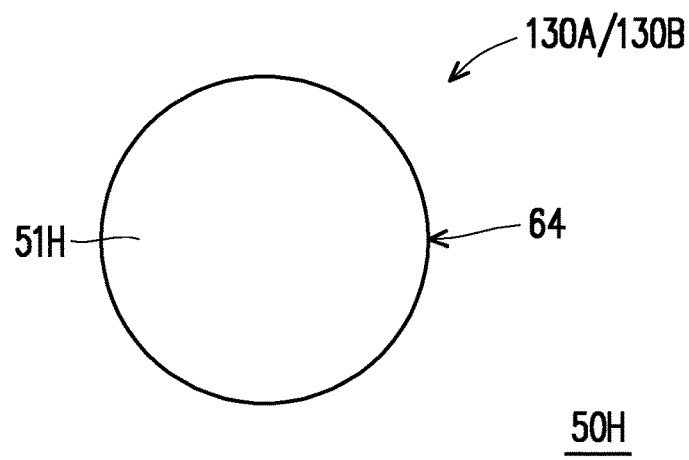
Figure 16I:
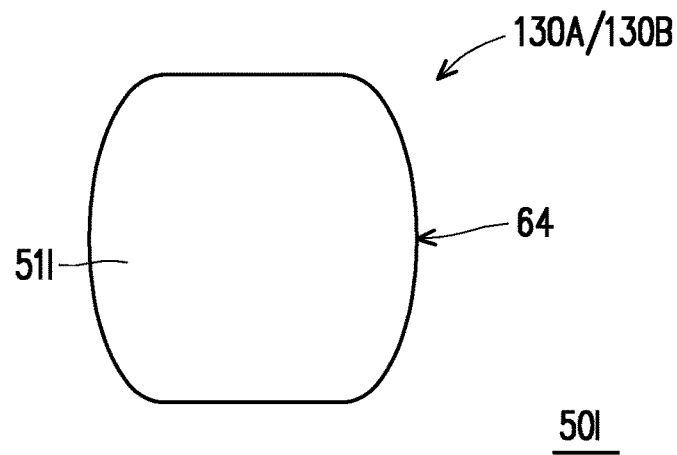

Referring to FIG. 16G, for example, in the top view (e.g., on the X-Y plane), the predetermined pattern included in one supporting structure 130A includes a pattern 50G having a non-comb-like profile (or contour) 64, where the pattern 50G has a solid plate 51G without opening holes or slits. As illustrated in FIG. 16G, in some embodiments, the solid plate 51G is in a form of a tetragonal shape such as square, rectangular, a stripe pattern and so on; however, the disclosure is not limited thereto and may be selected or designated depending on the demand and design requirement. For example, the pattern 50G can be substituted by a pattern 50H having a solid plate 51H in form of a circular shape (FIG. 16H), a pattern 50I having a solid plate 51I in form of an elliptical shape (FIG. 16I), or any suitable pattern with a solid plate in form of an oval shape, an octagonal shape or any suitable polygonal shape.

In the disclosure, the supporting structures 130A each include a metallization layer having a (mechanical) hardness greater than or substantially equal to a (mechanical) hardness of the UBM patterns 122 and greater than or substantially equal to a (mechanical) hardness of the metallization layers ML1 through ML3. The material of the supporting structures 130A may include copper, nickel, titanium, tungsten, or alloys thereof or the like, and may be formed in a manner of a single layer or a multi-layer (e.g. with different materials in any two stacked layers in one supporting structure 130A) by an electroplating process. The number of the supporting structures 130A is not limited to the drawings of the disclosure, and may be selected based on the demand and/or the design requirement. In one embodiment, the supporting structures 130A and the UBM patterns 122 are formed in the same step. Alternatively, the supporting structures 130A and the UBM patterns 122 are formed in different steps. In some embodiments, the supporting structures 130A are referred to as reinforced structure of a semiconductor package P1a depicted in FIG. 15. Owing to the supporting structures 130A, the reliability of the semiconductor package P1a is enhanced.

Figure 4:
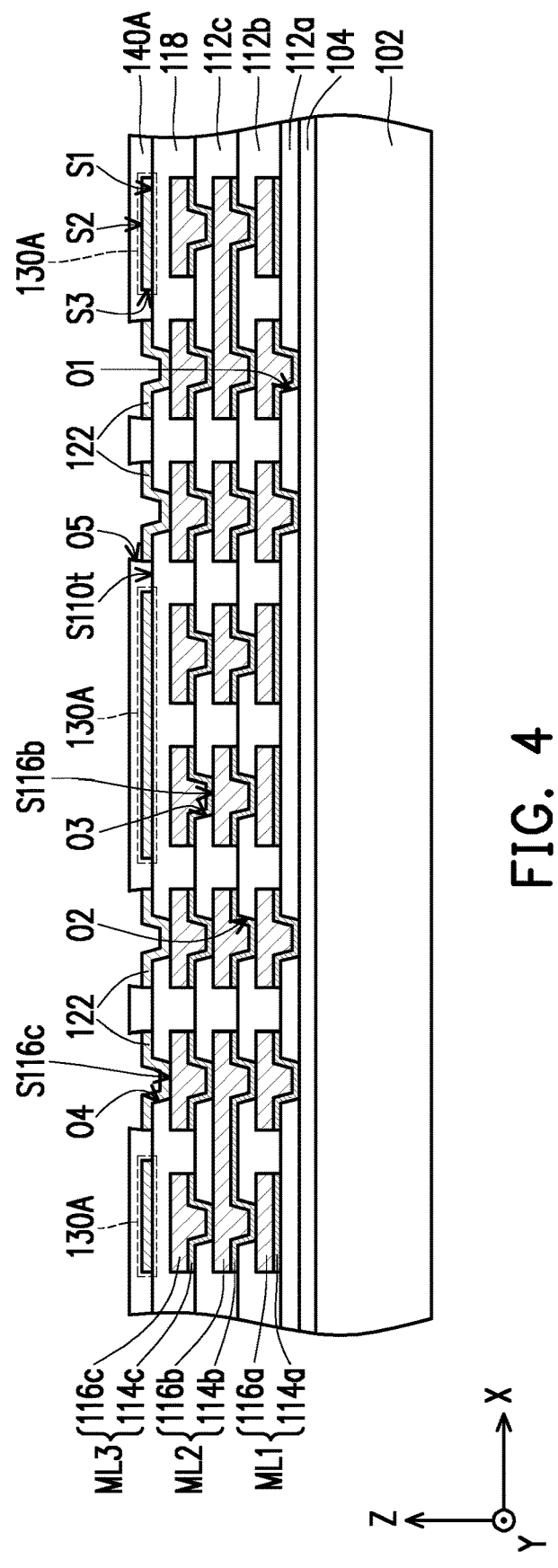

Referring to FIG. 4, in some embodiments, a passivation layer 140A is formed over the redistribution circuit structure 110. In some embodiments, the passivation layer 140A is formed on the UBM patterns 122 and the supporting structures 130A, where the UBM patterns 122 and the supporting structures 130A are sandwiched between the passivation layer 140A and the redistribution circuit structure 110. In some embodiments, the passivation layer 140A completely covers the supporting structures 130A, and the supporting structures 130A are enclosed by the redistribution circuit structure 110 (e.g. the dielectric layer 118) and the passivation layer 140A. For example, a surface S1 of each of the supporting structures 130A is in contact with the dielectric layer 118, and a surface S2 and a sidewall S3 of each of the supporting structures 130A are in contact with the passivation layer 140A. The sidewall S3 connects the surface S1 and the surface S2. On the other hand, the passivation layer 140A accessibly reveals each of the UBM patterns 122 through a plurality of openings O5 formed in the passivation layer 140A for electrically connecting to the later-formed connectors. The UBM patterns 122 each are completely exposed by the openings O5 formed in the passivation layer 140A, as shown in FIG. 4, for example. However, the disclosure is not limited thereto; alternatively, the passivation layer 140A may accessibly reveal at least a part of each of the UBM patterns 122 through the openings O5 formed in the passivation layer 140A.

In the disclosures, the passivation layer 140A has a (mechanical) hardness greater than or substantially equal to a (mechanical) hardness of the dielectric layers (112 and 118) included in the redistribution circuit structure 110. In some embodiments, the passivation layer 140A is referred to as a protective layer of the supporting structures 130A for providing protection thereto. In one embodiment, the material of the passivation layer 140A is the same as the material of the dielectric layers 112 (e.g. 112a, 112b, or 112c) or 118. In an alternative embodiment, the material of the passivation layer 140A is the different from the material of the dielectric layers 112 (e.g. 112a, 112b, or 112c) or 118.

In some embodiments, the passivation layer 140A is formed by, but not limited to, forming a blanket layer of dielectric material over the outermost surface S110t of the redistribution circuit structure 110 to completely cover the UBM patterns 122 and the supporting structures 130A and patterning the dielectric material blanket layer to form the passivation layer 140A with the openings O5 exposing the portions of the UBM patterns 122 underneath thereto. The material of the passivation layer 140A may be PI, PBO, BCB, a nitride such as silicon nitride, an oxide such as silicon oxide, PSG, BSG, BPSG, a combination thereof or the like, which may be patterned using a photolithography and/or etching process. In some embodiments, the dielectric material blanket layer is formed by suitable fabrication techniques such as spin-on coating, CVD, (e.g. PECVD), or the like.

Figure 5:
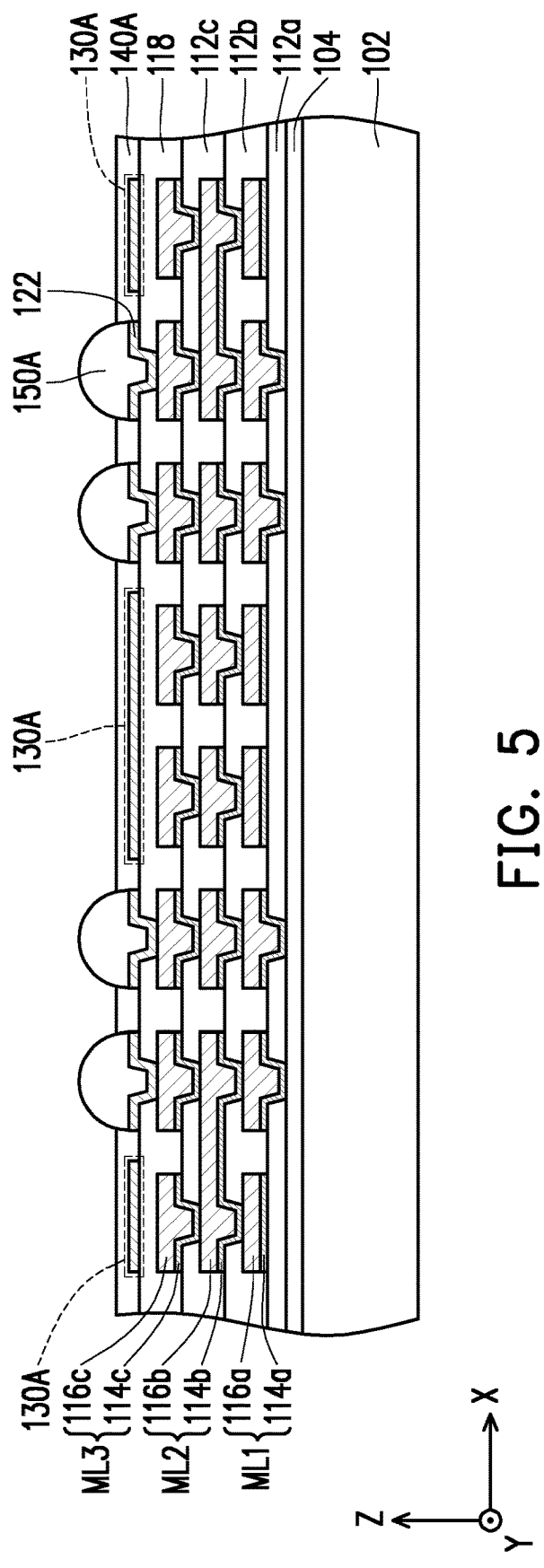

Referring to FIG. 5, in some embodiments, a plurality of conductive terminals 150A are formed on the UBM patterns 122 and over the redistribution circuit structure 110.

In some embodiments, the conductive terminals 150A are electrically coupled to the redistribution circuit structure 110 through the UBM patterns 122, where the conductive terminals 150A are electrically isolated from the supporting structures 130A. Due to the UBM patterns 122, the adhesive strength between the conductive terminals 150A and the redistribution circuit structure 110 is enhanced.

In some embodiments, the conductive terminals 150A are attached to the UBM patterns 122 through a solder flux. In some embodiments, the conductive terminals 150A may be disposed on the UBM patterns 122 by ball placement process or reflow process. In some embodiments, the conductive terminals 150A are, for example, micro-bumps, chip connectors (e.g. controlled collapse chip connection (C4) bumps), ball grid array (BGA) balls, solder balls or other connectors. The number of the conductive terminals 150A is not limited to the disclosure, and may be designated and selected based on the numbers of the openings O5 (or saying the number the UBM patterns 122 exposing by the openings O5). When solder is used, the solder may include either eutectic solder or non-eutectic solder. The solder may include lead or be lead-free, and may include Sn—Ag, Sn—Cu, Sn—Ag—Cu, or the like.

In one embodiment, the conductive terminals 150A are referred to as conductive connectors for connecting with another package or a circuit substrate (e.g. organic substrate such as printed circuit board (PCB)). In an alternative embodiment, the conductive terminals 150A are referred to as conductive terminals for inputting/outputting electric and/or power signals. In a further alternative embodiment, the conductive terminals 150A are referred to as conductive terminals for connecting with one or more than one semiconductor dies independently including active devices (e.g., transistors, diodes, etc.) and/or passive devices (e.g., capacitors, resistors, inductors, etc.), other components such as one or more than one integrated passive device (IPDs), or combinations thereof. The disclosure is not limited thereto.

Figure 6:
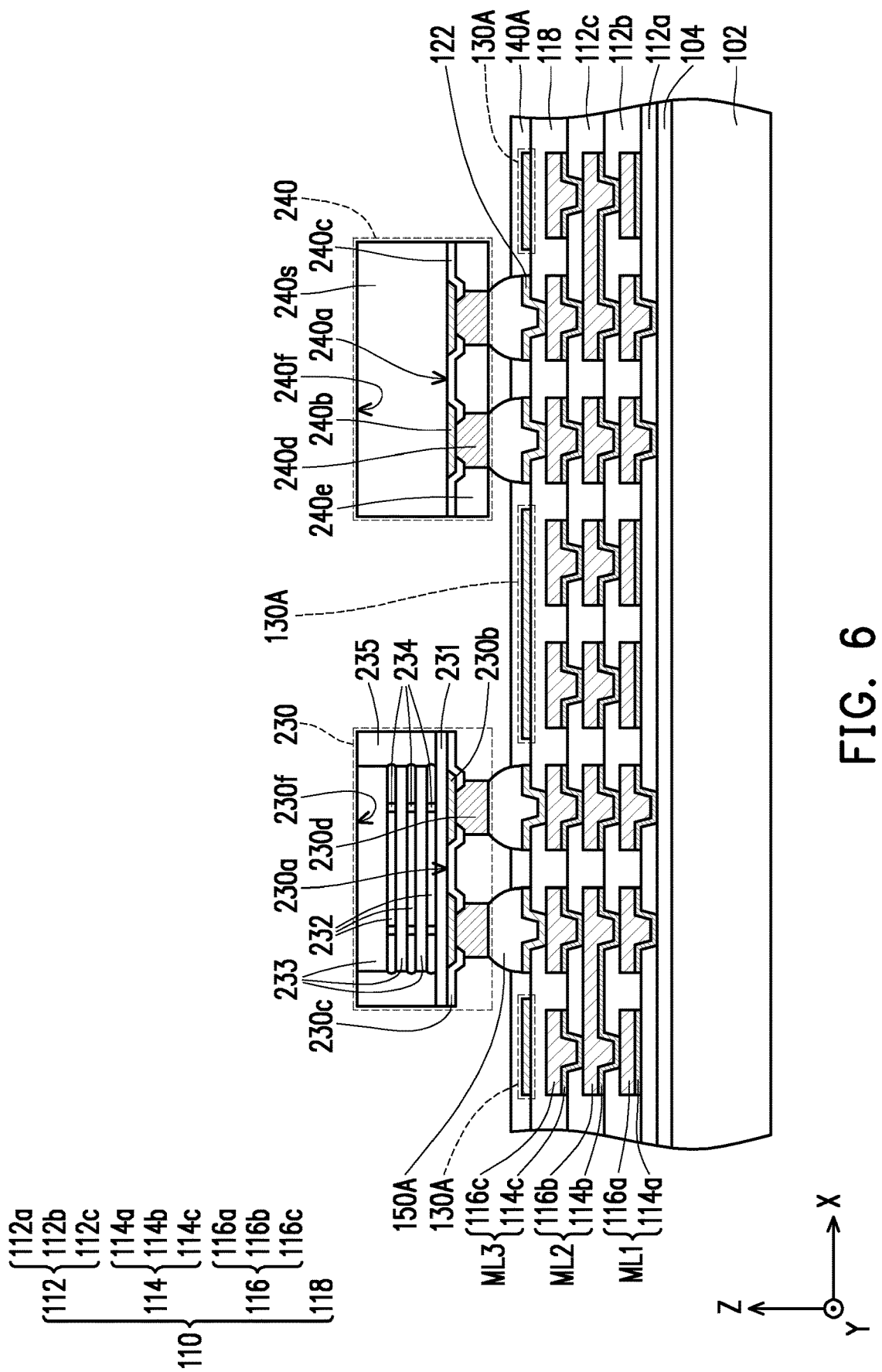

Referring to FIG. 6, in some embodiments, at least one semiconductor die is provided. For example, semiconductor dies 230 and 240 are arranged aside to each other on the X-Y plane (also see FIG. 15). In some embodiments, as shown in FIG. 6, the semiconductor dies 230 and 240 are picked and placed on the redistribution circuit structure 110 (e.g. the outermost surface S110t of the redistribution circuit structure 110). In some embodiments, the semiconductor dies 230 and 240 are bonded to the redistribution circuit structure 110 through the conductive terminals 150A and the UBM patterns 122. In the disclosure, it should be appreciated that the illustration of the semiconductor dies 230, 240 and other components throughout all figures is schematic and is not in scale.

As illustrated in FIG. 6, in some embodiments, the semiconductor die 230 includes a die stack 230s having an active surface 230a and a backside surface 230f opposite to the active surface 230a, a plurality of pads 230b distributed on the active surface 230a, a passivation layer 230c covering the active surface 230a and a portion of the pads 230b, and a plurality of conductive vias 230d connecting to the pads 230b exposing by the passivation layer 230c. The pads 230b, the passivation layer 230c and the conductive vias 230d are formed on the die stack 230s. The pads 230b are partially exposed by the passivation layer 230c, and the conductive vias 230d are respectively disposed on and electrically connected to the pads 230b.

The pads 230b are aluminum pads or other suitable metal pads, for example. In some embodiments, the passivation layer 230c may be a PBO layer, a PI layer or other suitable polymers. In some alternative embodiments, the passivation layer 230c may be made of inorganic materials, such as silicon oxide, silicon nitride, silicon oxynitride, or any suitable dielectric material. The conductive vias 230d are copper pillars, copper alloy pillar or other suitable metal pillars containing copper metal, for example.

The die stack 230s may include a base tier and at least one inner tier stacked thereon. As shown in FIG. 6, for example, the die stack 230s includes a carrier die 231, a plurality of dielectric films 232, a plurality of dies 233, a plurality of conductive vias 234 and an encapsulant 235, where the dies 233 are sequentially disposed on the carrier die 231 along the direction Z, and the conductive vias 234 are grouped into different groups to electrically connect two adjacent and overlapping dies of the carrier die 231 and the dies 233. In some embodiments, the different groups of the conductive vias 234 are independently covered by a respective one of the dielectric films 232, and a surface of the carrier die 231 exposed by the dielectric films 232 and the dies 233, sidewalls of the dielectric films 232 and sidewalls of the dies 233 are covered by the encapsulant 235. As shown in FIG.

6, in some embodiments, the conductive vias 234 are separated from the encapsulant 235 by the dielectric films 232. For example, the carrier die 231 is referred to as a base tier of the die stack 230s while the each of the dies 233 is referred to as a stacking tier or an inner tier of the die stack 230s. As illustrated in FIG. 6, for example, the carrier die 231 (e.g., the base tier) of the die stack 230s is electrically connected to the conductive vias 230d through the pads 230b, where the conductive vias 230d are referred to as conductive terminals of the semiconductor die 230 for electrical connection to external components. The number of the carrier die 231 included in the base tier and the number of the dies 233 included in each inner tier are, independently, not limited to the disclosure, and may be one or more than one based on the demand and design layout.

It is noted that, each of the carrier die 231 and the dies 233 may further include an interconnect structure (not shown), conductive pads (not shown), a passivation layer (not shown), and a post-passivation layer (not shown). The carrier die 231 described herein may be referred as a semiconductor chip or an integrated circuit (IC). In some embodiments, the carrier die 231 includes one or more digital chips, analog chips or mixed signal chips, such as an application-specific integrated circuit ("ASIC") chips, a sensor chip, a wireless and radio frequency (RF) chip, a logic chip or a voltage regulator chip. The logic chip may be a central processing unit (CPU), a graphics processing unit (GPU), a system-on-a-chip (SoC), a microcontroller, or the like. In some embodiments, each of the dies 233 includes a memory die (e.g., a dynamic random-access memory (DRAM) die, static random-access memory (SRAM) die, a synchronous dynamic random-access memory (SDRAM), a NAND flash, etc.). That is to say, the semiconductor die 230 includes a hybrid memory cube (HMC) module, a high bandwidth memory (HBM) module, or the like; in some embodiments. For example, the dies 233 in the die stack 230s of the semiconductor die 230 may be high bandwidth memory (HBM) dies, and the carrier die 231 may be a logic die providing control functionality for these memory dies.

In some embodiments, the dielectric films 232 independently includes a PBO layer, a PI layer or other suitable polymers. In some alternative embodiments, a material of the dielectric films 232 includes an inorganic material, such as silicon oxide, silicon nitride, silicon oxynitride, or any suitable dielectric material. The dielectric films 232 may be formed by suitable fabrication techniques such as spin-on coating, CVD, (e.g. PECVD), or the like. Alternatively, the dielectric films 232 each are, for example, a non-conductive film (NCF) which can be formed by lamination. The conductive vias 234 are copper pillars, copper alloy pillar or other suitable metal pillars containing copper metal, for example.

In some embodiments, the material of the encapsulant 235 includes a molding compound, a molding underfill, a resin (such as epoxy), or the like. In some alternative embodiments, the material of the encapsulant 235 includes nitride such as silicon nitride, oxide such as silicon oxide, PSG, BSG, BPSG, a combination thereof, or the like. In yet alternative embodiments, the material of each of the encapsulant 235 includes an organic material (e.g., epoxy, PI, PBO, or the like), or the mixture of inorganic and organic materials (e.g., the mixture of silicon oxide and epoxy, or the like). In some embodiments, the encapsulant 235 may be formed by a molding process, such as a compression molding process. In some alternative embodiments, the encapsulant 235 may be formed through suitable fabrication techniques such as CVD (e.g., high-density plasma chemical vapor deposition (HDPCVD) or PECVD). As illustrated in FIG. 6, for example, the backside surface 230f of the semiconductor die 230 includes a surface of the encapsulant 235 and a surface of the die 233 included in an outmost tier of the inner tiers in the die stack 230s, where the surface of the die 233 included in the outmost tier and the surface of the encapsulant 235 are substantially leveled with and coplanar to each other.

As illustrated in FIG. 6, in some embodiments, the semiconductor die 240 includes a semiconductor substrate 240s having an active surface 240a and a backside surface 240f opposite to the active surface 240a, a plurality of pads 240b distributed on the active surface 240a, a passivation layer 240c covering the active surface 240a and a portion of the pads 240b, a plurality of conductive vias 240d connecting to the pads 240b exposing by the passivation layer 240c, and a protection layer 240e disposed on the conductive vias 240d. The pads 240b, the passivation layer 240c, the conductive vias 240d, and the protection layer 240e are formed on the semiconductor substrate 240s. The pads 240b are partially exposed by the passivation layer 240c, the conductive vias 240d are respectively disposed on and electrically connected to the pads 240b, and the protection layer 240e covers the passivation layer 240c exposed by the conductive vias 240d and the conductive vias 240d.

However, the disclosure may not be limited thereto. For example, the conductive vias 240d and the protection layer 240e may be omitted. In an alternative embodiment, the semiconductor die 240 may include the semiconductor substrate 240s having the active surface 240a and the backside surface 240f opposite to the active surface 240a, the plurality of pads 240b distributed on the active surface 240a, and the passivation layer 240c covering the active surface 240a and a portion of the pads 240b.

The material of the semiconductor substrate 240s may include a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components may be formed in a front-end-of-line (FEOL) process. In an alternative embodiment, the semiconductor substrate 240s may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In addition, the semiconductor substrate 240s may further include an interconnection structure (not shown) disposed on the active surface 240a. In certain embodiments, the interconnection structure may include one or more inter-dielectric layers and one or more patterned conductive layers stacked alternately for providing routing function to the active components and the passive components embedded in the semiconductor substrate 240s, where the pads 240b may be referred to as an outermost layer of the patterned conductive layers. In one embodiment, the interconnection structure may be formed in a back-end-of-line (BEOL) process. For example, the inter-dielectric layers may be silicon oxide layers, silicon nitride layers, silicon oxy-nitride layers, or dielectric layers formed by other suitable dielectric materials, and the inter-dielectric layers may be formed by deposition or the like. For example, the patterned conductive layers may be patterned copper layers or other suitable patterned metal layers, and the patterned conductive layers may be formed by electroplating or deposition. However, the disclosure is not limited thereto.

The pads 240b are aluminum pads or other suitable metal pads, for example. The conductive vias 240d are copper pillars, copper alloy pillar or other suitable metal pillars containing copper metal, for example. In some embodiments, the passivation layer 240c and the protection layer 240e may be a PBO layer, a PI layer or other suitable polymers. In some alternative embodiments, the passivation layer 240c and the protection layer 240e may be made of inorganic materials, such as silicon oxide, silicon nitride, silicon oxynitride, or any suitable dielectric material. The material of the passivation layer 240c can be the same or different from the material of the protection layer 240e, for example.

The semiconductor die 240 may be referred to as semiconductor dies or chips, independently, including a digital chip, analog chip or mixed signal chip. In some embodiments, the semiconductor die 240 is a logic die such as a CPU, a GPU, a neural network processing unit (NPU), a deep learning processing unit (DPU), a tensor processing unit (TPU), a SoC, an application processor (AP), and a microcontroller; a power management die such as a power management integrated circuit (PMIC) die; a wireless and radio frequency (RF) die; a baseband (BB) die; a sensor die such as a photo/image sensor chip; a micro-electro-mechanical-system (MEMS) die; a signal processing die such as a digital signal processing (DSP) die; a front-end die such as an analog front-end (AFE) dies; an application-specific die such as an application-specific integrated circuit (ASIC), a field-programmable gate array (FPGA), etc.); a combination thereof; or the like. In alternative embodiments, the semiconductor die 240 are, independently, an artificial intelligence (AI) engine such as an AI accelerator; a computing system such as an AI server, a high-performance computing (HPC) system, a high power computing device, a cloud computing system, an edge computing system, etc.; a combination thereof; or the like. The type of the semiconductor die 240 may be selected and designated based on the demand and design requirement, and thus are not specifically limited in the disclosure.

As shown in FIG. 6, only one semiconductor die 230 and one semiconductor die 240 are presented for illustrative purposes, however, it should be noted that the number of the semiconductor die 230 and the number of the semiconductor die 240 may be, independently, one or more than one, the disclosure is not limited thereto. That is to say, the semiconductor die 230 may include a plurality of semiconductor dies 230, and/or the semiconductor die 240 may include a plurality of semiconductor dies 240. In the embodiments of which the number of the semiconductor die 230 is more than one, the semiconductor dies 230 can be the same types. Alternatively, the semiconductor dies 230 may be different types, in part or all. In the embodiments of which the number of the semiconductor die 240 is more than one, the semiconductor dies 240 can be the same types. Alternatively, the semiconductor dies 240 may be different types, in part or all.

In certain embodiments, one or more than one additional semiconductor die, except for the semiconductor dies 230 and 240, is further provided, where the additional semiconductor die(s) may be, independently, the same type or different types as comparing with the types of the semiconductor dies 230 and/or 240. The disclosure is not limited thereto. In the disclosure, the direction Z may be referred to as a stacking direction of the redistribution circuit structure 110 and the semiconductor dies 230, 240.

Figure 7:
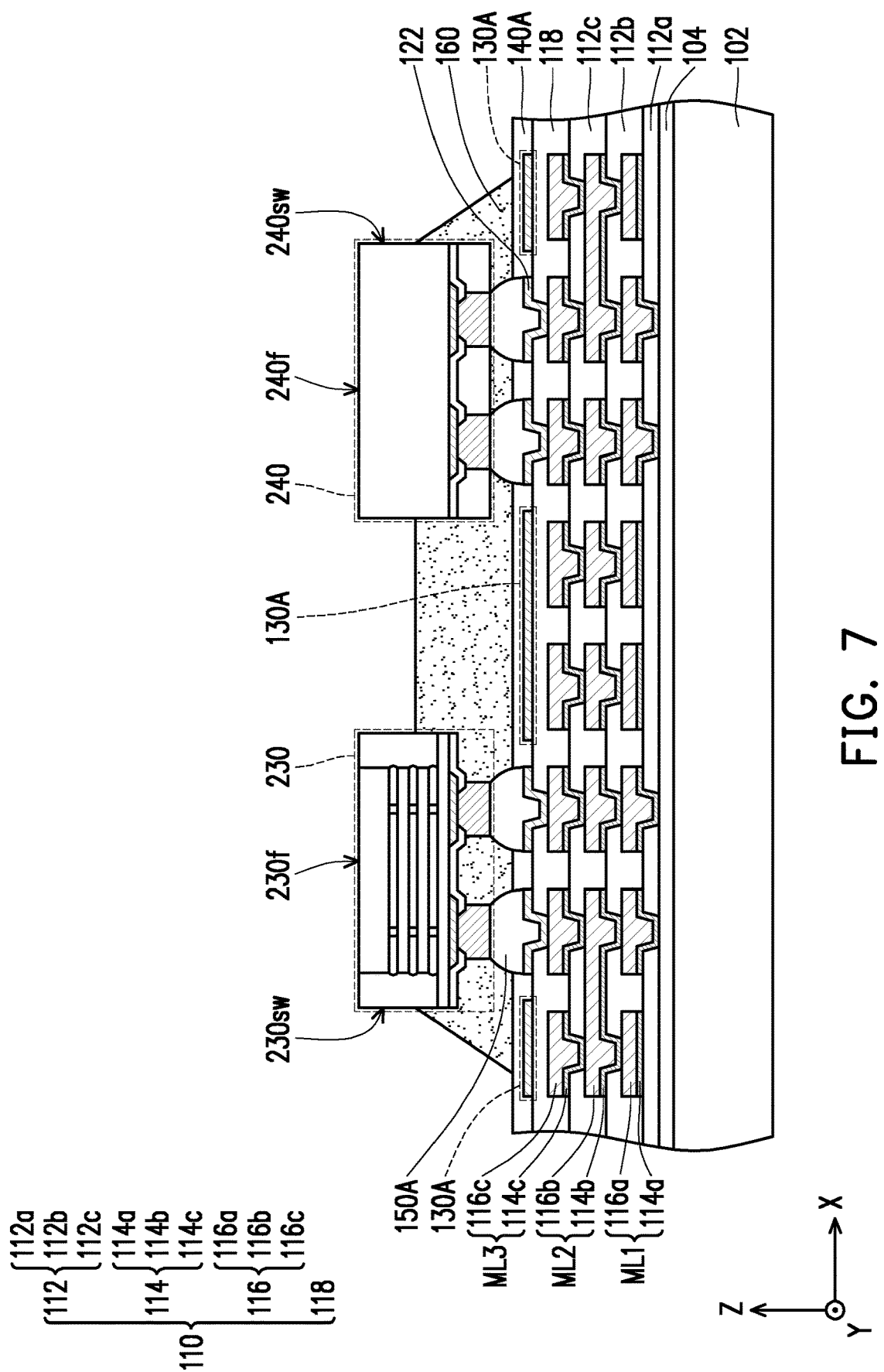

Referring to FIG. 7, in some embodiments, an underfill material 160 is formed between the semiconductor dies 230, 240 and the redistribution circuit structure 110 and dispensed around the conductive terminals 150A. In some embodiments, the underfill material 160 at least fills the gaps between the conductive terminals 150A and between the redistribution circuit structure 110, the conductive terminals 150A, the semiconductor die 230 and the semiconductor die 240. As shown in FIG. 7, for example, the underfill material 160 is disposed on the redistribution circuit structure 110 and wraps sidewalls of the conductive terminals 150A to provide structural support and protection to the conductive terminals 150A. In some embodiments, the underfill material 160 covers at least a part of a sidewall 230sw of the semiconductor die 230 and a part of a sidewall 240sw of the semiconductor die 240, and further exposes the backside surface 230f of the semiconductor die 230 and the backside surface 240f of the semiconductor die 240, as shown in FIG. 7.

However, the disclosure is not limited thereto. In an alternative embodiment (not shown), the underfill material 160 completely covers the sidewalls (e.g. 230sw, 240sw) and the backside surfaces (e.g. 230f, 240f) of the semiconductor dies 230 and 240. In a further alternative embodiment (not shown), the underfill material 160 completely covers the sidewalls (e.g. 230sw, 240sw) of the semiconductor dies 230, 240 and accessibly exposes the backside surfaces (e.g. 230f, 240f) of the semiconductor dies 230, 240. In a yet further alternative embodiment (not shown), the underfill material 160 completely and accessibly exposes the sidewalls (e.g. 230sw, 240sw) and the backside surfaces (e.g. 230f, 240f) of the semiconductor dies 230, 240.

In one embodiment, the underfill material 160 may be formed by underfill dispensing or any other suitable method. In some embodiments, the underfill material 160 may be a molding compound including polymer material (e.g., epoxy, resin, and the like) either with or without hardeners, fillers (e.g., silica filler, glass filler, aluminum oxide, silicon oxide, and the like), adhesion promoters, combinations thereof, and the like.

Figure 8:
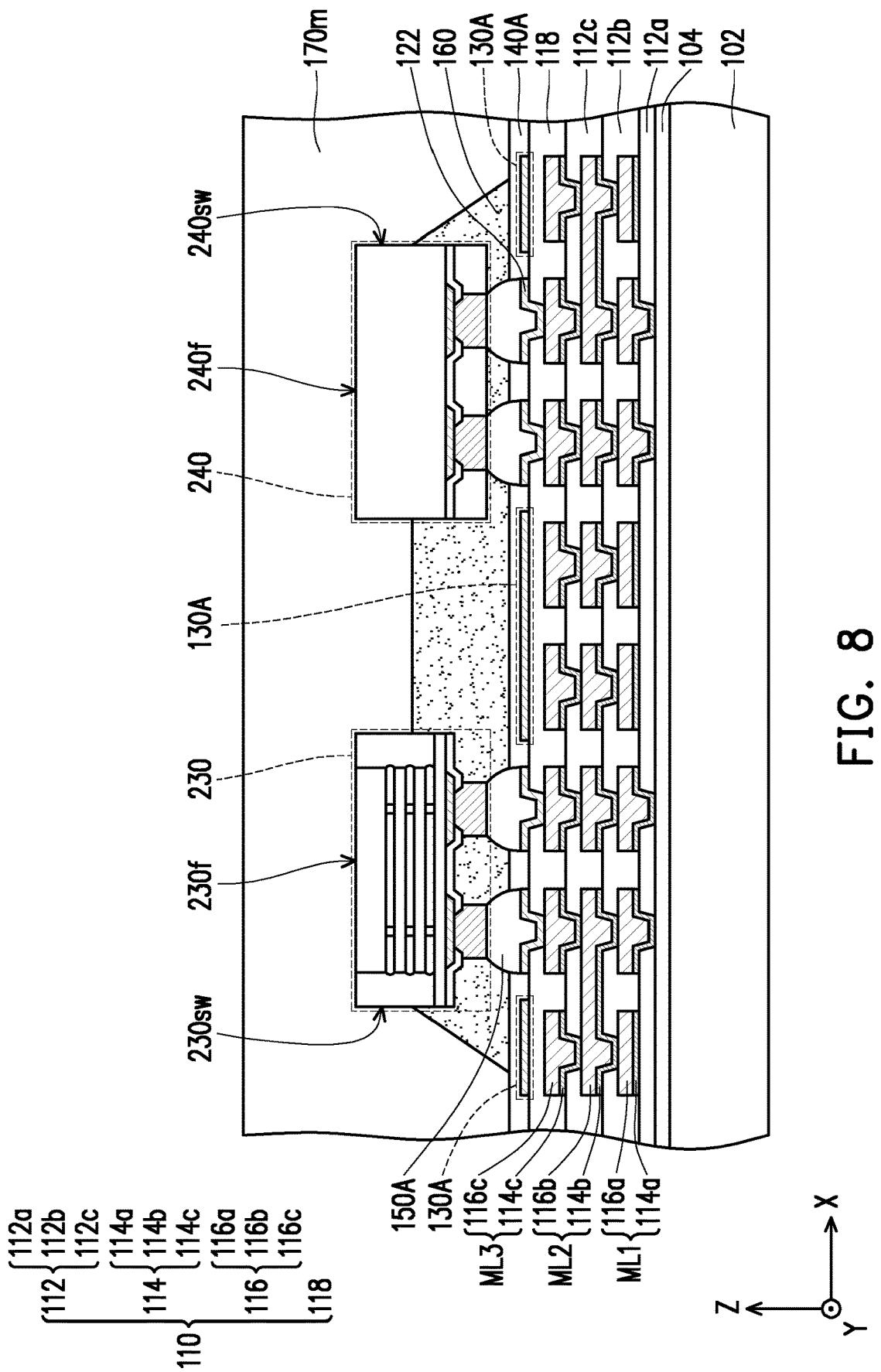

Referring to FIG. 8, in some embodiments, the semiconductor dies 230, 240 are encapsulated in an insulating encapsulation 170m. In some embodiments, the insulating encapsulation 170m is formed on the underfill material 160 and over the redistribution circuit structure 110. As shown in FIG. 8, for example, the insulating encapsulation 170m at least fills up the gaps between the semiconductor dies 230 and 240 and between the underfill material 160 and the semiconductor dies 230, 240. In some embodiments, the insulating encapsulation 170m covers the semiconductor dies 230, 240, the underfill material 160 and the redistribution circuit structure 110 exposed by the semiconductor dies 230, 240 and the underfill material 160. In other words, for example, the semiconductor dies 230, 240 are not accessibly revealed by and embedded in the insulating encapsulation 170m.

In some embodiments, the insulating encapsulation 170m is a molding compound formed by a molding process. The molding process may include a compression molding process or a transfer molding process. The insulating encapsulation 170m may include polymers (such as epoxy resins, phenolic resins, silicon-containing resins, or other suitable resins), dielectric materials, or other suitable materials. Alternatively, the insulating encapsulation 170m may include an acceptable insulating encapsulation material. In some embodiments, the insulating encapsulation 170m further includes inorganic filler or inorganic compound (e.g.

silica, clay, and so on) which can be added therein to optimize coefficient of CTE of the insulating encapsulation 170m. The disclosure is not limited thereto.

In one embodiment, a material of the insulating encapsulation 170m may be different from a material of the underfill material 160, where a clear interface is presented between the insulating encapsulation 170m and the underfill material 160, as shown in FIG. 8. However, the disclosure is not limited thereto; the material of the insulating encapsulation 170m may be the same as the material of the underfill material 160, where there is no clear interface between the insulating encapsulation 170m and the underfill material 160.

Figure 9:
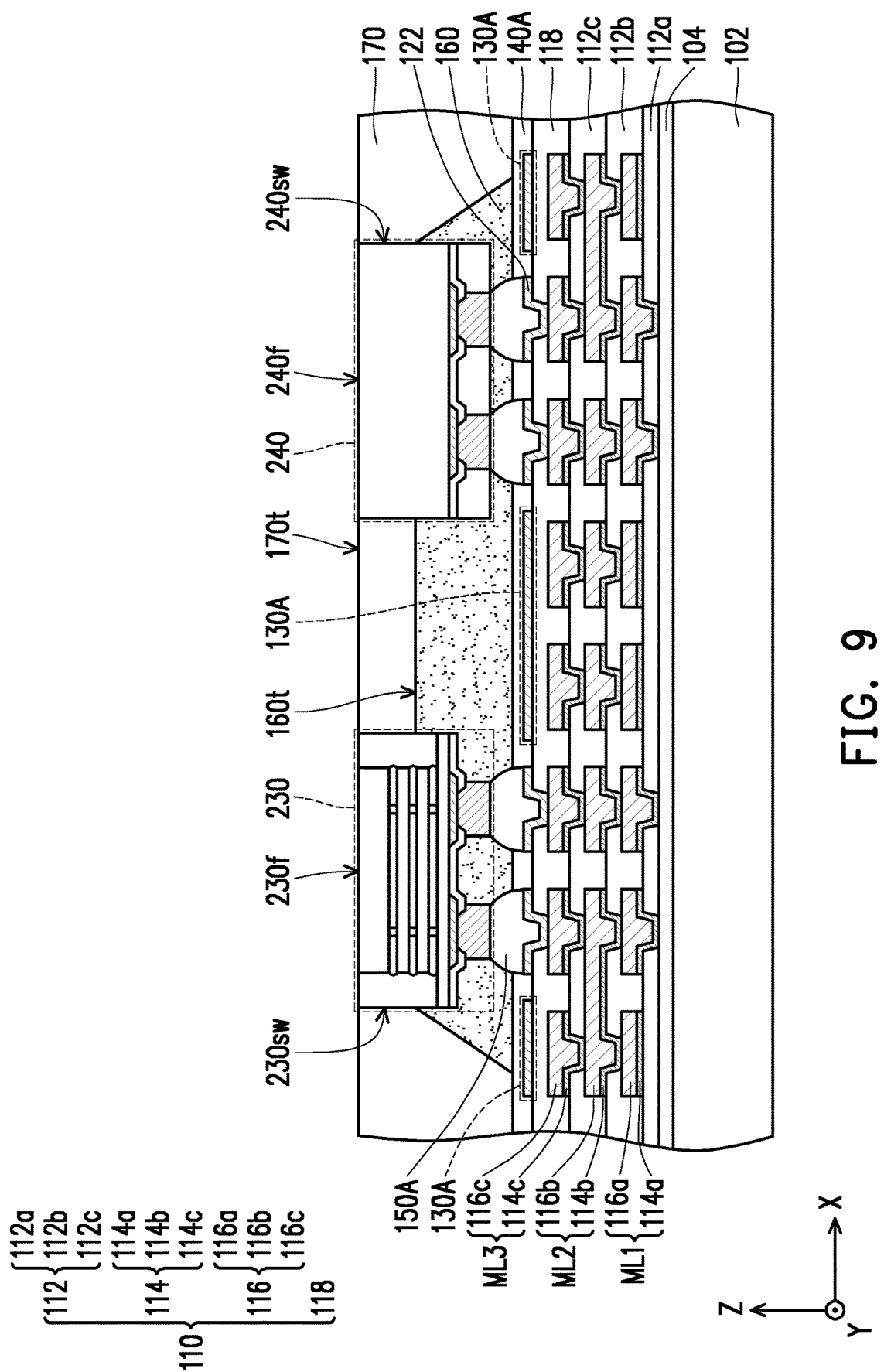

Referring to FIG. 9, in some embodiments, the insulating encapsulation 170m is planarized to form an insulating encapsulation 170 exposing the semiconductor dies 230 and 240. In certain embodiments, as shown in FIG. 9, after the planarization, the backside surface 230f of the semiconductor die 230 and the backside surface 240f of the semiconductor die 240 are exposed by a surface 170t of the insulating encapsulation 170. That is, for example, the backside surface 230f of the semiconductor die 230 and the backside surface 240f of the semiconductor die 240 become substantially leveled with the surface 170t of the insulating encapsulation 170. In other words, the backside surface 230f of the semiconductor die 230, the backside surface 240f of the semiconductor die 240 and the surface 170t of the insulating encapsulation 170 are substantially coplanar to each other.

The insulating encapsulation 170m may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method. In some embodiments, during planarizing the insulating encapsulation 170m, the semiconductor die 230 and/or the semiconductor die 240 may also be planarized. In certain embodiments, the planarizing step may be, for example, performed on the over-molded insulating encapsulation 170m to level the surface 170t of the insulating encapsulation 170, the backside surface 230f of the semiconductor die 230 and the backside surface 240f of the semiconductor die 240.

The semiconductor dies 230 and 240 are laterally exposed by the insulating encapsulation 170, for example. In some embodiments, as shown in FIG. 9, the semiconductor dies 230 and 240 are accessibly revealed by the insulating encapsulation 170. Owing to such configuration, a better heat dissipation of the semiconductor package is ensured. As shown in FIG. 9, for example, a surface 160t of the underfill material 160 is below the surface 170t of the insulating encapsulation 170, however the disclosure is not limited thereto. In an alternative embodiment, the surface 160t of the underfill material 160 is substantially leveled with and coplanar to the surface 170t of the insulating encapsulation 170.

Figure 10:
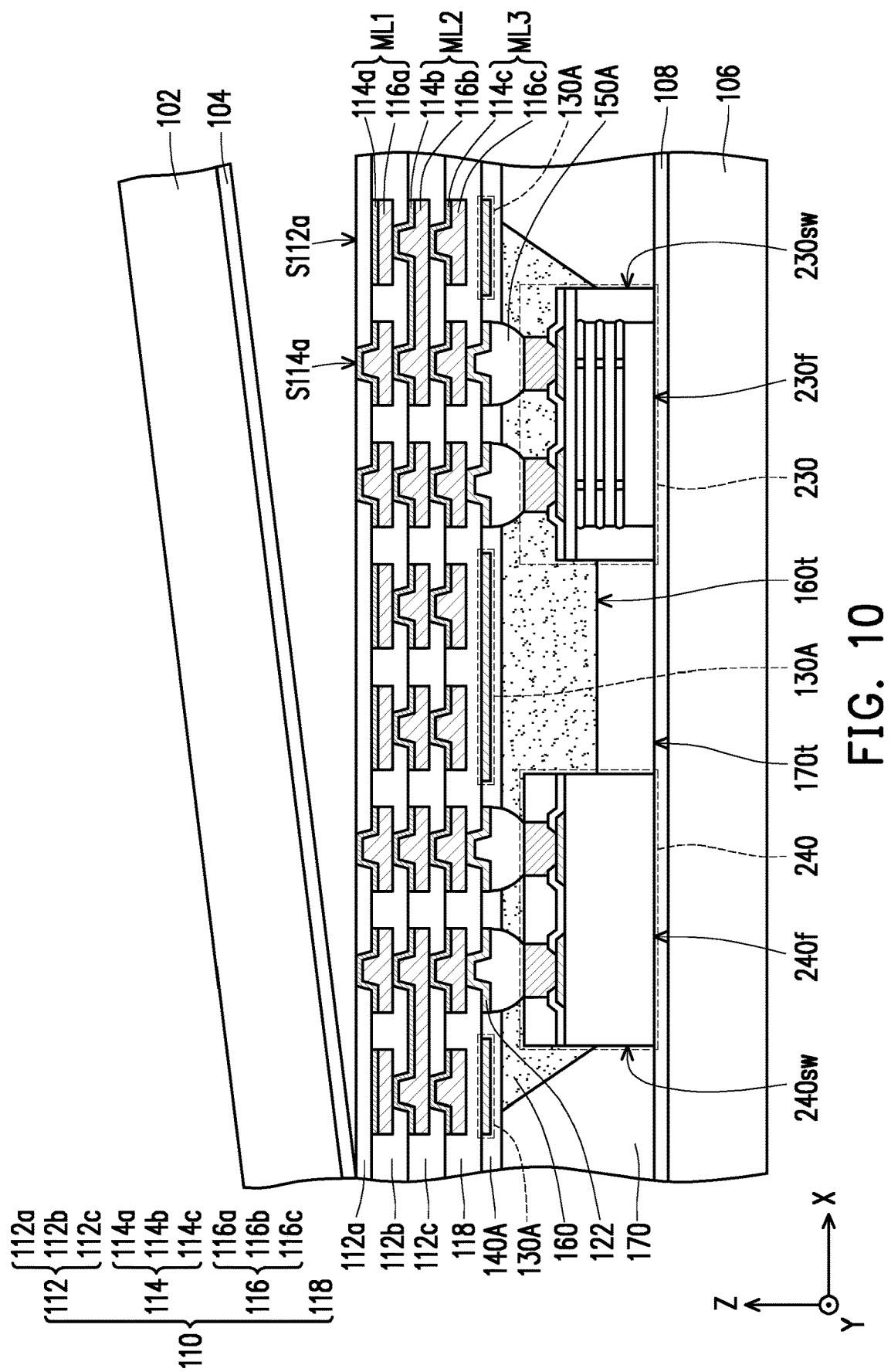

Referring to FIG. 10, in some embodiments, the whole structure depicted in FIG. 9 is flipped (turned upside down) and placed on a carrier 106 coated with a debond layer 108, and the carrier 102 is debonded from the redistribution circuit structure 110. In some embodiments, the redistribution circuit structure 110 (e.g. the dielectric material 112a and the seed layer 114a) are easily separated from the carrier 102 due to the debond layer 104, where the redistribution circuit structure 110 (e.g. a surface S112a of the dielectric layer 112a and a surface S114a of the seed layer 114a) is exposed. In some embodiments, the carrier 102 is detached from the redistribution circuit structure 110 through a debonding process, and the carrier 102 and the debond layer 104 are removed. In one embodiment, the debonding process is a laser debonding process.

In some embodiments, the materials of the carrier 106 and the carrier 102 may be the same, however the disclosure is not limited thereto. In an alternative embodiment, the material of the carrier 106 may be different from the material of the carrier 102. In some embodiments, the material and formation of the debond layer 108 may be the same or different from the material and formation of the debond layer 104, the disclosure is not limited thereto.

Figure 11:
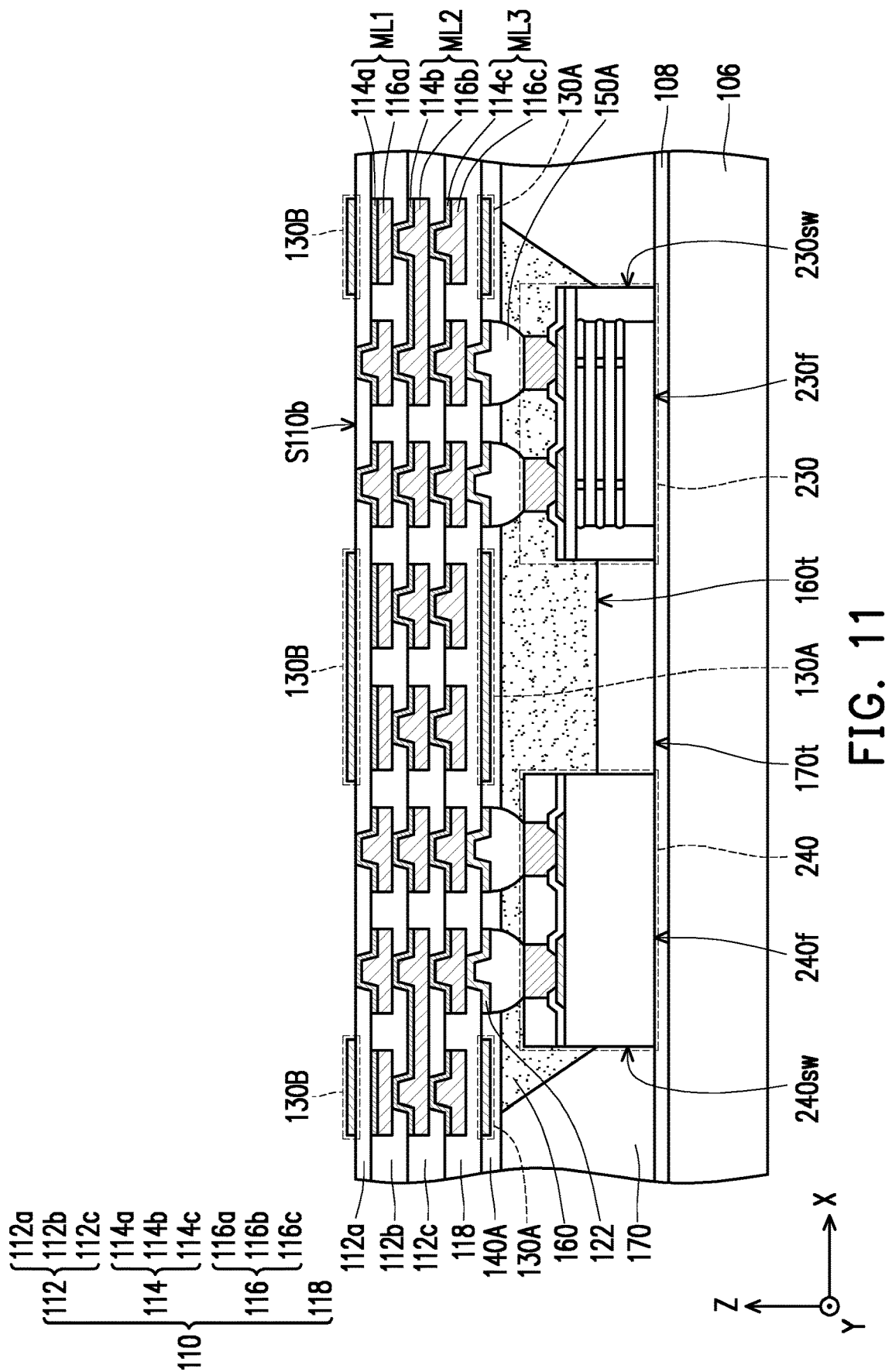

Referring to FIG. 11, in some embodiments, a plurality of supporting structures 130B are formed on the redistribution circuit structure 110 and over the semiconductor dies 230, 240. In some embodiments, the supporting structures 130B are located on an outermost surface S110b of the redistribution circuit structure 110, where the outermost surfaces S110b is opposite to the outermost surfaces S110t along the direction Z. In some embodiments, the supporting structures 130B are in contact with the dielectric layer 112a of the redistribution circuit structure 110 and are away from exposed portions of the seed layer 114a. In other words, for example, the supporting structures 130B are electrically isolated from the redistribution circuit structure 110.

In some embodiments, the supporting structures 130A and the supporting structures 130B are located at different sides (e.g., the outermost surfaces S110t, S110b) of the redistribution circuit structure 110 along the direction Z. That is, the redistribution circuit structure 110 is sandwiched between the supporting structures 130A and the supporting structures 130B in the direction Z. For example, as shown in FIG. 11, in the vertical cross-section, the supporting structures 130B each partially overlaps with a part of at least one of the supporting structures 130A located underlying thereto. However, the disclosure is not limited thereto; alternatively, the supporting structures 130B are not overlapped with the supporting structures 130A located underlying thereto.

As shown in FIG. 11, for example, the supporting structures 130B are spacing away from each other. In one embodiment, the supporting structures 130B are electrically isolated from each other, in part or all. In one alternative embodiment, the supporting structures 130B are electrically connected to each other. The formation, material and configuration of the supporting structures 130B are similar to or the same as the to the process, material and configuration of forming the supporting structures 130A as previously described in FIG. 3 and FIG. 16A through FIG. 16I, and thus are not repeated herein for brevity. That is, in the disclosures, the supporting structures 130B each also has a (mechanical) hardness greater than or substantially equal to the (mechanical) hardness of the UBM patterns 122 and the (mechanical) hardness of the metallization layer ML1 through ML3. In some embodiments, the supporting structures 130B are referred to as reinforced structure of the semiconductor package P1a depicted in FIG. 15. Owing to the supporting structures 130B, the reliability of the semiconductor package P1a is enhanced.

One or more supporting structures 130A and/or 130B are overlapped with parts of the semiconductor dies 230 and/or 240 in a vertical projection on the redistribution circuit structure 110 along the stacking direction (direction Z) of the redistribution circuit structure 110 and the supporting structures 130A or 130B, for example. In the embodiments, parts of the edges of the semiconductor dies 230 and/or 240 are overlapped with the supporting structure 130A or 130B. In other words, at least one portion of the supporting structures 130A or 130B is below the semiconductor die 230 or 240, while other portion of the supporting structure 130A or 130B protrudes out the semiconductor die 230 or 240. With such configuration, the impact of mechanical/thermal stress generated can be more suppressed by the reinforced supporting structures 130A and 130B, thereby preventing cracking in the redistribution circuit structure 110. The patterns and positions of the supporting structures 130A and 130B are not limited thereto, and can be adjusted according to the semiconductor package (structure).

Figure 32:
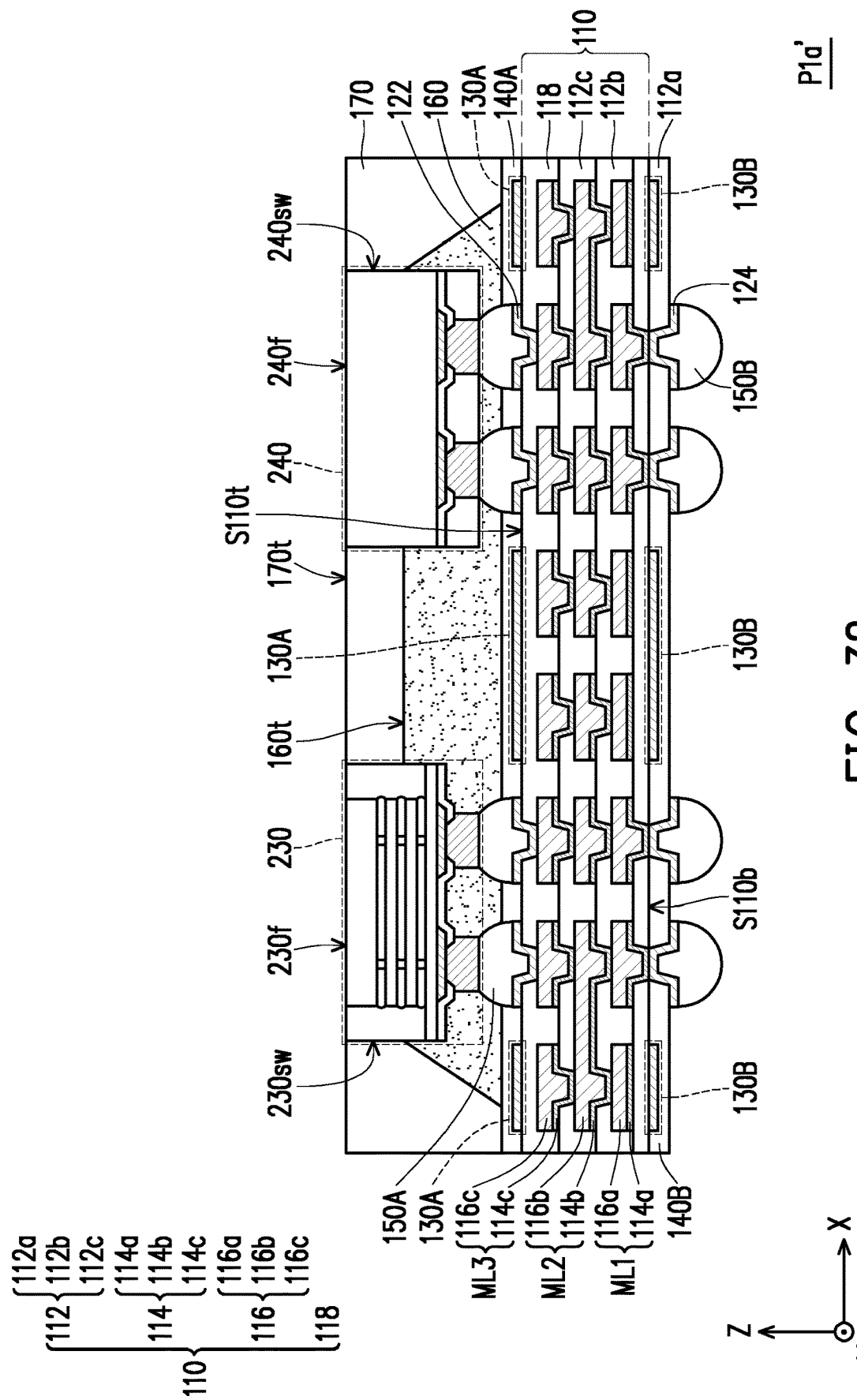
FIG. 32 is a schematic cross-sectional view of a semiconductor package in accordance with some embodiments of the disclosure.
Figure 33:
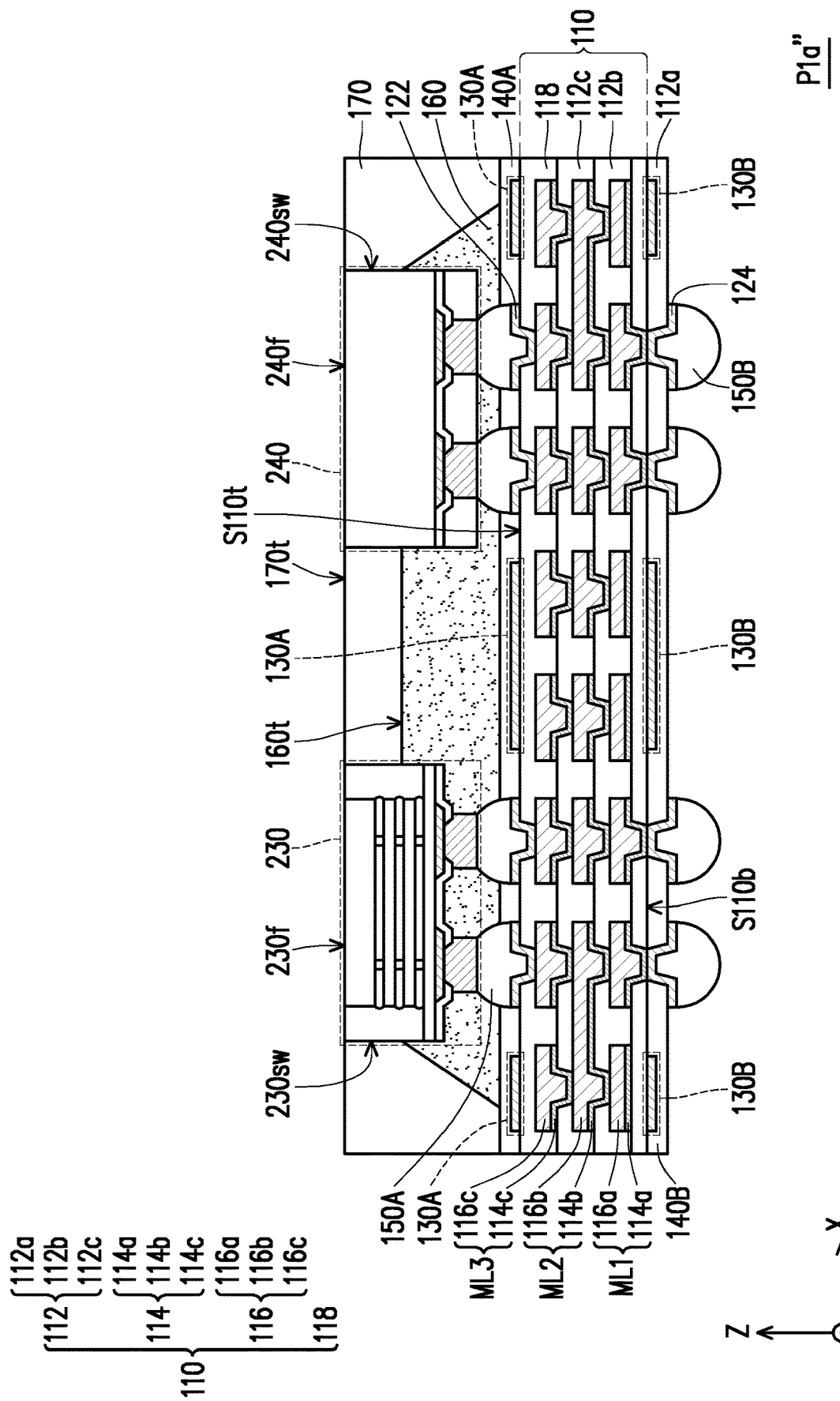
FIG. 33 is a schematic cross-sectional view of a semiconductor package in accordance with some embodiments of the disclosure.

Alternatively, the edge of the supporting structures 130A or 130B may be level or aligned to the edge of the semiconductor die 230 or 240 horizontally or vertically. For example, as shown in a cross-section of a semiconductor package P1a' depicted in FIG. 32, edges of the supporting structures 130A and/or at least one of the edges of the supporting structures 130B are substantially aligned with edges of the semiconductor die 230 or 240 overlying thereto. Further alternatively, the edge of the supporting structures 130A or 130B may be offset from edge of the semiconductor die 230 or 240 horizontally or vertically. For example, as shown in a cross-section of a semiconductor package P1a' depicted in FIG. 33, edges of the supporting structures 130A and/or at least one of the edges of the supporting structures 130B are offset from the edges of the semiconductor die 230 or 240 overlying thereto, where the supporting structures 130A and the supporting structures 130B are not overlapped with the semiconductor die 230 or 240.

Figure 12:
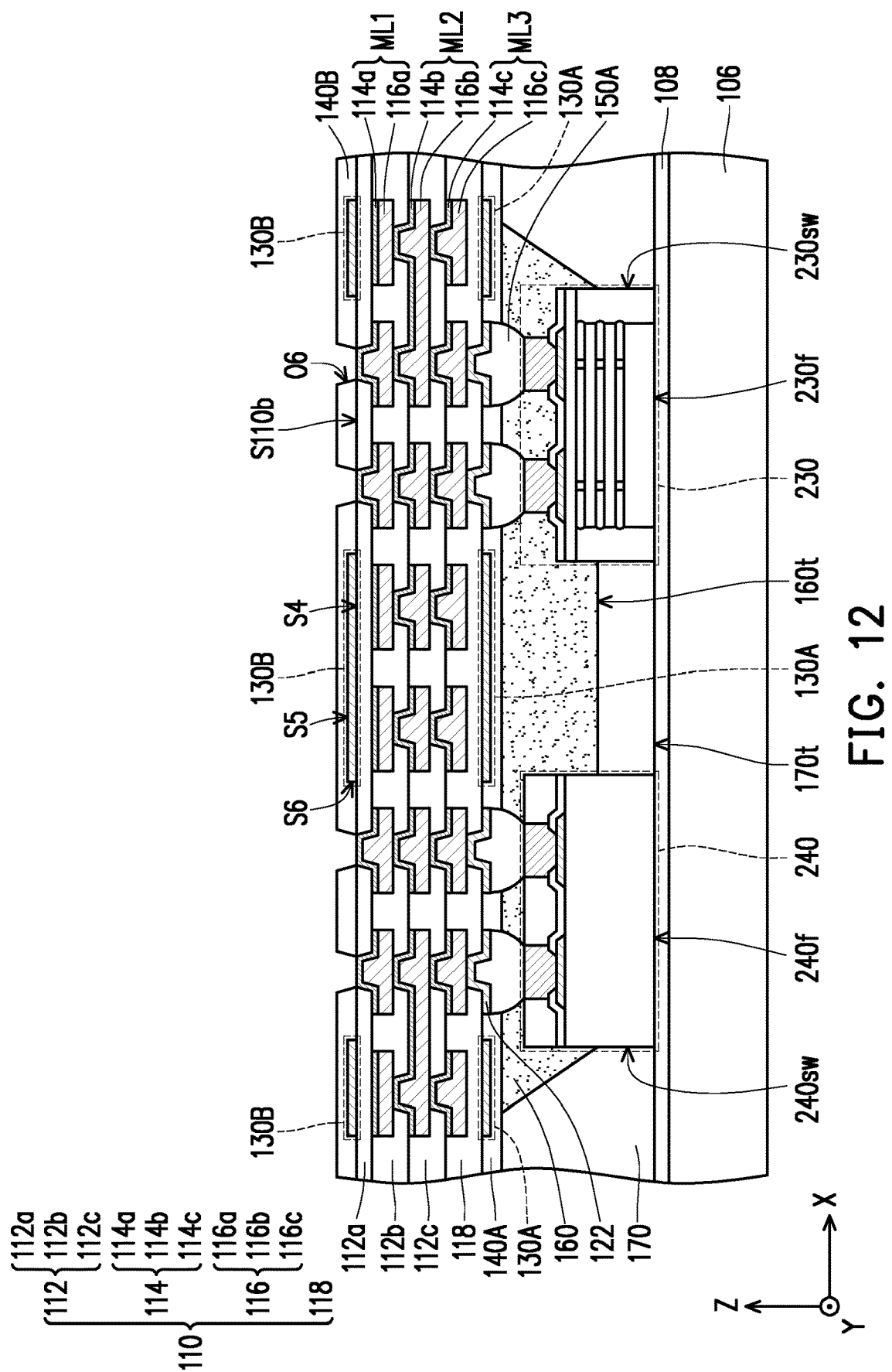

Referring to FIG. 12, in some embodiments, a passivation layer 140B is formed on the supporting structure 130B and over the redistribution circuit structure 110. For example, the supporting structures 130B are sandwiched between the passivation layer 140B and the redistribution circuit structure 110. In some embodiments, the passivation layer 140B completely covers the supporting structures 130B, and the supporting structures 130B are enclosed by the redistribution circuit structure 110 (e.g. the dielectric layer 112a) and the passivation layer 140B. For example, a surface S4 of each of the supporting structures 130B is in contact with the dielectric layer 112a, and a surface S5 and a sidewall S6 of each of the supporting structures 130B are in contact with the passivation layer 140B. The sidewall S6 connects the surface S4 and the surface S5. On the other hand, the passivation layer 140B accessibly reveals at least a part of the exposed portions of the seed layer 114a through a plurality of openings O6 formed in the passivation layer 140B for electrically connecting to the later-formed connectors. In one embodiment, the exposed portions of the seed layer 114a are partially and accessibly exposed by the openings O6 formed in the passivation layer 140B. However, the disclosure is not limited thereto; alternatively, the exposed portions of the seed layer 114a each may be completely and accessibly exposed by the openings O6 formed in the passivation layer 140B.

The formation, material and configuration of the passivation layer 140B are similar to or the same as the to the process, material and configuration of forming the passivation layer 140A as previously described in FIG. 4, and thus are not repeated herein for brevity. In the disclosures, the passivation layer 140B has a (mechanical) hardness greater than or substantially equal to a (mechanical) hardness of the dielectric layers (112 and 118) included in the redistribution circuit structure 110. In some embodiments, the passivation layer 140B is referred to as a protective layer of the supporting structures 130B for providing protection thereto.

Figure 13:
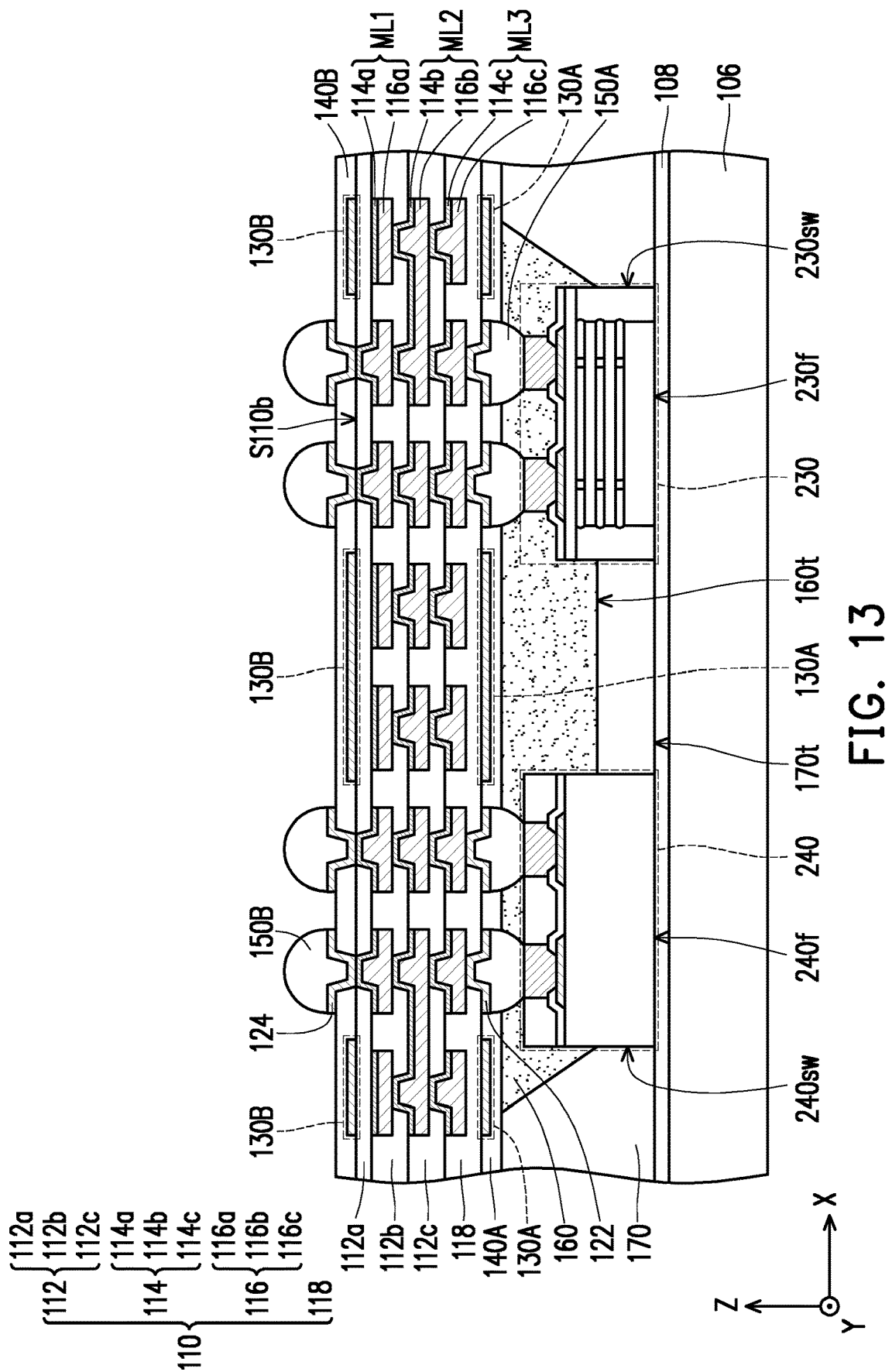

Referring to FIG. 13, in some embodiments, a plurality of UBM patterns 124 are formed on the passivation layer 140B and extend into the openings O6 formed in the passivation layer 140B to physically contact the seed layer 114a exposed by the openings O6 for electrically connecting the redistribution circuit structure 110. In the disclosure, the UBM patterns 124 facilitate electrical connections between the redistribution circuit structure 110 and later-formed conductive elements (e.g., connectors such as conductive balls or conductive bumps; semiconductor components such as semiconductor passive elements; or the like). However, the disclosure is not limited thereto; alternatively, the UBM patterns 124 may be omitted based on the design layout and demand. The formation, material and configuration of the UBM patterns 124 are similar to or the same as the to the process, material and configuration of forming the UBM patterns 122 as previously described in FIG. 3, and thus are not repeated herein for brevity. As shown in FIG. 13, the supporting structures 130B and the UBM patterns 124 are arranged side-by-side on the redistribution circuit structure 110 (e.g. on the X-Y plane), where the supporting structures 130B are distant from and electrically isolated from the UBM patterns 124, for example.

Thereafter, continued on FIG. 13, in some embodiments, a plurality of conductive terminals 150B are formed on the UBM patterns 124 and over the redistribution circuit structure 110. In some embodiments, the conductive terminals 150B are electrically coupled to the redistribution circuit structure 110 through the UBM patterns 124, where the conductive terminals 150B are electrically isolated from the supporting structures 130B. Due to the UBM patterns 124, the adhesive strength between the conductive terminals 150B and the redistribution circuit structure 110 is enhanced.

In one embodiment, the conductive terminals 150B are referred to as conductive connectors for connecting with another package or a circuit substrate (e.g. organic substrate such as PCB). In an alternative embodiment, the conductive terminals 150B are referred to as conductive terminals for inputting/outputting electric and/or power signals. In a further alternative embodiment, the conductive terminals 150B are referred to as conductive terminals for connecting with one or more than one semiconductor dies independently including active devices (e.g., transistors, diodes, etc.) and/or passive devices (e.g., capacitors, resistors, inductors, etc.), other components such as one or more than one integrated passive device (IPDs), or combinations thereof. The disclosure is not limited thereto. The formation, material and configuration of the conductive terminals 150B are similar to or the same as the to the process, material and configuration of forming the conductive terminals 150A as previously described in FIG. 5, and thus are not repeated herein for brevity. Additionally, the semiconductor dies 230, 240 are arranged in an array, the conductive terminals 150B may be divided into groups corresponding to the number of the semiconductor dies 230, 240.

In some embodiments, some of the conductive terminals 150B are electrically connected to the semiconductor die 230 through some of the UBM patterns 124, the redistribution circuit structure 110, some of the UBM patterns 122, and some of the conductive terminals 150A. In some embodiments, some of the conductive terminals 150B are electrically connected to the semiconductor die 240 through some of the UBM patterns 124, the redistribution circuit structure 110, some of the UBM patterns 122, and some of the conductive terminals 150A. In certain embodiments, some of the conductive terminals 150B may be electrically floated or grounded, the disclosure is not limited thereto.

Figure 14:
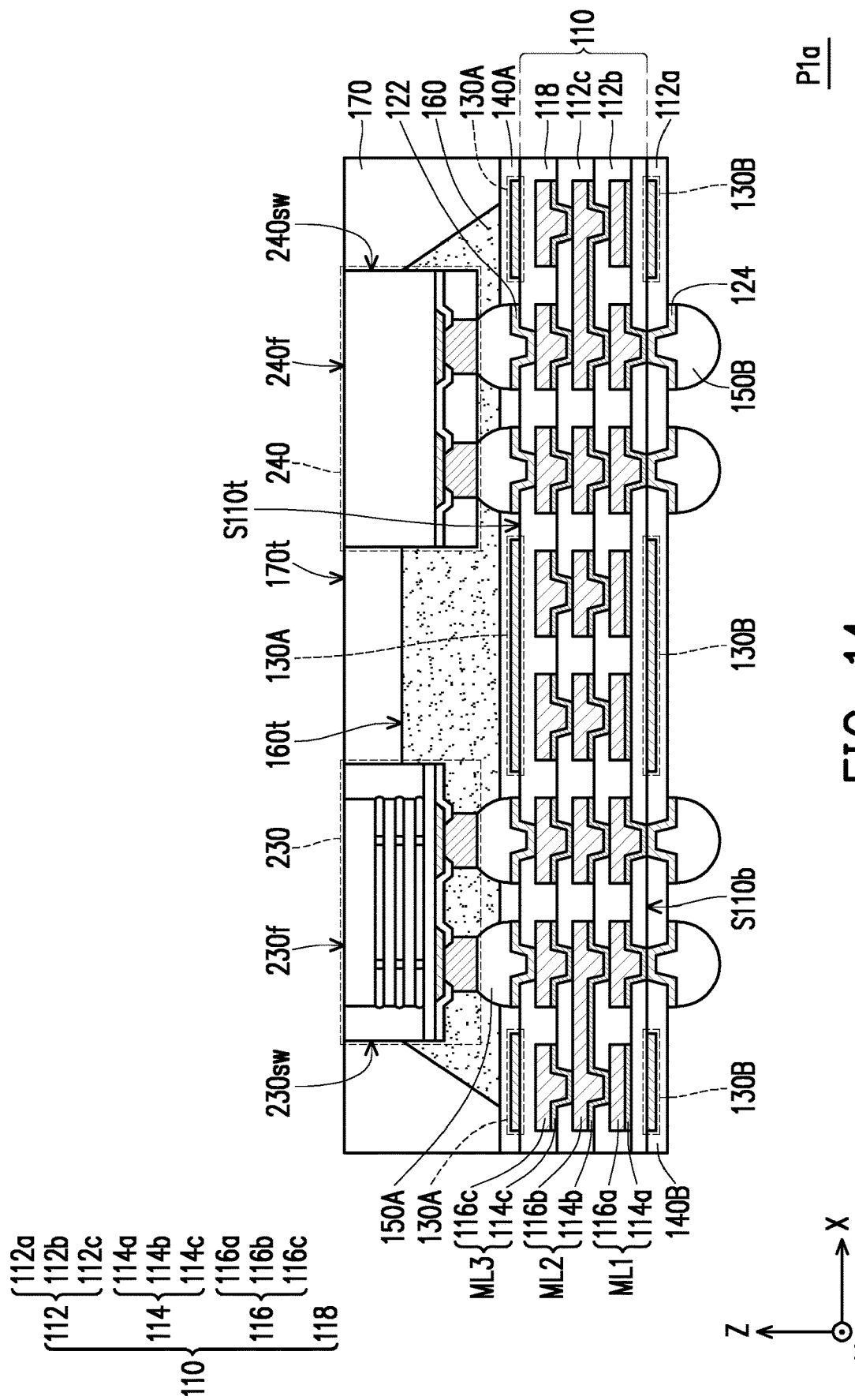
Figure 15:
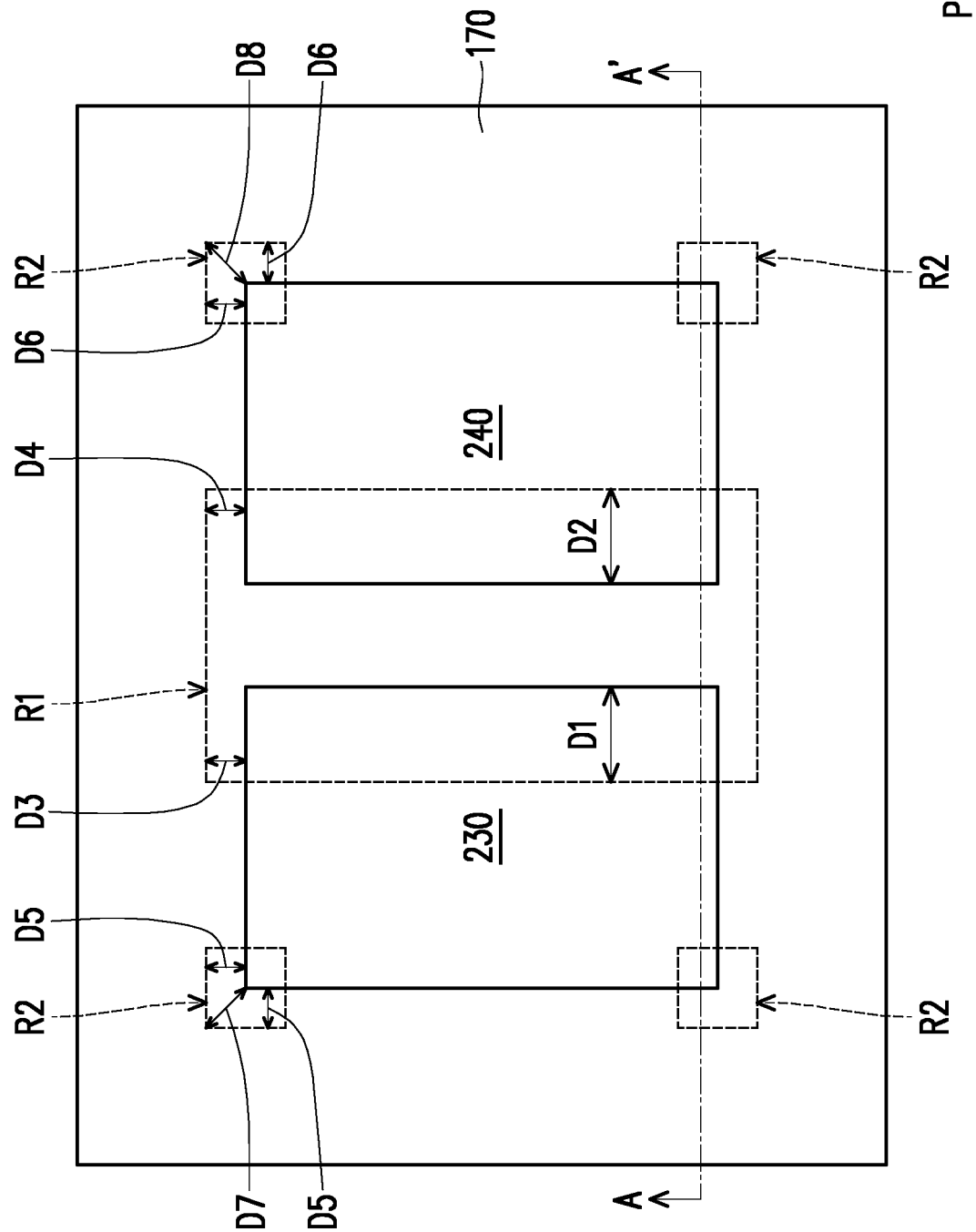
FIG. 15 is a schematic top view illustrating a relative position between semiconductor components of a semiconductor package in accordance with some embodiments of the disclosure.

Referring to FIG. 14, in some embodiments, the whole structure depicted in FIG. 13 is flipped (turned upside down), and the carrier 106 is then debonded from the structure to form the semiconductor package P1a. In some embodiments, the carrier 106 is detached from the semiconductor dies 230, 240 and the insulating encapsulation 170 through a debonding process, where the carrier 106 the debond layer 108 are removed, and the semiconductor dies 230, 240 and the insulating encapsulation 170 are exposed. In one embodiment, the debonding process is a laser debonding process. During the debonding step, a holding device (not shown) is adopted to hold the conductive terminals 150B for securing the semiconductor package P1a before debonding the carrier 106. The holding device may be an adhesive tape, an adhesive carrier or a suction pad.

In some embodiments, the conductive terminals 150B are released from the holding device to form the semiconductor package P1a. In some embodiments, prior to releasing the conductive terminals 150B from the holding device, a dicing process is performed to cut the semiconductor packages P1a connected to each other into individual and separated semiconductor packages P1a. In one embodiment, the dicing process is a wafer dicing process including mechanical blade sawing or laser cutting. Up to here, the manufacture of the semiconductor package P1a is completed. In some embodiments, the semiconductor package P1a is referred to as an integrated fan-out (InFO) package. The semiconductor package P1a may be further mounted with a circuit substrate, an interposer, an additional package, chips/dies or other electronic devices to form a stacked package structure such as a flip-chip package or a chip-on-wafer-on-substrate (CoWoS) package or a package-on-package (PoP) structure through the conductive terminals 150B.

Referring to FIG. 14 and FIG. 15, in some embodiments, in the vertical projection on the X-Y plane along the direction Z, for the semiconductor packages P1a, at least one region R1 is identified at a location between two semiconductor dies (e.g. 230 and 240), and regions R2 are respectively identified at locations on corners of the semiconductor dies (e.g. 230, 240) and distant from the region R1. For example, the region R1 is not overlapped with the regions R2 on the X-Y plane. In some embodiments, in the vertical projection on the X-Y plane along the direction Z, the region R1 is overlapped with a part of the semiconductor die 230 and a part of the semiconductor die 240, and the regions R2 each are overlapped with a respective one of the semiconductor dies 230 and 240, as shown in FIG. 15.

In some embodiments, in the vertical projection on the X-Y plane along the direction Z, a distance D1 measured from an edge of the region R1 to an edge of the semiconductor die 230 overlapped therewith is more than 0 micrometer (a.k.a. micron), where the edge of the region R1 is overlapped with the semiconductor die 230. In some embodiments, in the vertical projection, a distance D3 measured from another edge of the region R1 to another edge of the semiconductor die 230 overlapped therewith is more than 0 micrometer, where the another edge of the region R1 is not overlapped with the semiconductor dies 230 and 240.

In some embodiments, in the vertical projection on the X-Y plane along the direction Z, a distance D2 measured from an edge of the region R1 to an edge of the semiconductor die 240 overlapped therewith is more than 0 micrometer, where the edge of the region R1 is overlapped with the semiconductor die 240. In some embodiments, in the vertical projection, a distance D4 measured from another edge of the region R1 to another edge of the semiconductor die 240 overlapped therewith is more than 0 micrometer, where the another edge of the region R1 is not overlapped with the semiconductor dies 230 and 240.

In some embodiments, in the vertical projection on the X-Y plane along the direction Z, a distance D5 measured from one edge of one region R2 to an edge of the semiconductor die 230 overlapped therewith is approximately 300 micrometers or more, where the edge of the region R2 is not overlapped with the edge of the semiconductor die 230. In certain embodiments, in the vertical projection, the edges of the region R2, which are not overlapped with (intersected with) the edges of the semiconductor die 230, are overlapped with the insulating encapsulation 170. In some embodiments, in the vertical projection, a distance D7 measured from one corner of the region R2 to a corner of the semiconductor die 230 overlapped therewith is approximately 424.3 micrometers or more, where the corner of the region R2 is confined by the edges of the region R2 that are not overlapped with (intersected with) the edges of the semiconductor die 230.

In some embodiments, in the vertical projection on the X-Y plane along the direction Z, a distance D6 measured from one edge of one region R2 to an edge of the semiconductor die 240 overlapped therewith is approximately 300 micrometers or more, where the edge of the region R2 is not overlapped with the edge of the semiconductor die 240. In certain embodiments, in the vertical projection, the edges of the region R2, which are not overlapped with (intersected with) the edges of the semiconductor die 240, are overlapped with the insulating encapsulation 170. In some embodiments, in the vertical projection, a distance D8 measured from one corner of the region R2 to a corner of the semiconductor die 240 overlapped therewith is approximately 424.3 micrometers or more, where the corner of the region R2 is confined by the edges of the region R2 that are not overlapped with (intersected with) the edges of the semiconductor die 240.

In the embodiments, one or more supporting structures 130A or 130B correspond to the corners of the semiconductor dies 230 and 240. With such configuration, the impact of mechanical/thermal stress generated can be more suppressed by the reinforced supporting structures 130A and 130B, thereby preventing cracking in the redistribution circuit structure 110.

In some embodiment, in the vertical projection on the X-Y plane along the direction Z, at least 70% of the region R1 is occupied by the supporting structures 130A, and at least 70% of the region R2 is occupied by the supporting structures 130B. With such configuration, the impact of mechanical/thermal stress generated in the semiconductor package P1a can be suppressed by the additional reinforced structures (e.g. the supporting structures 130A and the supporting structures 130B) and protective layers thereof (e.g. the passivation layer 140A and the passivation layer 140B), thereby preventing cracking (e.g. the redistribution circuit structure 110); the reliability in the electrical performance of the semiconductor package P1a is improved.

However, the disclosure is not limited thereto. In an alternative embodiment (not shown), the supporting structures 130B may be omitted. In such alternative embodiment, in the vertical projection on the X-Y plane along the direction Z, the region R1 and the regions R2 each have a total area with 70% or more thereof being occupied by the supporting structures 130A alone. In a further alternative embodiment (not shown), the supporting structures 130A may be omitted. In such further alternative embodiment, in the vertical projection on the X-Y plane along the direction Z, the region R1 and the regions R2 each have a total area with 70% or more thereof being occupied by the supporting structures 130B alone.

Figure 17:
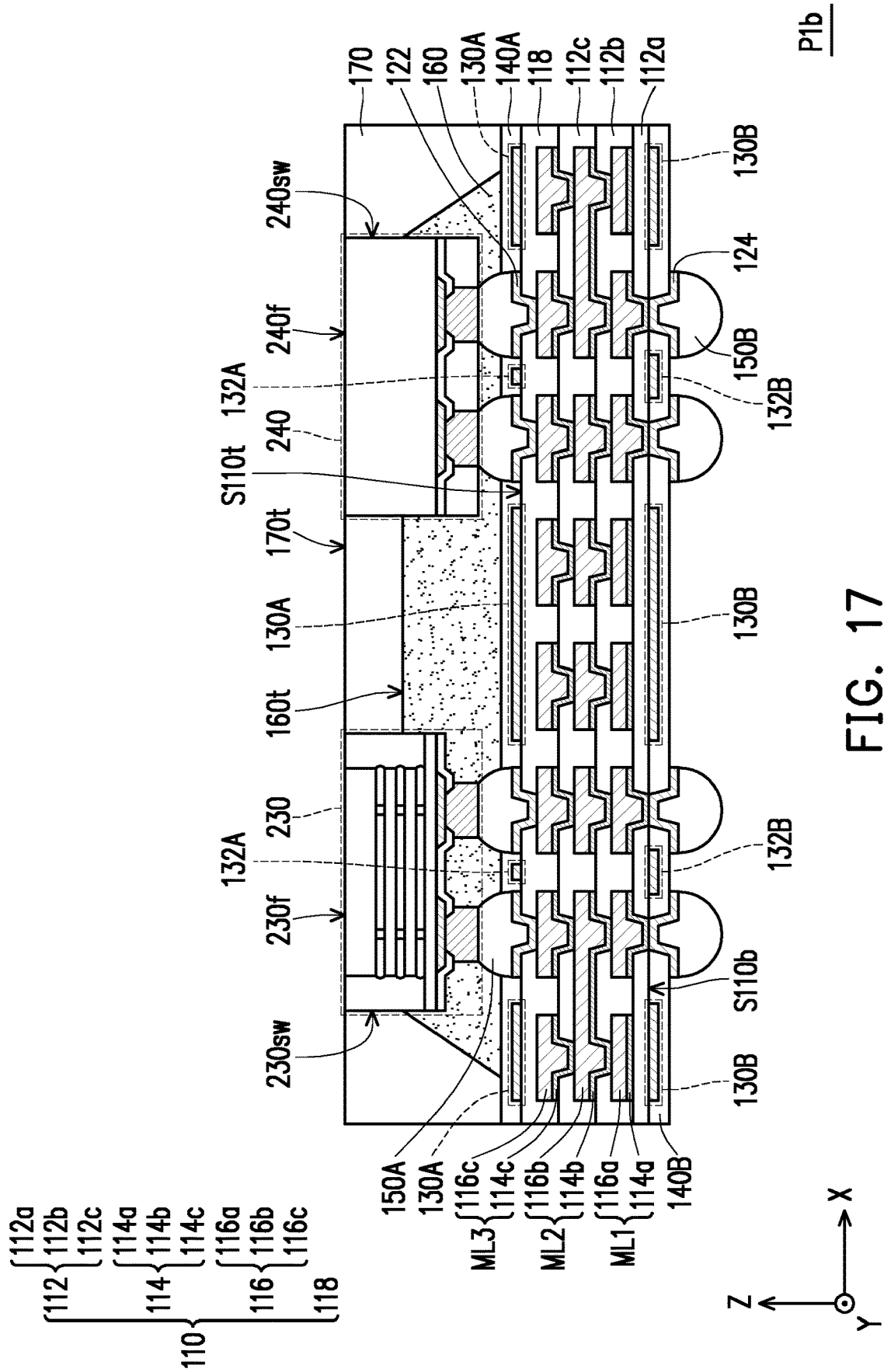
FIG. 17 is a schematic cross-sectional view of a semiconductor package in accordance with some embodiments of the disclosure.
Figure 18:
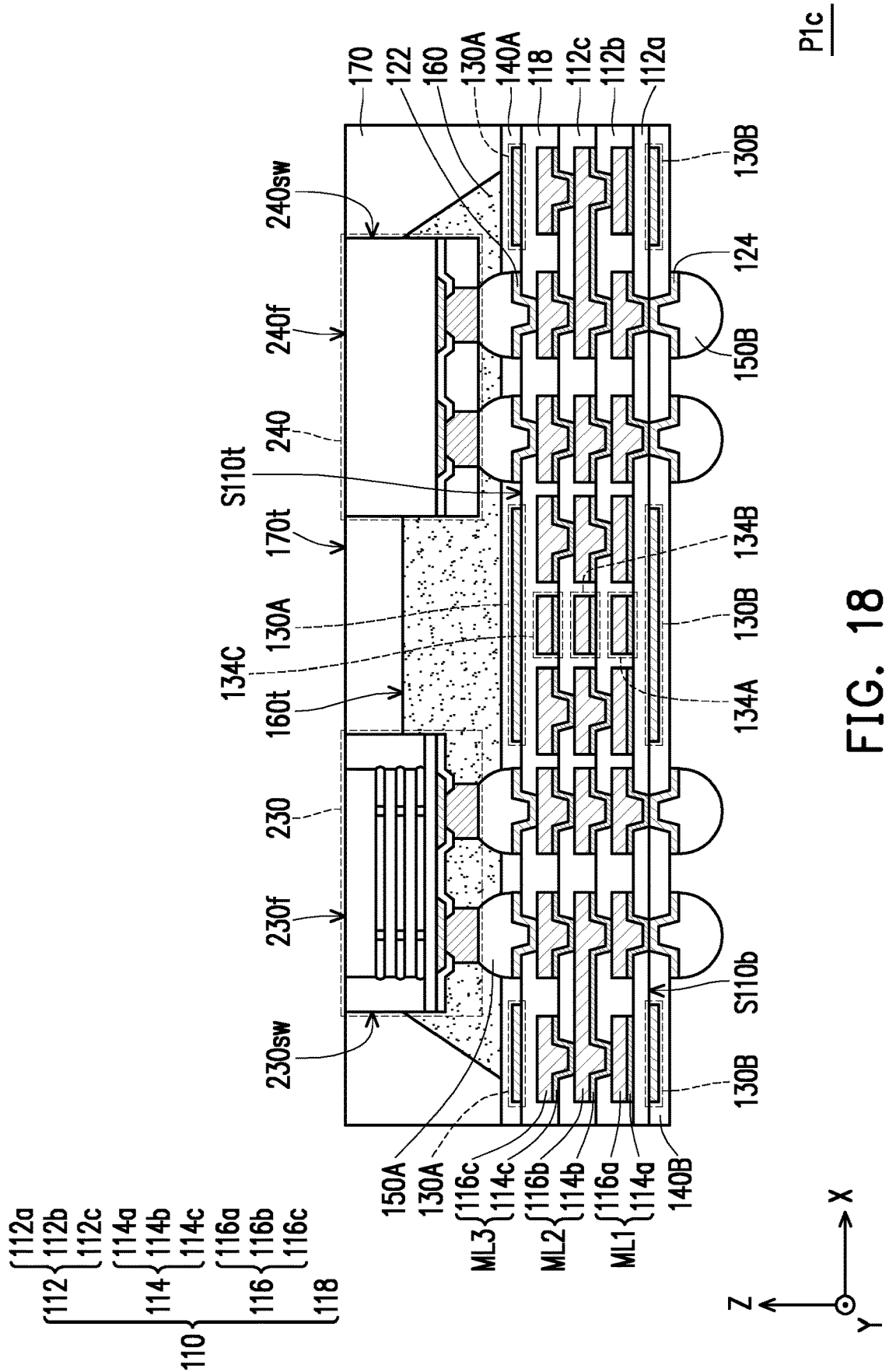
FIG. 18 is a schematic cross-sectional view of a semiconductor package in accordance with some embodiments of the disclosure.
Figure 19:
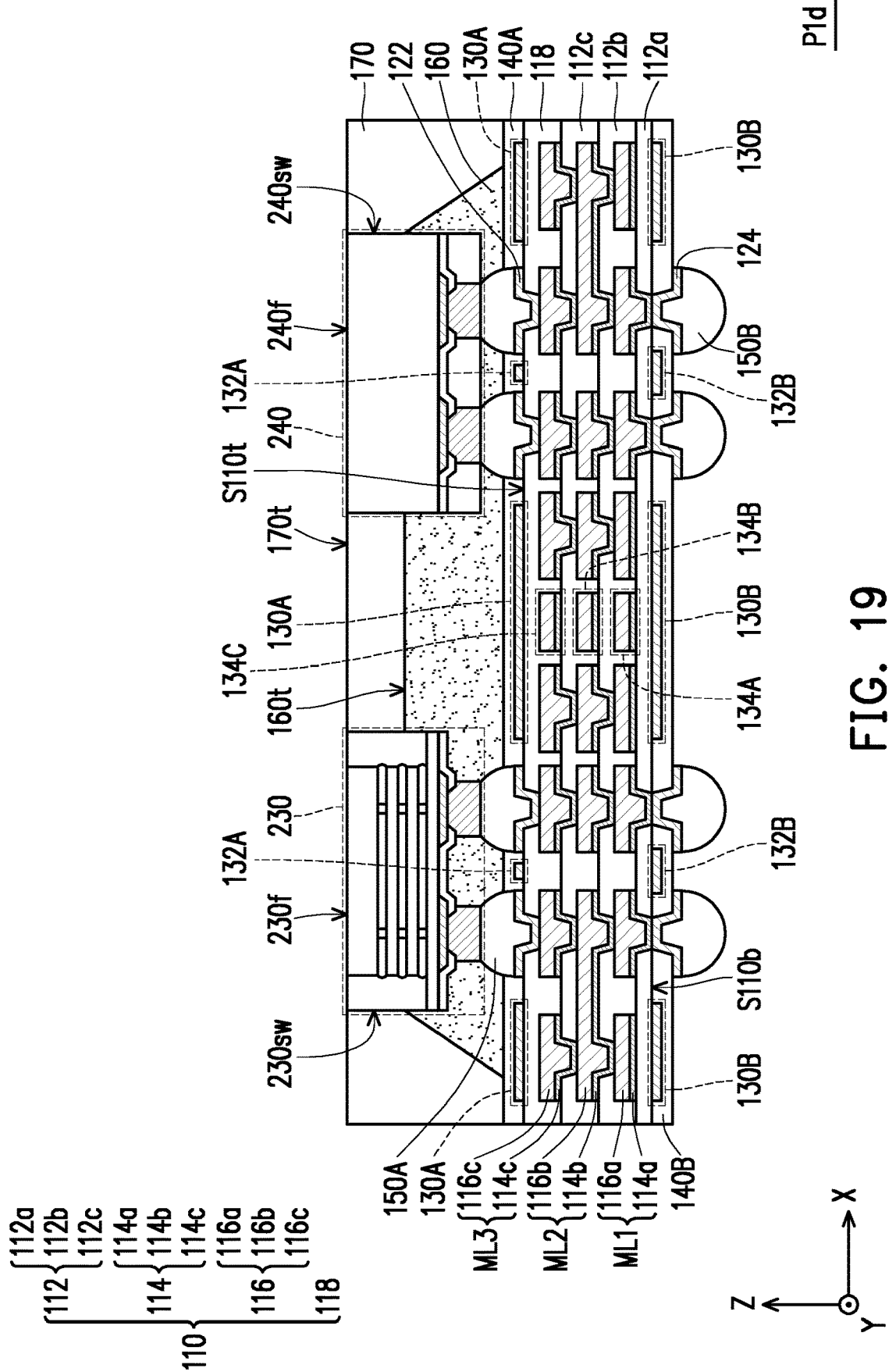
FIG. 19 is a schematic cross-sectional view of a semiconductor package in accordance with some embodiments of the disclosure.

However, the disclosure is not limited thereto. FIG. 17 through FIG. 19 are schematic cross-sectional views respectively showing a semiconductor package in accordance with some embodiments of the disclosure. The elements similar to or substantially the same as the elements described previously will use the same reference numbers, and certain details or descriptions (e.g. the materials, formation processes, positioning configurations, etc.) of the same elements would not be repeated herein.

In alternative embodiments, an additional supporting structure may be included to be located at a side (e.g., S110*b* and/or S110*t*) of the redistribution circuit structure 110. A semiconductor package P1*b* depicted in FIG. 17 is similar to the semiconductor package P1*a* depicted in FIG. 14 and FIG. 15, the difference is that, the semiconductor package P1*b* further includes a plurality of supporting structures 132A on the outermost surface S110*t* of the redistribution circuit structure 110 and a plurality of supporting structures 132B on the outermost surface S110*b* of the redistribution circuit structure 110. In some embodiments, the supporting structures 132A are formed in the process of forming the supporting structures 130A, where the formation and material of the supporting structures 132A are the same as the formation and materials of the supporting structures 130A as described in FIG. 3, and thus are not repeated herein for simplicity. Similarly, for example, the supporting structures 132B are formed in the process of forming the supporting structures 130B, where the formation and material of the supporting structures 132B are the same as the formation and materials of the supporting structures 130B as described in FIG. 1, and thus are not repeated herein.

In some embodiments, in the vertical projection on the X-Y plane along the direction Z, the supporting structures 132A and 132B are located outside the regions R1 and R2 depicted in FIG. 15. In some embodiments, the supporting structures 132A and 132B are electrically isolated to each other, for example as shown in FIG. 17. In some alternative embodiments, the supporting structures 132A and 132B, individually, are electrically connected to each other, in part or all. In some embodiments, the supporting structures 132A and 132B are electrically isolated from the redistribution circuit structure 110 and the supporting structures 130A, 130B. In the disclosure, the supporting structures 132A and 132B each have a (mechanical) hardness greater than or substantially equal to a (mechanical) hardness of the UBM patterns 122, 124 and greater than or substantially equal to a (mechanical) hardness of the metallization layers ML1 through ML3. In some embodiments, the supporting structures 132A and 132B independently are referred to as additional enforced structures of the semiconductor package P1*b*. Owing to the supporting structures 132A and 132B, the reliability of the semiconductor package P1*b* is further enhanced.

However, the disclosure is not limited thereto. In certain embodiments, the supporting structures 132A are omitted. Alternatively, the supporting structures 132B are omitted. For example, the additional supporting structure included outside the redistribution circuit structure 110 can be either the supporting structures 132A, the supporting structures 132B, or the supporting structures 132A through 132B.

In further alternative embodiments, an additional supporting structure may be included to be located in the redistribution circuit structure 110. A semiconductor package P1*c* depicted in FIG. 18 is similar to the semiconductor package P1*a* depicted in FIG. 14 and FIG. 15, the difference is that, the semiconductor package P1*c* further includes a plurality of supporting structures 134A, a plurality of supporting structures 134B, and a plurality of supporting structures 134C, where the supporting structures 134A, 134B and 134C are embedded in and electrically isolated from the redistribution circuit structure 110. In some embodiments, the supporting structures 134A are formed in the process of forming the metallization layer ML1, the supporting structures 134B are formed in the process of forming the metallization layer ML2, the supporting structures 134C are formed in the process of forming the metallization layer ML3, where the formation and material of each of the supporting structures 134A, 134B and 134C are the same as the formation and material of each of the metallization layers ML1, ML2 and ML3 as described in FIG. 1 through FIG. 3, and thus are not repeated herein for simplicity.

In the vertical projection on the X-Y plane along the direction Z, the supporting structures 134A, 134B and 134C may be located inside the regions R1 and R2, outside the regions R1 and R2, or a combination thereof. In some embodiments, the supporting structures 134A, 134B and 134C are electrically isolated to each other, for example as shown in FIG. 18. In some alternative embodiments, the supporting structures 134A, 134B and 134C are electrically connected to each other, in part or all. In some embodiments, the supporting structures 134A through 134C are electrically isolated from the redistribution circuit structure 110, the supporting structures 130A-130B, and the supporting structures 132A-132B. In the disclosure, the supporting structures 134A, 134B and 134C each have a (mechanical) hardness greater than or substantially equal to a (mechanical) hardness of the UBM patterns 122, 124 and greater than or substantially equal to a (mechanical) hardness of the metallization layers ML1 through ML3. In some embodiments, the supporting structures 134A, 134B and 134C independently are referred to as additional enforced structures of the semiconductor package P1*c*. Owing to the supporting structures 134A, 134B and 134C, the mechanical/thermal stress can be spread over the additional reinforced structures (e.g. the supporting structures 134A, 134B and 134C), thereby preventing cracks in the metallization layers ML1-ML3; the reliability in the electrical performance of the semiconductor package P1*c* is further improved. The reliability of the semiconductor package P1*c* is further enhanced.

However, the disclosure is not limited thereto. Alternatively, at least one of the supporting structures 134A, the supporting structures 134B and the supporting structures 134C may be omitted. For example, the additional supporting structure included in the redistribution circuit structure 110 can be either the supporting structures 134A, the supporting structures 134B, the supporting structures 134C, the supporting structures 134A and 134B, the supporting structures 134A and 134C, the supporting structures 134B and 134C, or the supporting structures 134A through 134C.

In yet further alternative embodiments, a first additional supporting structure may be included at a side (e.g., S110*b* and/or S110*t*) of the redistribution circuit structure 110, and a second additional supporting structure may be included in the redistribution circuit structure 110. A semiconductor package P1*d* depicted in FIG. 19 is similar to the semiconductor package P1*a* depicted in FIG. 14 and FIG. 15, the difference is that, the semiconductor package P1*d* further includes a plurality of supporting structures 132A on the outermost surface S110t of the redistribution circuit structure 110 and a plurality of supporting structures 132B on the outermost surface S110b of the redistribution circuit structure 110, where the supporting structures 132A and 132B are located outside of and electrically isolated from the redistribution circuit structure 110. In some embodiments, the semiconductor package P1d further includes a plurality of supporting structures 134A, a plurality of supporting structures 134B, and a plurality of supporting structures 134C, where the supporting structures 134A, 134B and 134C are embedded in different layers of and electrically isolated from the redistribution circuit structure 110. The formations, materials and configurations of the supporting structures 132A and 132B are previously described in FIG. 17, the formations, materials and configurations of the supporting structures 134A, 134B and 134C are previously described in FIG. 18, and thus are not repeated herein for brevity. Owing to the supporting structures 132A-132B and the supporting structures 134A-134C, the reliability of the semiconductor package P1d is further enhanced.

However, the disclosure is not limited thereto. Alternatively, at least one of the supporting structures 132A-132B and at least one of the supporting structures 134A-134C may be omitted. For example, the first additional supporting structure located outside the redistribution circuit structure 110 can be either the supporting structures 132A, the supporting structures 132B, or the supporting structures 132A through 132B; and the second additional supporting structure located inside the redistribution circuit structure 110 can be either the supporting structures 134A, the supporting structures 134B, the supporting structures 134C, the supporting structures 134A and 134B, the supporting structures 134A and 134C, the supporting structures 134B and 134C, or the supporting structures 134A through 134C.

In the above embodiments, due to the electrical isolation between the supporting structures (e.g., 130A and 130B; 132A and 132B; and 134A, 134B and 134C) and the redistribution circuit structure 110, the supporting structures (e.g., 130A and 130B; 132A and 132B; and 134A, 134B and 134C) are electrically isolated to the semiconductor dies 230 and 240, the patterns of the supporting structures 130A and 130B are more adjustable without considering the electric connections to the other components (e.g. the redistribution circuit structure 110 and/or the semiconductor dies 230, 240 included in semiconductor packages of the disclosure). For one example, the supporting structures (e.g., 130A and 130B; 132A and 132B; and 134A, 134B and 134C) are electrically grounded. For another example, the supporting structures (e.g., 130A and 130B; 132A and 132B; and 134A, 134B and 134C) are electrically floating. Or, alternatively, for one example, the supporting structures (e.g., 130A and 130B; 132A and 132B; and 134A, 134B and 134C) are grouped into several sets that are independently electrically grounded or electrically floating based on the demand or design layout.

However, the disclosure is not limited thereto; an additional supporting structure may be further included to be electrically connected to the redistribution circuit structure 110 and the semiconductor dies 230, 240. FIG. 20 through FIG. 23 are schematic cross-sectional views respectively showing a semiconductor package in accordance with some embodiments of the disclosure. The elements similar to or substantially the same as the elements described previously will use the same reference numbers, and certain details or descriptions (e.g. the materials, formation processes, positioning configurations, etc.) of the same elements would not be repeated herein. In some embodiments, as compared with the semiconductor packages P1a through P1d respectively depicted in FIG. 14, FIG. 17, FIG. 18 and FIG. 19, a supporting structure 136 is further included in semiconductor packages P2a through P2d respectively depicted in FIG. 20 through FIG. 23.

Figure 20:
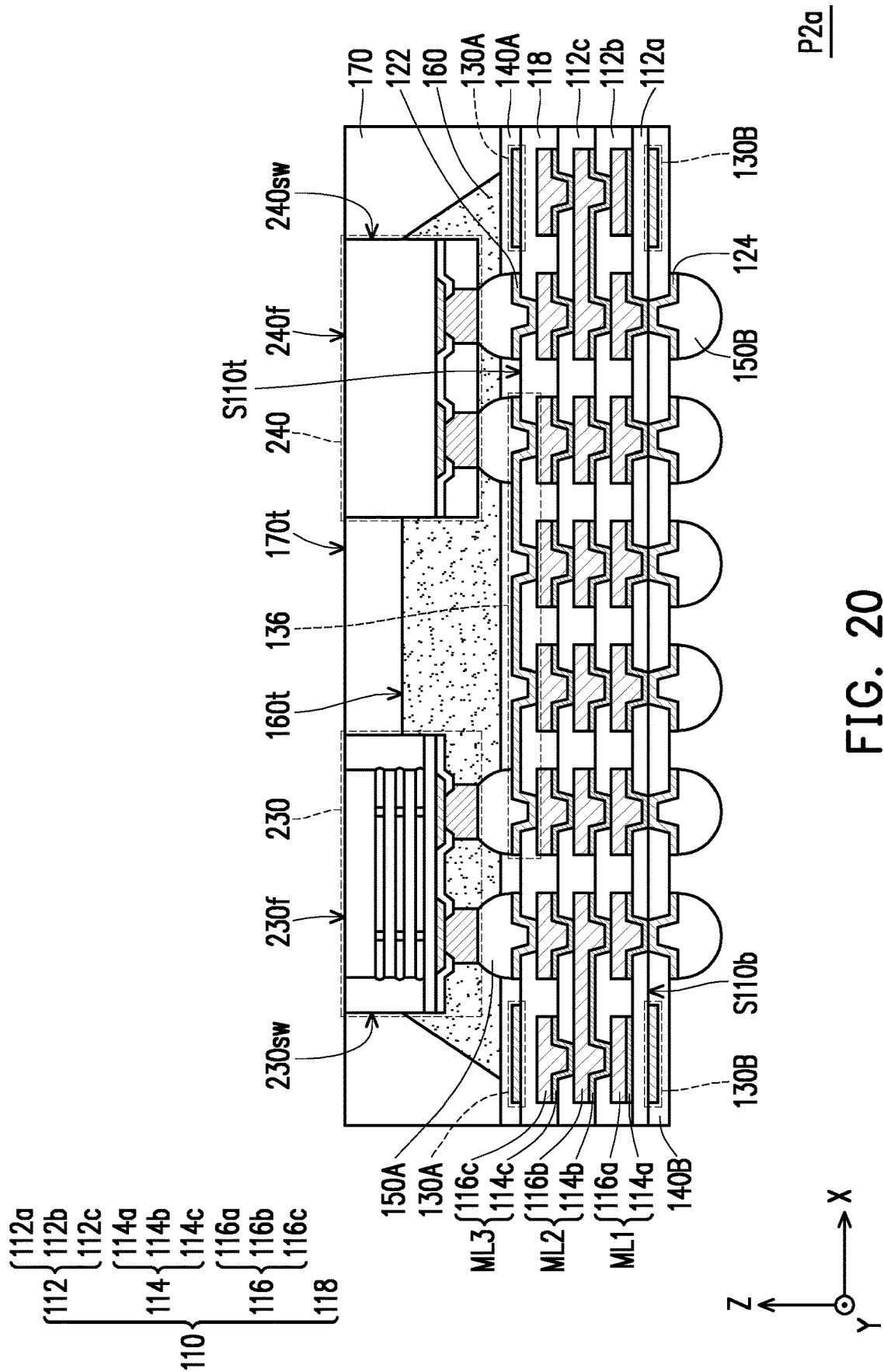
FIG. 20 is a schematic cross-sectional view of a semiconductor package in accordance with some embodiments of the disclosure.

In some embodiments, the semiconductor package P2a depicted in FIG. 20 is similar to the semiconductor package P1a depicted in FIG. 14, the difference is that, in the semiconductor package P2a, in addition to the supporting structures 130A, the supporting structure 136 is further included in the region R1 on the outermost surface S110t of the redistribution circuit structure 110. In the other words, the supporting structure 130A and the supporting structure 136 are both presented on the outermost surface S110t of the redistribution circuit structure 110. In some embodiments, the supporting structure 136 is electrically coupled to the semiconductor dies 230 and 240 through some of the conductive terminals 150A therebetween, where the semiconductor dies 230 and 240 are electrically communicated to each other through the supporting structure 136 and the conductive terminals 150A therebetween. On the other hand, in some embodiments, the supporting structure 136 is electrically connected to the redistribution circuit structure 110 by passing through the openings O4 penetrating through the dielectric layer 118. Alternatively, the supporting structure 136 may be electrically floating or electrically grounded through the redistribution circuit structure 110.

In some embodiments, the supporting structure 136 is formed in the process of forming the supporting structure 130A and/or the process of forming the UBM patterns 122, where the formation, material and configuration of the supporting structure 136 are similar to or the same as the formation, material and configuration of the supporting structures 130A and/or the UBM patterns 122 as described in FIG. 3, and thus are not repeated herein for brevity. For example, the supporting structure 136 is formed on the dielectric layer 118 and extends into the openings O4 formed in the dielectric layer 118 to be in directly physical contact with the surface S116c of the patterned conductive layer 116c exposed by the openings O4, and is partially covered by the passivation layer 140A for being protected from damages. In some embodiments, as shown in FIG. 20, portions of the supporting structure 136 are exposed by the openings O5 formed in the passivation layer 140A for connecting with the conductive terminals 150A, where the semiconductor dies 230 and 240 are electrically connected to the supporting structure 136 through the conductive terminals 150A. Although, only one supporting structure 136 is shown in FIG. 20 for illustrative purposes, however the disclosure is not limited thereto. The number of the supporting structure 136 may be one or more than one depending on the demand or design layout. Similar to the supporting structure 130A, in the disclosure, the supporting structures 136 includes a metallization layer having a (mechanical) hardness greater than or substantially equal to a (mechanical) hardness of the UBM patterns 122 and greater than or substantially equal to a (mechanical) hardness of the metallization layers ML1 through ML3. In the disclosure, the supporting structure 136 may be referred to as a reinforced structure of a semiconductor package P2a. Owing to the reinforced structures (e.g. the supporting structures 130A, 130B and 136) and protective layers thereof (e.g. the passivation layers 140A and 140B), the impact of mechanical/thermal stress generated in the semiconductor package P2a can be suppressed, thereby preventing cracking (e.g. the redistribution circuit structure 110); the reliability in the electrical performance of the semiconductor package P2a is improved.

Figure 21:
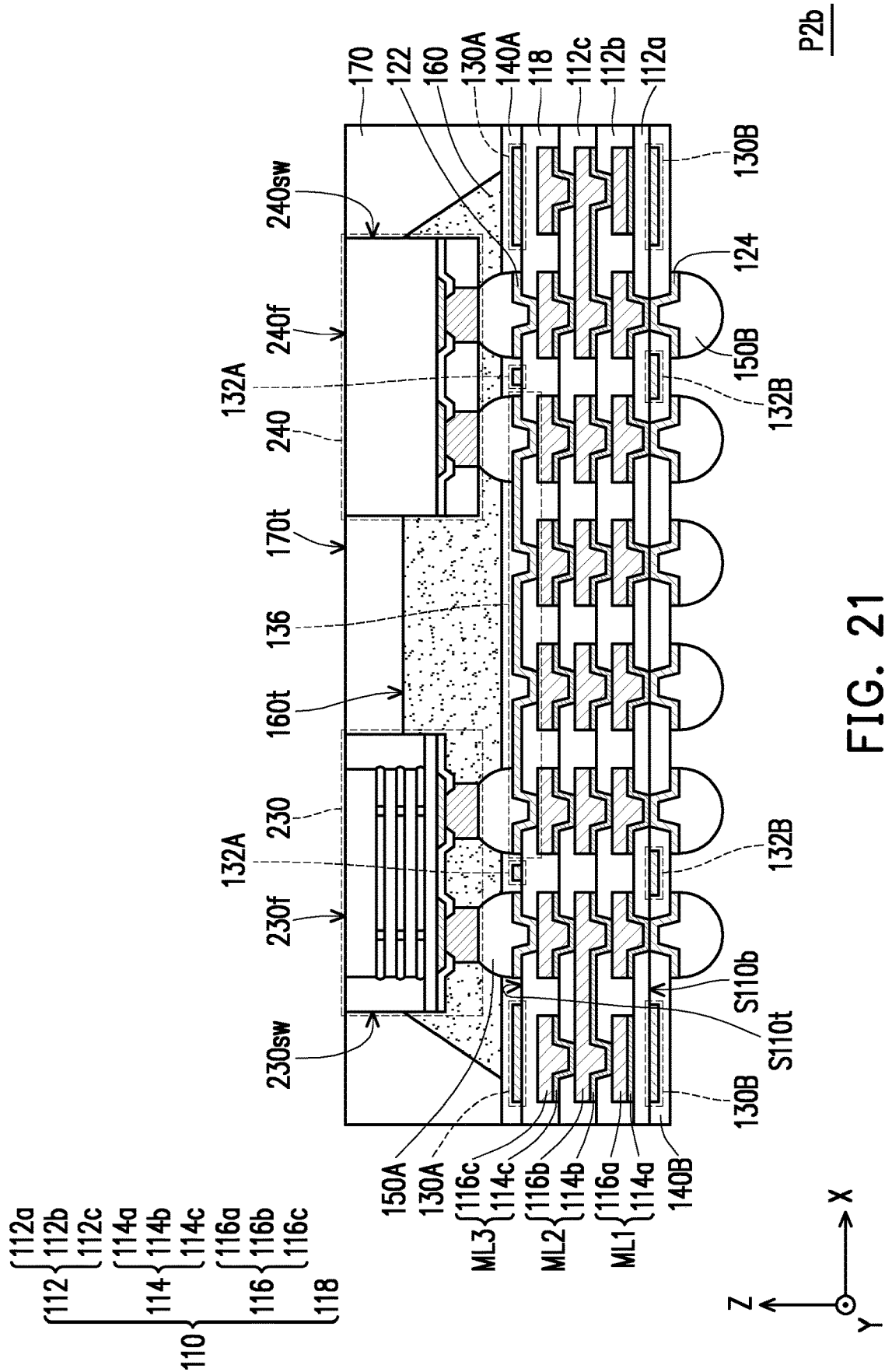
FIG. 21 is a schematic cross-sectional view of a semiconductor package in accordance with some embodiments of the disclosure.
Figure 22:
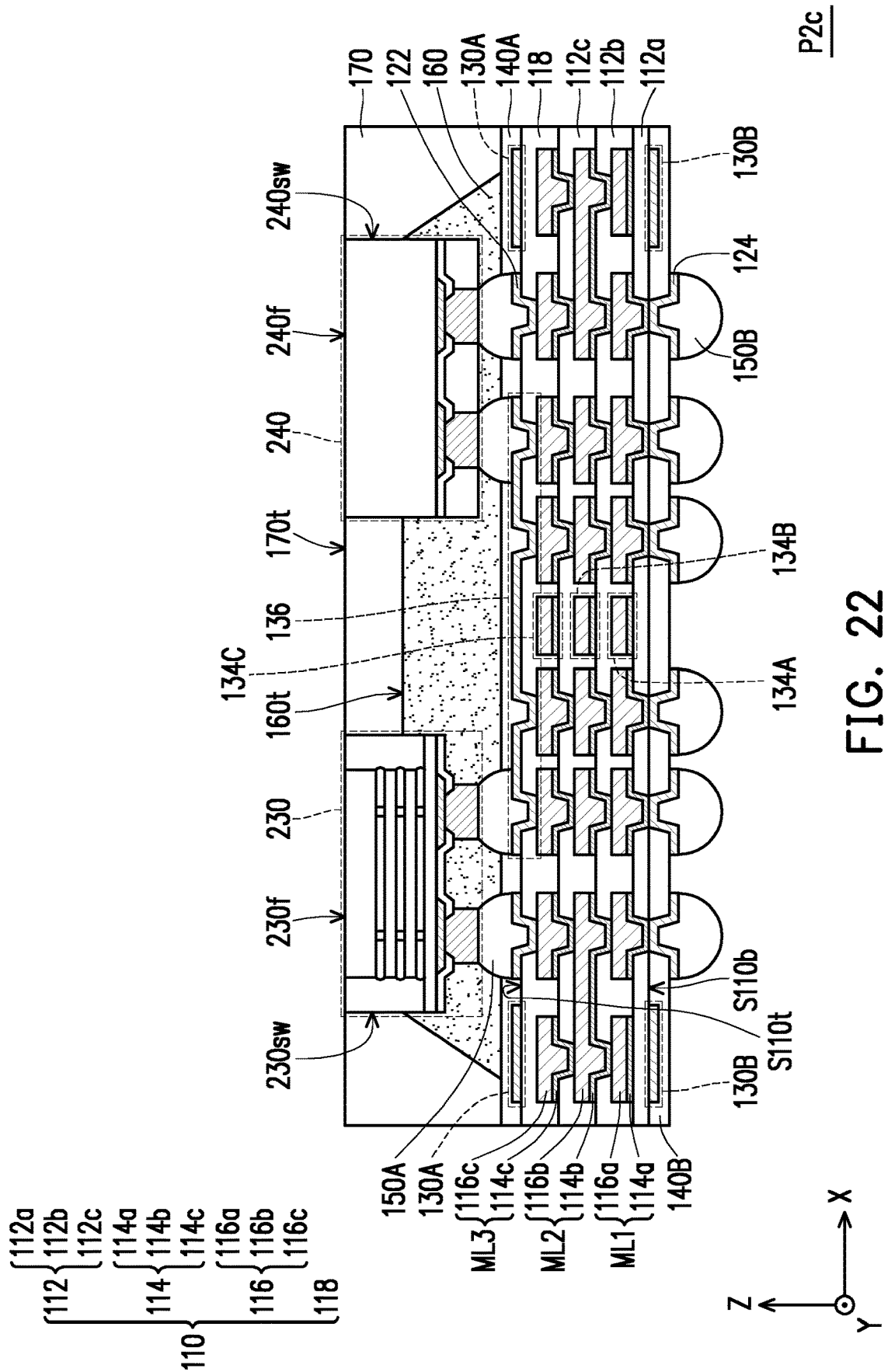
FIG. 22 is a schematic cross-sectional view of a semiconductor package in accordance with some embodiments of the disclosure.
Figure 23:
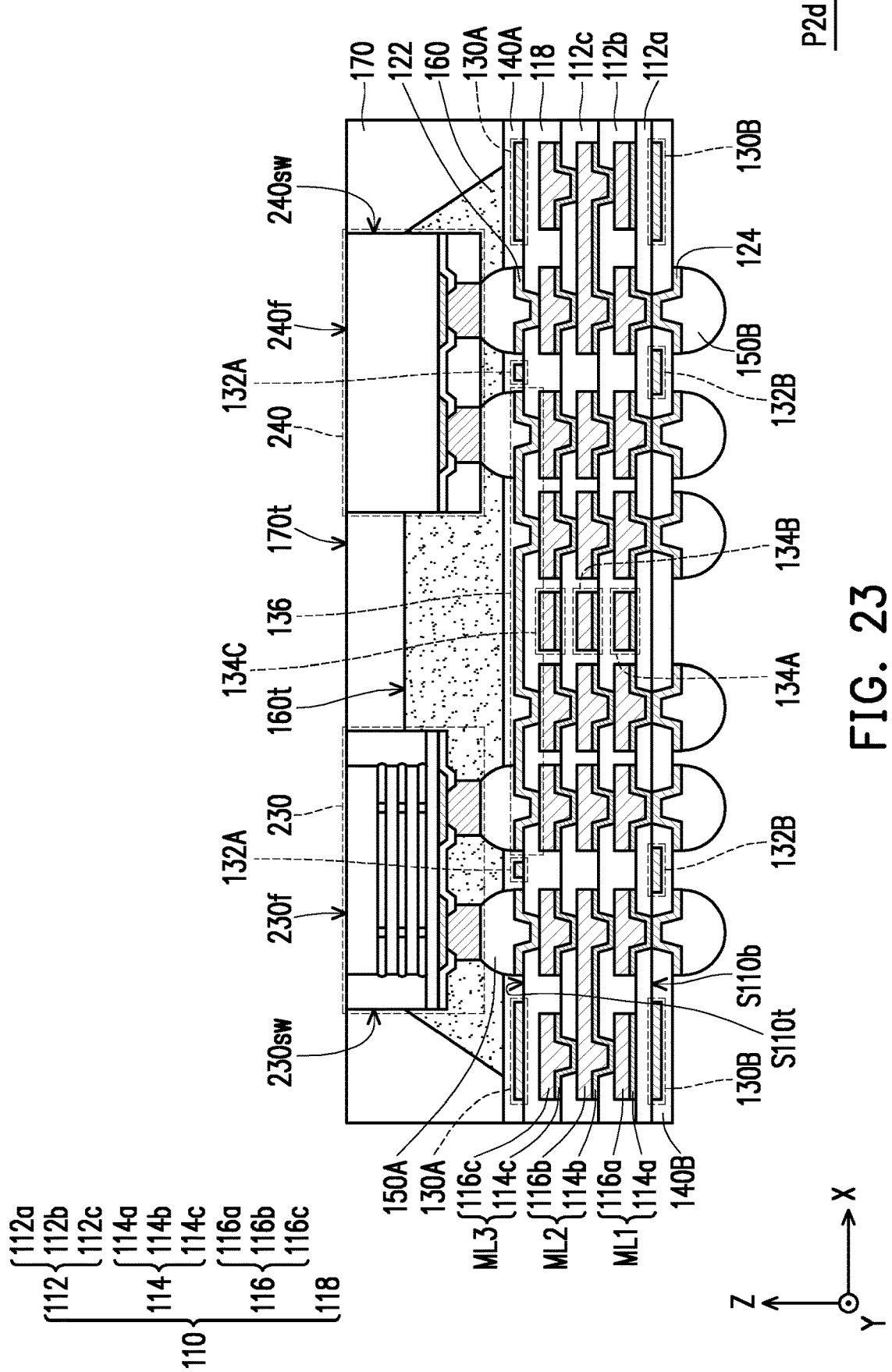
FIG. 23 is a schematic cross-sectional view of a semiconductor package in accordance with some embodiments of the disclosure.

Similarly, the aforementioned supporting structure 136 may also be further included in the semiconductor packages P1b, P1c and P1d to respectively form a semiconductor package P2b depicted in FIG. 21, a semiconductor package P1c depicted in FIG. 22, and a semiconductor package P2b depicted in FIG. 23. In some embodiments, for any one of the semiconductor packages P2a-P2d, in the region R1, a part of the supporting structures 130A are at least substituted by the supporting structure 136. In alternative embodiments, for any one of the semiconductor packages P2a-P2d, in the region R1, the supporting structures 130A are entirely substituted by the supporting structure 136. In yet alternative embodiments, for any one of the semiconductor packages P2a-P2d, in the region R1, the number of the supporting structures 130A are maintained the same, and the supporting structure 136 is considered as an extra element.

In either embodiment above, in the vertical projection on the X-Y plane along the direction Z, the region R1 has a total area with 70% or more thereof being occupied by the supporting structures 130A-130B and/or the supporting structure 136. The extra element, e.g. the supporting structure 136, may be electrically isolated to the rest of the reinforced structures (e.g. the supporting structures 130A-130B, 132A-132B, and 134A-134C), in part or all.

Figure 24:
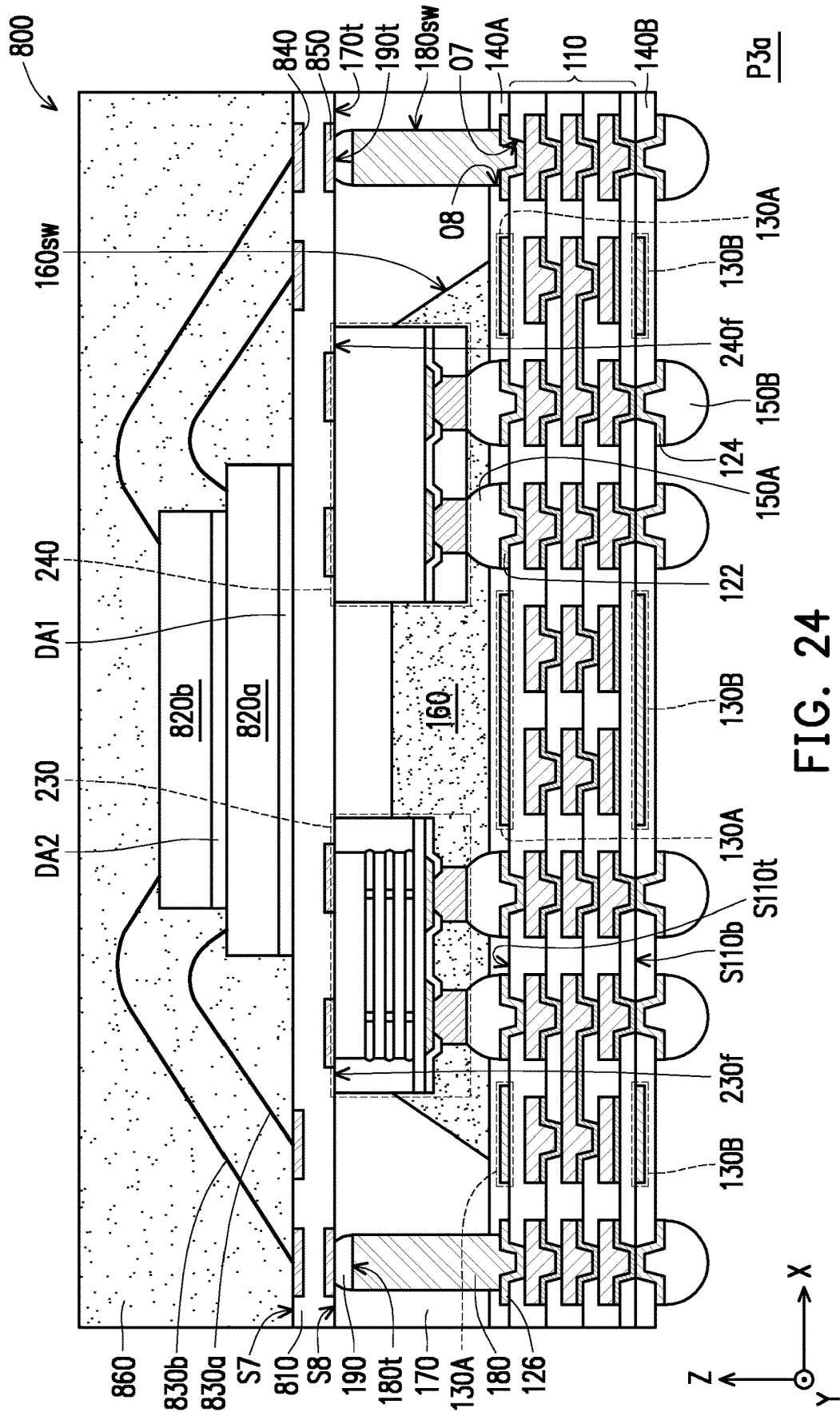
FIG. 24 is a schematic cross-sectional view of a semiconductor package in accordance with some embodiments of the disclosure.
Figure 25:
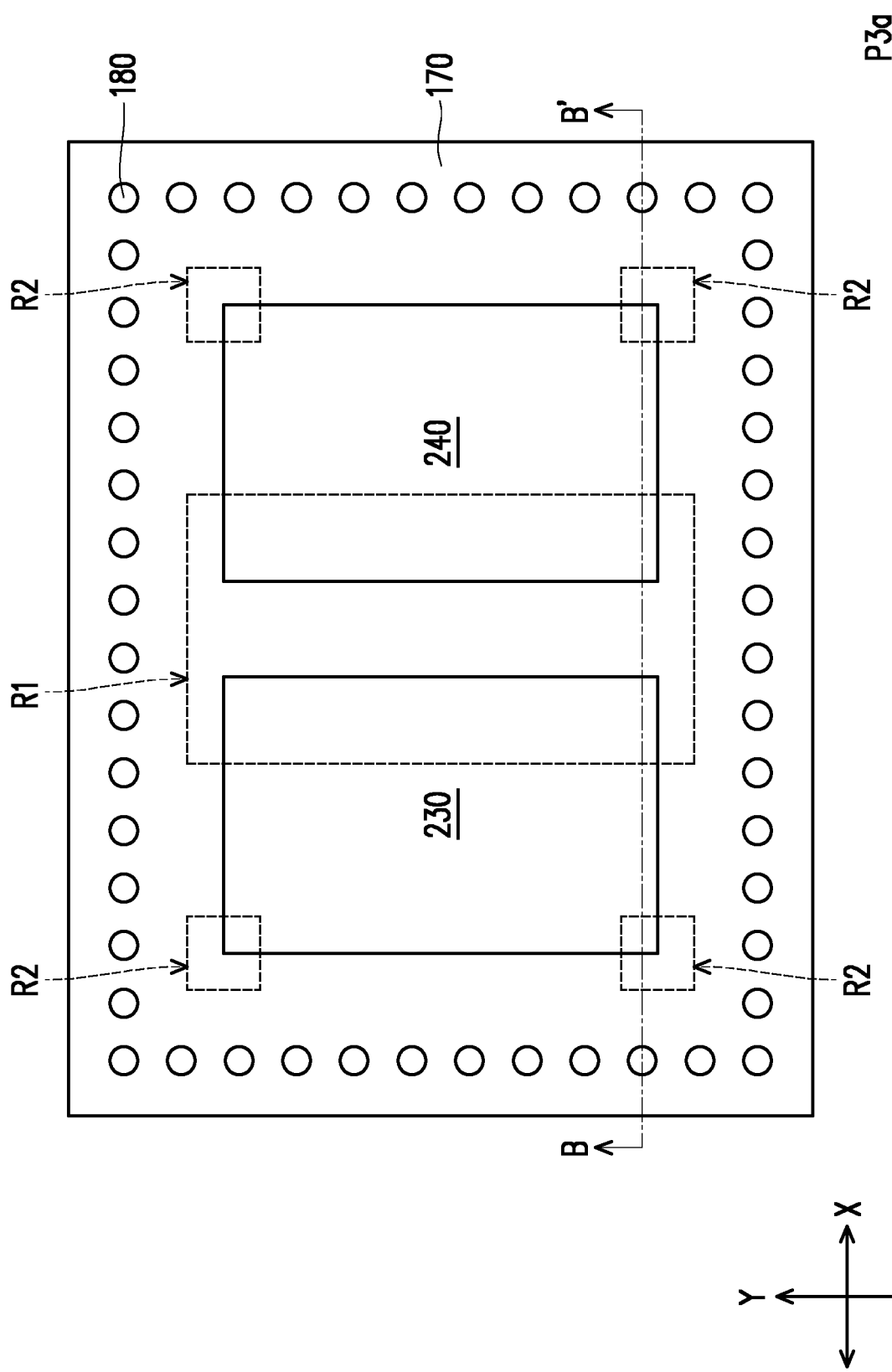
FIG. 25 is a schematic top view illustrating a relative position between semiconductor components of a semiconductor package in accordance with some embodiments of the disclosure.
Figure 26:
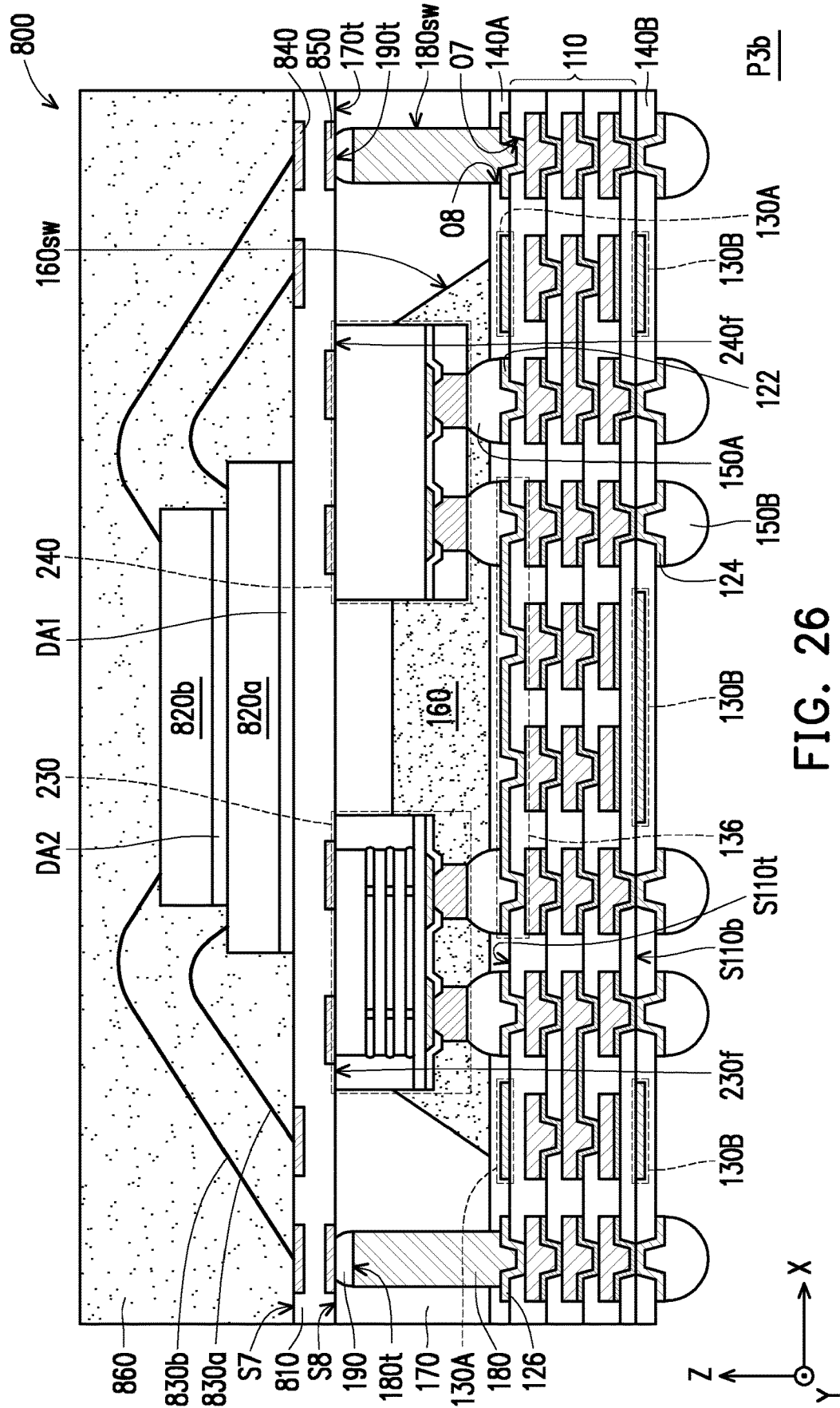
FIG. 26 is a schematic cross-sectional view of a semiconductor package in accordance with some embodiments of the disclosure.

Conductive pillars and conductive terminals may be further included in a semiconductor package having a stacked structure (e.g. PoP). FIG. 24 is a schematic cross-sectional view of a semiconductor package in accordance with some embodiments of the disclosure. FIG. 25 is a schematic top view illustrating a relative position between semiconductor components of a semiconductor package in accordance with some embodiments of the disclosure, where FIG. 24 is the cross-sectional view taken along a line BB' depicted in FIG. 25. FIG. 26 is a schematic cross-sectional view of a semiconductor package in accordance with some embodiments of the disclosure. In some embodiments, a semiconductor package P3a depicted in FIG. 24 and FIG. 25 is similar to the semiconductor package P1a depicted in FIG. 14 and FIG. 15, the difference is that, in the semiconductor package P3a, a plurality of conductive pillars 180 and a plurality of conductive terminals 190 are included and encapsulated in the insulating encapsulation 170 to electrically connect the semiconductor dies 230 and 240 with a package 800. Like elements are designated with the same reference numbers for ease of understanding and the details thereof are not repeated herein.

Referring to FIG. 24, in some embodiments, the conductive pillars 180 are formed on the redistribution circuit structure 110 (e.g. on the side where the outermost surface S110t located at). In some embodiments, the conductive pillars 180 may be through integrated fan-out (InFO) vias. As shown in FIG. 24, the conductive pillars 180 are physically connected to the metallization layer ML3 of the redistribution circuit structure 110 through UBM patterns 126 formed on the dielectric layer 118 and extending into openings O7 formed in the dielectric layer 118, so that the conductive pillars 180 are electrically connected to the redistribution circuit structure 110. In some embodiments, the UBM patterns 126 are exposed by the passivation layer 140A through openings O8 formed therein. The formation and material of the UBM patterns 126 are similar to or the same as the formation and material of the UBM patterns 122 as described in FIG. 3, the formations of the openings O7 and O8 are respectively similar to or the same as the formations of the openings O4 and O5 as described in FIG. 1 through FIG. 4, and thus are not repeated herein. In some embodiments, the conductive pillars 180 are arranged aside of the semiconductor dies 230 and 240 and are located along the periphery of the semiconductor package P3a, as shown in FIG. 24 and FIG. 25. The number of the conductive pillars 180 is not limited to the drawings of FIG. 24 and FIG. 25, and may be adjusted by changing the number of the openings O7 and O8 based on the demand and design requirement.

In some embodiments, the conductive pillars 180 are formed by photolithography, plating, photoresist stripping processes or any other suitable method. For example, the plating process may include an electroplating plating, an electroless plating, or the like. For example, the conductive pillars 180 may be formed by forming a mask pattern (not shown) covering the redistribution circuit structure 110 with openings exposing the UBM patterns 126 exposed by the openings O8 formed in the passivation layer 140A, forming a metallic material filling the openings formed in the mask pattern and the openings O8 to form the conductive pillars 180 by electroplating or deposition, and then removing the mask pattern. In one embodiment, the mask pattern may be removed by acceptable ashing process and/or photoresist stripping process, such as using an oxygen plasma or the like. In some embodiments, the material of the conductive pillars 180 may include a metal material such as copper or copper alloys, or the like.

However, the disclosure is not limited thereto. In alternative embodiments, the conductive pillars 180 may be pre-fabricated conductive pillars which may be disposed on the redistribution circuit structure 110 by picking-and-placing. Alternatively, the UBM patterns 126 may be omitted.

Thereafter, in some embodiments, a plurality of conductive terminals 190 are formed on surfaces 180t of the conductive pillars 180, respectively. For example, the conductive terminals 190 are bonded to the conductive pillars 180 through soldering process. The materials of the conductive terminals 190 may include solder balls or BGA balls. In some embodiments, as shown in FIG. 24, the conductive terminals 190 are electrically connected to the redistribution circuit structure 110 through the conductive pillars 180 and the UBM patterns 126. That is, for example, some of the conductive terminals 190 are electrically connected to the semiconductor die 230 through the redistribution circuit structure 110, the respective conductive pillars 180 and the respective UBM patterns 126, and some of the conductive terminals 190 are electrically connected to the semiconductor die 240 through the redistribution circuit structure 110, the respective conductive pillars 180 and the respective UBM patterns 126.

In some embodiments, the conductive pillars 180 and the conductive terminals 190 are formed on the redistribution circuit structure 110 before disposing the semiconductor dies 230 and 240 over the redistribution circuit structure 110. In alternative embodiments, the conductive pillars 180 and the conductive terminals 190 are formed on the redistribution circuit structure 110 after disposing the semiconductor dies 230 and 240 over the redistribution circuit structure 110. In some embodiments, the insulating encapsulation 170 is formed by compression molding process.

As illustrated in FIG. 24, for example, the conductive pillars 180 and the conductive terminals 190 are embedded inside the insulating encapsulation 170, where surfaces 190t of the conductive terminals 190 are exposed by the insulating encapsulation 170. In some embodiments, the underfill material 160, the conductive pillars 180, the conductive terminals 190 and the semiconductor dies 230, 240 are encapsulated in the insulating encapsulation 170, and the surface160t and sidewalls 160sw of the underfill material 160, the surfaces 180t and sidewalls 180sw of the conductive pillars 180 and sidewalls (e.g. 230sw, 240sw) of the semiconductor dies 230, 240 are inside the insulating encapsulation 170, where the surfaces 190t of the conductive terminals 190, the backside surface 230f of the semiconductor dies 230, the backside surface 240f of the semiconductor dies 240 are substantially leveled with and coplanar to the surface 170t of the insulating encapsulation 170. In other words, the surfaces 190t of the conductive terminals 190, the backside surface 230f of the semiconductor dies 230, the backside surface 240f of the semiconductor dies 240 are accessibly revealed by the insulating encapsulation 170, for example.

In some embodiments, the package 800 is provided and bonded to the conductive pillars 180 through the conductive terminals 190 exposed by the insulating encapsulation 170 for forming the semiconductor package P3a. In some embodiments, the package 800 has a substrate 810, semiconductor dies 820a and 820b, bonding wires 830a and 830b, conductive pads 840, conductive pads 850, an insulating encapsulation 860, and the joining solder balls (not shown). As shown in FIG. 24, for example, the semiconductor die 820a with a connecting film DA1 disposed thereon and the semiconductor die 820b with a connecting film DA2 are provided and are disposed on the substrate 810. In some embodiments, the connecting film DA1 is located between the semiconductor die 820a and the substrate 810, and the connecting film DA2 is located between the semiconductor die 820a and the semiconductor die 820b. In some embodiments, due to the connecting films DA1 and DA2 respectively provided between the semiconductor die 820a and the substrate 810 and between the semiconductor dies 820a and 820b, the semiconductor dies 820a, 820b are stably adhered to the substrate 810. In some embodiments, the connecting films DA1, DA2 may be, for example, a die attach film, a layer made of adhesives or epoxy resin, or the like.

For example, the semiconductor dies 820a and 820b are mounted on a side (e.g. a surface S7) of the substrate 810. In some embodiments, the semiconductor dies 820a and 820b may be logic chips (e.g., central processing units, microcontrollers, etc.), memory chips (e.g., dynamic random access memory (DRAM) chips, static random access memory (SRAM) chips, etc.), power management chips (e.g., power management integrated circuit (PMIC) chips), radio frequency (RF) chips, sensor chips, signal processing chips (e.g., digital signal processing (DSP) chips), front-end chips (e.g., analog front-end (AFE) chips, the like, or a combination thereof). The semiconductor dies 820a and 820b are DRAM chips, as shown in FIG. 24, for example. In one embodiment, the semiconductor dies 820a and 820b may be the same. However, the disclosure is not limited thereto; in an alternative embodiment, the semiconductor dies 820a and 820b may be different from each other. The number of each of the semiconductor dies 820a and 820b may be one or more than one, the disclosure is not specifically limited thereto.

In some embodiments, the bonding wires 830a and 830b are respectively used to provide electrical connections between the semiconductor dies 820a, 820b and some of the conductive pads 840 (such as bonding pads) located on the surface S7 of the substrate 810. Owing to the bonding wires 830a and 830b, the semiconductor dies 820a and 820b are electrically connected to the substrate 810.

In some embodiments, the insulating encapsulation 860 is formed on the surface S7 of the substrate 810 to encapsulate the semiconductor dies 820a, 820b, the bonding wires 830a, 830b, and the conductive pads 840 to protect these components. In some embodiments, the material of the insulating encapsulation 860 is the same as the insulating encapsulation 170m/170 or the encapsulation 235, and thus is not repeated herein. In one embodiment, the material of the insulating encapsulation 860 is different from the insulating encapsulation 170m/170 or the encapsulation 235, the disclosure is not limited thereto.

In some embodiments, interconnects (not shown) or through insulator vias (not shown) embedded in the substrate 810 may be used to provide electrical connection between the conductive pads 840 and the conductive pads 850 (such as bonding pads) that are located on another surface (e.g. a surface S8 opposite to the surface S7 along the direction Z) of the substrate 810. In certain embodiments, some of the conductive pads 850 are electrically connected to the semiconductor dies 820a and 820b through these through insulator vias or interconnects (not shown) in addition to some of the conductive pads 840 and the bonding wires 830a, 830b.

In some embodiments, the conductive pads 850 of the package 800 are electrically connected to the conductive pillars 180 through the conductive terminals 190 that are sandwiched therebetween. In some embodiments, the redistribution circuit structure 110 is electrically connected to the substrate 810 of the package 800 through the conductive pillars 180, the conductive terminals 190, and the conductive pads 850. In some embodiments, some of the conductive terminals 150A are electrically connected to the substrate 810 of the package 800 through the redistribution circuit structure 110, the conductive pillars 180, the conductive terminals 190, and the conductive pads 850. In some embodiments, the semiconductor dies 230, 240 are, independently, electrically connected to the semiconductor dies 820a, 820b of the package 800 through the redistribution circuit structure 110, the conductive pillars 180, the conductive terminals 190, the conductive pads 850, the conductive pads 840, and the bonding wires 830a, 830b. In other words, the semiconductor dies 820a, 820b are electrically communicated to the semiconductor dies 230, 240, for example. In the disclosure, the semiconductor package P3a may be referred to as an InFO package having a PoP structure.

However, the disclosure is not limited thereto; alternatively, the modifications of the supporting structures 130A-130B, 132A-132B, 134A-134C and 136 as described in FIG. 14, FIG. 17-FIG. 19 can be adopted in the semiconductor packages P3a, see a semiconductor package P3b depicted in FIG. 26. For example, as compared with the semiconductor package P3a, a supporting structure 136 is additionally included, see a semiconductor structures P3b depicted in FIG. 26. In some embodiments, the semiconductor package P3b depicted in FIG. 26 is similar to the semiconductor package P3a depicted in FIG. 24, the difference is that, in the semiconductor package P3b, the supporting structure 136 is further included to electrically connected to the semiconductor dies 230, 240 and the redistribution circuit structure 110. The formation, material and configuration of the supporting structure 136 have been described in FIG. 20, and thus are not repeated therein.

Figure 27:
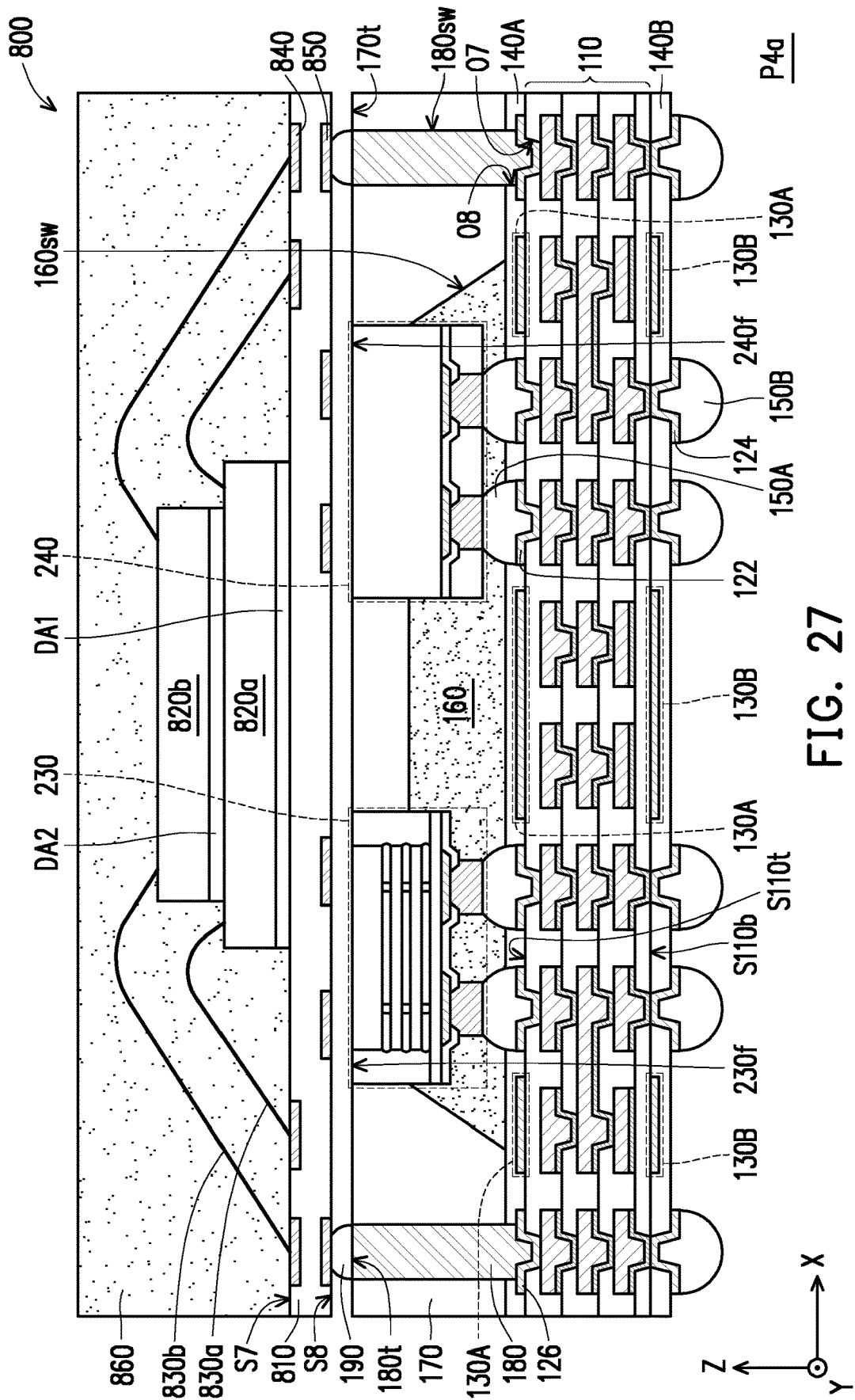
FIG. 27 is a schematic cross-sectional view of a semiconductor package in accordance with some embodiments of the disclosure.
Figure 28:
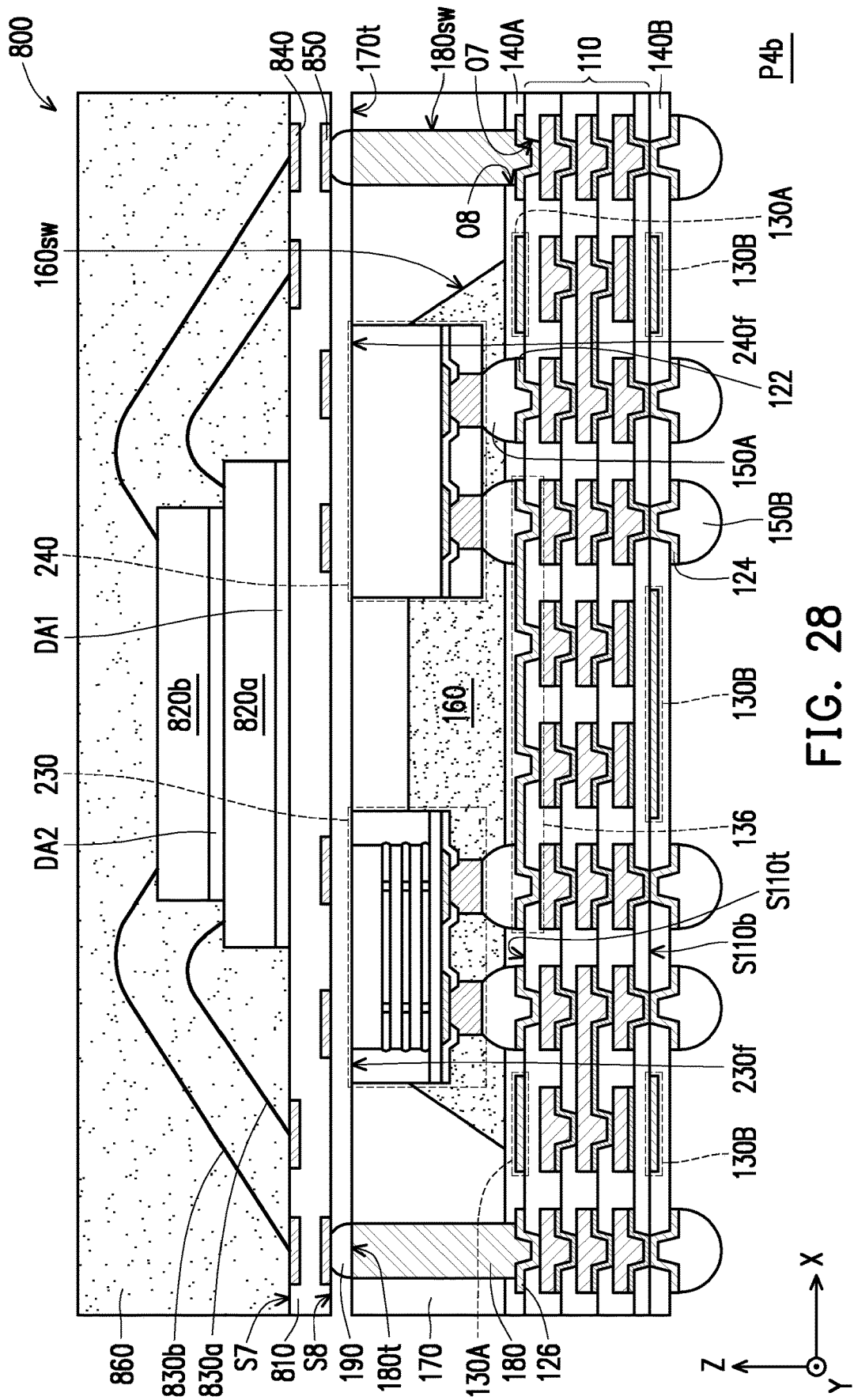
FIG. 28 is a schematic cross-sectional view of a semiconductor package in accordance with some embodiments of the disclosure.

In alternative embodiments, the conductive terminals 190 connected to the package 800 may be free of the insulating encapsulation 170, see a semiconductor package P4a depicted in FIG. 27. FIG. 27 is a schematic cross-sectional view of a semiconductor package in accordance with some embodiments of the disclosure. FIG. 28 is a schematic cross-sectional view of a semiconductor package in accordance with some embodiments of the disclosure. The semiconductor package P4a depicted in FIG. 27 is similar to the semiconductor package P3a depicted in FIG. 24, the difference is that, in the semiconductor package P4a, the conductive terminals 190 electrically connecting the package 800 to the conductive pillars 180 are not covered by the insulating encapsulation 170. That is, for example, a gap GP is presented between the conductive pillars 180 and the insulating encapsulation 170. Owing to such gap GP, a heat dissipation of the semiconductor package P4a is improved. In some embodiments, as shown in the semiconductor package P4a depicted in FIG. 27, the surfaces 180t of the conductive pillars 180, the backside surface 230f of the semiconductor die 230, the backside surface 240f of the semiconductor die 240, and the surface 170t of the insulating encapsulation 170 are substantially leveled with and coplanar to each other. In other words, the surfaces 180t of the conductive pillars 180 and the backside surfaces (230f, 2400 of the semiconductor dies 230, 240 are accessibly revealed by the insulating encapsulation 170. In some embodiments, the insulating encapsulation 170 is formed by transfer molding process.

In addition, as shown in FIG. 27, an underfill material (not shown) may optionally fill the gap GP between the package 800 and the insulating encapsulation 170. In one embodiment, the underfill material may be formed by underfill dispensing or any other suitable method. In some embodiments, a material of the underfill material may be the same or different from a material of the underfill material 160, a material of the insulating encapsulation 170m/170, and/or the material of the encapsulation 235, the disclosure is not limited thereto. Owing to the underfill material filling the gap GP, a bonding strength between the package 800 and the conductive pillars 180 through the conductive terminals 190 in the semiconductor package P4a is enhanced.

However, the disclosure is not limited thereto; alternatively, the modifications of the supporting structures 130A-130B, 132A-132B, 134A-134C and 136 as described in FIG. 14, FIG. 17-FIG. 19 can be adopted in the semiconductor packages P4a, see a semiconductor package P4b depicted in FIG. 28. For example, as compared with the semiconductor package P4a, a supporting structure 136 is additionally included, see a semiconductor structures P4b depicted in FIG. 28. In some embodiments, the semiconductor package P4b depicted in FIG. 28 is similar to the semiconductor package P4a depicted in FIG. 27, the difference is that, in the semiconductor package P4b, the supporting structure 136 is further included to electrically connected to the semiconductor dies 230, 240 and the redistribution circuit structure 110. The formation, material and configuration of the supporting structure 136 have been described in FIG. 20, and thus are not repeated therein.

Figure 29:
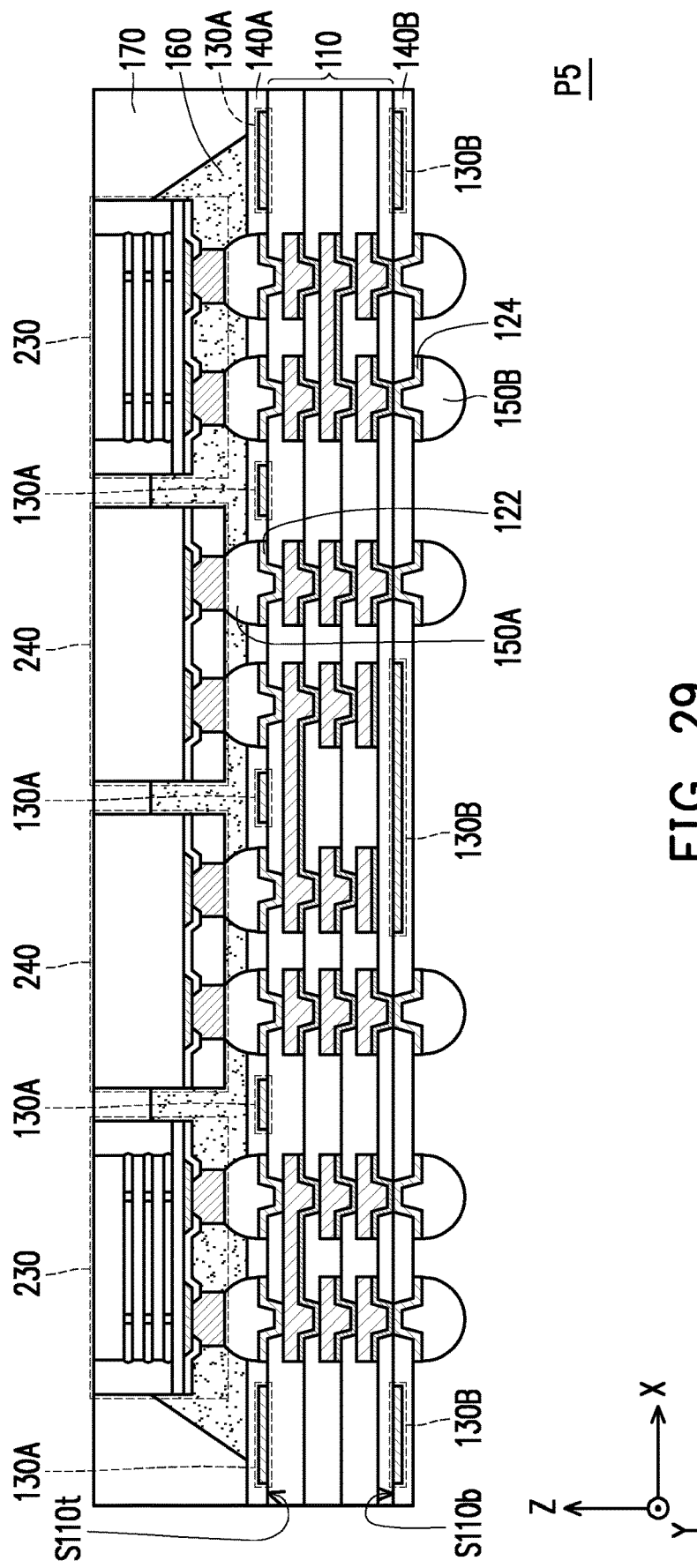
FIG. 29 is a schematic cross-sectional view of a semiconductor package in accordance with some embodiments of the disclosure.
Figure 30:
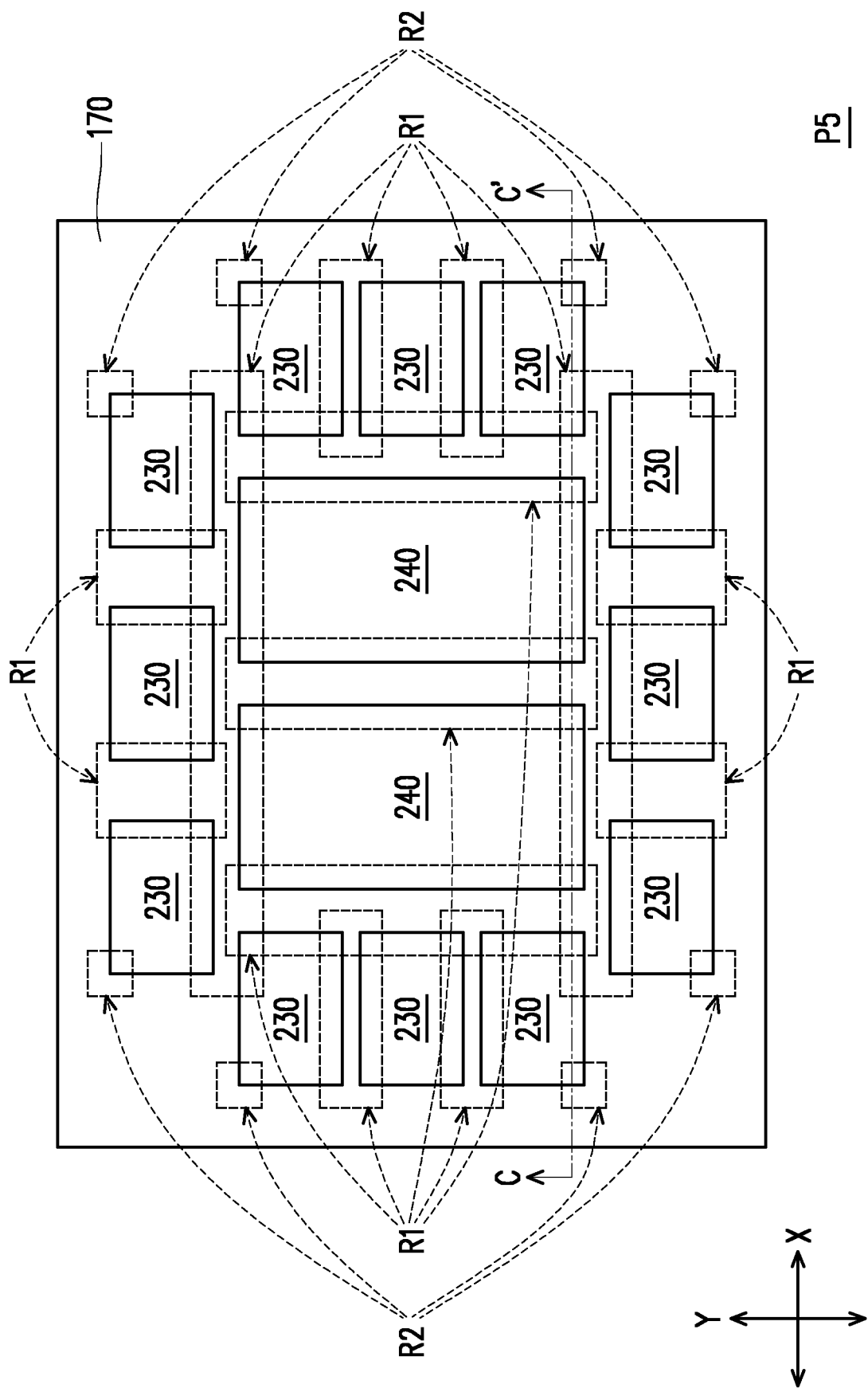
FIG. 30 is a schematic top view illustrating a relative position between semiconductor components of a semiconductor package in accordance with some embodiments of the disclosure.

FIG. 29 is a schematic cross-sectional view of a semiconductor package in accordance with some embodiments of the disclosure. FIG. 30 is a schematic top view illustrating a relative position between semiconductor components of a semiconductor package in accordance with some embodiments of the disclosure, where the FIG. 29 is the cross-sectional view taken along a line CC' depicted in FIG. 30. In some embodiments, a semiconductor package P5 depicted in FIG. 29 and FIG. 30 is similar to the semiconductor package P1a depicted in FIG. 14 and FIG. 15, the difference is that, in the semiconductor package P5, a plurality of semiconductor dies 230 and a plurality of semiconductor dies 240 are included and encapsulated in the insulating encapsulation 170. Like elements are designated with the same reference numbers for ease of understanding and the details thereof are not repeated herein. The semiconductor dies 230 and 240 may be arranged aside to each other along the direction X. The semiconductor dies 230 and 240 may be arranged aside to each other along the direction Y.

In some embodiment, the semiconductor dies 240 are arranged in the form of a matrix, such as the N×N array or N×M arrays (N, M>0, N may or may not be equal to M), while the semiconductor dies 230 are arranged to surround the semiconductor dies 240 (arranged into the array/matrix). The size of the array for the semiconductor dies 240 can be designated and selected based on the demand, and is not limited to the disclosure. For example, as shown in FIG. 29 and FIG. 30, the semiconductor dies 240 are arranged into a row (e.g. a 1×2 array) on the X-Y plane. However, the disclosure is not limited thereto, alternatively, the semiconductor dies 230 and 240 are randomly arranged on the X-Y plane. In further embodiments, the semiconductor dies 230 and 240 are together arranged in the form of a matrix, such as the N'×N' array or N'×M' arrays (N', M'>0, N' may or may not be equal to M'). In a yet further embodiments, the semiconductor dies 230 are arranged in the form of a matrix, such as the N"×N" array or N"×M" arrays (N", M">0, N" may or may not be equal to M"), while the semiconductor dies 240 are arranged to surround the semiconductor dies 230 (arranged into the array/matrix). The size of the array for the semiconductor dies 230 can be designated and selected based on the demand, and is not limited to the disclosure. As shown in FIG. 29, in some embodiments, the semiconductor dies 230 and 240 are electrically connected and electrically communicated to each other through the redistribution circuit structure 110 and the conductive terminals 150A.

In some embodiments, as shown in FIG. 29 and FIG. 30, a plurality of regions R1 and a plurality of regions R2 are included, where the regions R1 are independently presented between adjacent semiconductor dies (e.g., 230 and/or 240), and the regions R2 are independently presented at locations on corners of the semiconductor dies (e.g. 230 or 240) and distant from the regions R1. The configurations of the regions R1 and R2 have described in FIG. 15, and thus are not limited thereto for brevity. As shown in FIG. 30, the regions R1 are overlapped to each other, and the regions R2 are spacing away from each other, for example. In some embodiments, the regions R1 are independently located between two adjacent semiconductor dies 230, between adjacent semiconductor dies 230 and 240, and between two adjacent semiconductor dies 240. In some embodiment, in the vertical projection on the X-Y plane along the direction Z, the regions R1 and the regions R2 each have a total area with 70% or more thereof being occupied by the supporting structures 130A and the supporting structures 130B. With such configuration, the impact of mechanical/thermal stress generated in the semiconductor package P5 can be suppressed by the additional reinforced structures (e.g. the supporting structures 130A and the supporting structures 130B) and protective layers thereof (e.g. the passivation layer 140A and the passivation layer 140B), thereby preventing cracking (e.g. the redistribution circuit structure 110); the reliability in the electrical performance of the semiconductor package P5 is improved. In addition, the modifications of the supporting structures 130A-130B, 132A-132B, 134A-134C and 136 as described in FIG. 14, FIG. 17-FIG. 19 can be adopted in the semiconductor package P5, the disclosure is not limited thereto.

Figure 31:
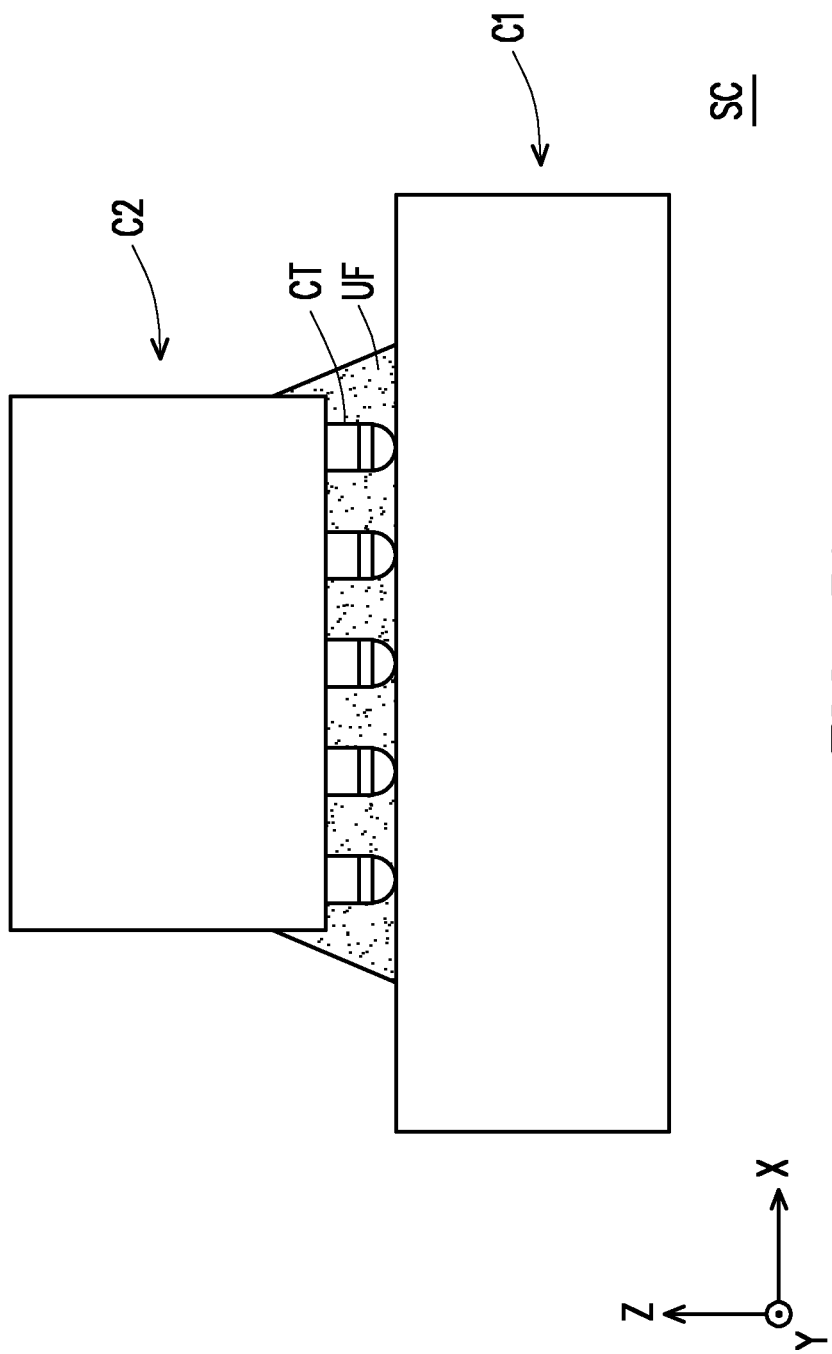
FIG. 31 is a schematic cross-sectional view of a semiconductor package in accordance with some embodiments of the disclosure.

FIG. 31 is a schematic cross-sectional view of a semiconductor package in accordance with some embodiments of the disclosure. Like elements are designated with the same reference numbers for ease of understanding and the details thereof are not repeated herein. Referring to FIG. 31, for example, a component assembly SC including a first component C1 and a second component C2 disposed over the first component C1 is provided. The first component C1 may be or may include an interposer, a package substrate (e.g. a PCB or a printed wiring board), an interposer mounted on a package substrate, and/or other carrier that is capable of carrying the second component C2, where the second component C2 mounted on the first component C1 may be similar to one of the semiconductor packages P1a-P1d, P2a-P2d, P3a-P3b, P4a-P4b, and P5 described above. In some embodiments, the second component C2 is electrically coupled to the first component C1 through a plurality of terminals CT. The terminals CT may be the conductive terminals 150B. One or more than one second component C2 may be electrically coupled to the first component C1 through the terminals CT.

In some embodiments, an underfill material UF is formed between the gap of the first component C1 and the second component C2 to at least laterally cover the terminals CT. Alternatively, the underfill material UF is omitted. In one embodiment, the underfill material UF may be formed by underfill dispensing or any other suitable method. In some embodiments, a material of the underfill material UF may be the same or different from the material of the underfill material 160 and/or the material of the insulating encapsulations 170m, 170 and/or the encapsulation 235, the disclosure is not limited thereto. Owing to the underfill material UF, a bonding strength between the first component C1 and the second component C2 is enhanced.

Other packaging techniques may be used to form the component assembly SC, which are not limited in the disclosure. For example, the component assembly SC is formed using a wafer level packaging (WLP), a chip-on-wafer-on-substrate (CoWoS) process, a chip-on-chip-on-substrate (CoCoS) process, flip-chip process etc. Alternatively, additional terminals (not shown) may be physical and electrical contact with first component C1 opposite to the terminals CT for electrical connection to any other external component(s).

In accordance with some embodiments, a semiconductor package includes a semiconductor die, a redistribution circuit structure, a supporting structure and a protective layer. The redistribution circuit structure is located on and electrically coupled to the semiconductor die. The supporting structure is located on an outer surface of the redistribution circuit structure, wherein the supporting structure is overlapped with at least a part of the semiconductor die or has a sidewall substantially aligned with a sidewall of the semiconductor die in a vertical projection on the redistribution circuit structure along a stacking direction of the redistribution circuit structure and the supporting structure. The protective layer is located on the supporting structure, wherein the supporting structure is sandwiched between the protective layer and the redistribution circuit structure.

In accordance with some embodiments, a semiconductor package includes a redistribution circuit structure, a first semiconductor die, a second semiconductor die, a first supporting structure, a protective layer and an insulating encapsulation. The first semiconductor die and the second semiconductor die are located over and electrically coupled to the redistribution circuit structure. The first supporting structure is located over the redistribution circuit structure, wherein the first supporting structure is located between the first semiconductor die and the second semiconductor die in a vertical projection on the redistribution circuit structure along a stacking direction of the redistribution circuit structure and the first supporting structure. The protective layer is located over the first supporting structure, wherein the first supporting structure is enclosed by the protective layer and the redistribution circuit structure. The insulating encapsulation laterally encapsulates the first semiconductor die and the second semiconductor die.

In accordance with some embodiments, a method of manufacturing a semiconductor package includes the following steps: forming a redistribution circuit structure; providing a semiconductor die over the redistribution circuit structure; bonding the semiconductor die to the redistribution circuit structure, so as to electrically couple the semiconductor die and the redistribution circuit structure; forming a supporting structure over the redistribution circuit structure, the supporting structure being overlapped with at least a part of the semiconductor die or having a sidewall substantially aligned with a sidewall of the semiconductor die in a vertical projection on the redistribution circuit structure along a stacking direction of the redistribution circuit structure and the supporting structure; and depositing a protective layer over the supporting structure, the supporting structure being enclosed by the protective layer and the redistribution circuit structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor package, comprising:
a first semiconductor die and a second semiconductor die;
a redistribution circuit structure, disposed on and electrically coupled to the first semiconductor die and the second semiconductor die;
a supporting structure, standing on an outermost surface of the redistribution circuit structure and electrically coupled to the first semiconductor die and the second semiconductor die, wherein the supporting structure is overlapped with and continuously extended between at least a part of the first semiconductor die and at least a part of the second semiconductor die in a vertical projection on the redistribution circuit structure along a stacking direction of the redistribution circuit structure and the supporting structure;
a first auxiliary supporting structure, embedded in the redistribution circuit structure, wherein the first auxiliary supporting structure is electrically isolated from the redistribution circuit structure, wherein the first auxiliary supporting structure is overlapped with the supporting structure in a cross section of the semiconductor package along the stacking direction;
an additional supporting structure, standing on the outermost surface or an opposite outermost surface of the redistribution circuit structure, wherein the additional supporting structure is electrically isolated from the redistribution circuit structure; and
a protective layer, disposed on the supporting structure and the additional supporting structure, wherein the supporting structure is sandwiched between the protective layer and the redistribution circuit structure, and a sidewall and an outmost surface of the supporting structure are in contact with the protective layer.

2. The semiconductor package of claim 1, wherein the additional supporting structure comprises a plurality of additional supporting structures, wherein the plurality of additional supporting structures and the first semiconductor die are disposed at a same side of the redistribution circuit structure.

3. The semiconductor package of claim 1, wherein the additional supporting structure comprises a plurality of additional supporting structures, the plurality of additional supporting structures are disposed at a first side of the redistribution circuit structure, and the first semiconductor die is disposed at a second side of the redistribution circuit structure,
wherein along the stacking direction, the first side is opposite to the second side.

4. The semiconductor package of claim 1, wherein the protective layer comprises a first protective layer and a second protective layer separated from the first protective layer, and the additional supporting structure comprises:
a first plurality of additional supporting structures, covering by the first protective layer, wherein the first plurality of additional supporting structures and the first semiconductor die are disposed at a first side of the redistribution circuit structure; and
a second plurality of additional supporting structures, covering by the second protective layer, wherein the second plurality of additional supporting structures are disposed at a second side of the redistribution circuit structure,
wherein along the stacking direction, the first side is opposite to the second side, the first plurality of additional supporting structures are disposed between the first protective layer and the redistribution circuit structure, and the second plurality of additional supporting structures are disposed between the second protective layer and the redistribution circuit structure.

5. The semiconductor package of claim 1, wherein the first auxiliary supporting structure is completely overlapped with the supporting structure in the cross section along the stacking direction.

6. The semiconductor package of claim 1, further comprising:
a second auxiliary supporting structure, disposed on and electrically isolated from the redistribution circuit structure and covered by the protective layer, the second auxiliary supporting structure being laterally aside of the supporting structure in the cross section along the stacking direction.

7. The semiconductor package of claim 6,
wherein the second auxiliary supporting structure comprises a first plurality of second auxiliary supporting structures, wherein the first plurality of second auxiliary supporting structures and the first semiconductor die are disposed at a same side of the redistribution circuit structure;
wherein the second auxiliary supporting structure comprises a second plurality of second auxiliary supporting structures, the second plurality of second auxiliary supporting structures are disposed at a first side of the redistribution circuit structure, and the first semiconductor die is disposed at a second side of the redistribution circuit structure, wherein along the stacking direction, the first side is opposite to the second side; or wherein the protective layer comprises a first protective layer and a second protective layer separated from the first protective layer, and the second auxiliary supporting structure comprises:
a third plurality of second auxiliary supporting structures, covering by the first protective layer, wherein the third plurality of second auxiliary supporting structures and the first semiconductor die are disposed at a first side of the redistribution circuit structure; and
a fourth plurality of second auxiliary supporting structures, covering by the second protective layer, wherein the fourth plurality of second auxiliary supporting structures are disposed at a second side of the redistribution circuit structure,
wherein along the stacking direction, the first side is opposite to the second side, the third plurality of second auxiliary supporting structures are disposed between the first protective layer and the redistribution circuit structure, and the fourth plurality of second auxiliary supporting structures are disposed between the second protective layer and the redistribution circuit structure.

8. The semiconductor package of claim 1, wherein the redistribution circuit structure comprises a dielectric layer and a metallization layer disposed thereon, wherein:
a hardness of the supporting structure is greater than or substantially equal to a hardness of the metallization layer; and
a hardness of the protective layer is greater than or substantially equal to a hardness of the dielectric layer.

9. The semiconductor package of claim 6, further comprising:
first conductive terminals, disposed between the redistribution circuit structure and the first semiconductor die and between the redistribution circuit structure and the second semiconductor die, wherein the first semiconductor die and the second semiconductor die are electrically connected to the redistribution circuit structure through the first conductive terminals and the supporting structure; and
second conductive terminals, disposed on and electrically connected to the redistribution circuit structure, wherein the redistribution circuit structure is between the first conductive terminals and the second conductive terminals,
wherein:
a first offset is between the first conductive terminals and the second auxiliary supporting structure arranged aside thereto along a horizontal direction perpendicular to the stacking direction; and
a second offset is between the second conductive terminals and the second auxiliary supporting structure arranged aside thereto along the horizontal direction perpendicular to the stacking direction.

10. A semiconductor package, comprising:
a redistribution circuit structure;
a first semiconductor die and a second semiconductor die, disposed over and electrically coupled to the redistribution circuit structure;
a first supporting structure, standing on a first outermost surface of the redistribution circuit structure, wherein the first supporting structure is disposed between and electrically connected to the first semiconductor die and the second semiconductor die and continuously extended from the first semiconductor die to the second semiconductor die in a vertical projection on the redistribution circuit structure along a stacking direction of the redistribution circuit structure and the first supporting structure;

a second supporting structure, disposed in the redistribution circuit structure, wherein the second supporting structure is electrically isolated from the redistribution circuit structure, wherein the second supporting structure is overlapped with the first supporting structure in a cross section of the semiconductor package along the stacking direction;

a protective layer, disposed over the first supporting structure, wherein the first supporting structure is enclosed by the protective layer and the redistribution circuit structure, and a sidewall and an outermost surface of the first supporting structure are covered and in physical contact with the protective layer; and an insulating encapsulation, laterally encapsulating the first semiconductor die and the second semiconductor die.

11. The semiconductor package of claim 10, wherein the first semiconductor die and the second semiconductor die are electrically communicated to each other through the first supporting structure and the redistribution circuit structure.

12. The semiconductor package of claim 10, further comprising:
at least one third supporting structure, standing on at least one of the first outermost surface and a second outermost surface of the redistribution circuit structure along the stacking direction, wherein the at lease one third supporting structure is electrically isolated to the redistribution circuit structure, and the first outermost surface and the second outermost surface are opposite to each other along the stacking direction.

13. The semiconductor package of claim 12, further comprising:
at least one fourth supporting structure, standing on at least one of the first outermost surface and the second outermost surface of the redistribution circuit structure, wherein the at least one fourth supporting structure is electrically isolated from the redistribution circuit structure.

14. A semiconductor package, comprising:
a redistribution circuit structure, having a first outermost surface and a second outermost surface opposite to the first outermost surface;
a plurality of semiconductor dies, disposed on the first outermost surface of the redistribution circuit structure;
a first supporting structure, disposed on the first outermost surface of the redistribution circuit structure and electrically coupled to two adjacent semiconductor dies of the plurality of semiconductor dies, wherein the first supporting structure is at least partially overlapped with and continuously extended between the two adjacent semiconductor dies of the plurality of semiconductor dies in a vertical projection on the redistribution circuit structure along a stacking direction of the redistribution circuit structure and the first supporting structure;
a second supporting structure, embedded in the redistribution circuit structure, wherein the second supporting structure is electrically isolated from the redistribution circuit structure, wherein the second supporting structure is overlapped with the first supporting structure in a cross section of the semiconductor package along the stacking direction;

a first protective layer, covering on the first supporting structure and the first outermost surface, wherein the first supporting structure is enclosed by and in contact with the first protective layer and the redistribution circuit structure; and a second protective layer, covering on the second outermost surface, wherein the second supporting structure is disposed between the first supporting structure and the second protective layer along the stacking direction.

15. The semiconductor package of claim 14, further comprising:
an insulating encapsulation, disposed over the first outermost surface of the redistribution circuit structure, wherein the insulating encapsulation encapsulates the plurality of semiconductor dies and covers the first protective layer; and
a plurality of conductive terminals, disposed on the second outermost surface of the redistribution circuit structure, wherein the plurality of conductive terminals are connected to the redistribution circuit structure and covers the second protective layer.

16. The semiconductor package of claim 14, further comprising:
a third supporting structure, disposed on the second outermost surface of the redistribution circuit structure and electrically isolated from the redistribution circuit structure, wherein the third supporting structure is at least partially overlapped with the plurality of semiconductor dies or has a sidewall substantially aligned with a sidewall of the plurality of semiconductor dies in the vertical projection on the redistribution circuit structure along the stacking direction,
wherein the second supporting structure is enclosed by and in physical contact with the second protective layer and the second outermost surface of the redistribution circuit structure.

17. The semiconductor package of claim 14, further comprising:
an underfill, disposed between the plurality of semiconductor dies and the redistribution circuit structure.

18. The semiconductor package of claim 14, wherein the first supporting structure is electrically coupled to the redistribution circuit structure.

19. The semiconductor package of claim 10, wherein the second supporting structure is completely overlapped with the first supporting structure in the cross section of the semiconductor package along the stacking direction.

20. The semiconductor package of claim 14, wherein the second supporting structure is completely overlapped with the first supporting structure in the cross section of the semiconductor package along the stacking direction.

* * * * *